(12) United States Patent
Hetherington et al.

(10) Patent No.: US 9,316,709 B2
(45) Date of Patent: Apr. 19, 2016

(54) TRANSCEIVER APPARATUS, SYSTEM AND METHODOLOGY FOR SUPERIOR IN-VIVO IMAGING OF HUMAN ANATOMY

(76) Inventors: Hoby P. Hetherington, Woodbridge, CT (US); Jullie W. Pan, Woodbridge, CT (US); Nikolai I. Avdievich, Bronx, NY (US)

(*) Notice: Subject to any disclaimer, the term of this patent is extended or adjusted under 35 U.S.C. 154(b) by 1149 days.

(21) Appl. No.: 13/199,074

(22) Filed: Aug. 18, 2011

(65) Prior Publication Data

US 2012/0112748 A1    May 10, 2012

Related U.S. Application Data

(63) Continuation of application No. PCT/US2010/000871, filed on Mar. 24, 2010.

(60) Provisional application No. 61/164,096, filed on Mar. 27, 2009, provisional application No. 61/164,054, filed on Mar. 27, 2009.

(51) Int. Cl.

| G01R 33/3415 | (2006.01) |
|---|---|
| G01R 33/34 | (2006.01) |
| G01R 33/36 | (2006.01) |
| G01R 33/341 | (2006.01) |
| G01R 33/345 | (2006.01) |
| G01R 33/565 | (2006.01) |

(52) U.S. Cl.
CPC ...... *G01R 33/3415* (2013.01); *G01R 33/34007* (2013.01); *G01R 33/365* (2013.01); *G01R 33/3635* (2013.01); *G01R 33/341* (2013.01); *G01R 33/3453* (2013.01); *G01R 33/34076* (2013.01); *G01R 33/34084* (2013.01); *G01R 33/3685* (2013.01); *G01R 33/5659* (2013.01)

(58) Field of Classification Search
CPC ............ G01R 33/3415; G01R 33/34007; G01R 33/3635; G01R 33/365
See application file for complete search history.

(56) References Cited

U.S. PATENT DOCUMENTS

| 5,274,332 | A  * | 12/1993 | Jaskolski | G01R 33/34007 |
|---|---|---|---|---|
|  |  |  |  | 324/318 |
| 6,323,648 | B1 * | 11/2001 | Belt | G01R 33/3415 |
|  |  |  |  | 324/318 |
| 6,591,128 | B1 * | 7/2003 | Wu | G01R 33/34084 |
|  |  |  |  | 324/318 |
| 6,677,755 | B2 * | 1/2004 | Belt | G01R 33/3415 |
|  |  |  |  | 324/318 |
| 6,714,012 | B2 * | 3/2004 | Belt | G01R 33/3415 |
|  |  |  |  | 324/318 |
| 6,737,866 | B2 * | 5/2004 | Belt | G01R 33/3415 |
|  |  |  |  | 324/318 |
| 6,747,454 | B2 * | 6/2004 | Belt | G01R 33/3415 |
|  |  |  |  | 324/318 |
| 6,888,351 | B2 * | 5/2005 | Belt | G01R 33/3415 |
|  |  |  |  | 324/318 |
| 6,897,658 | B2 * | 5/2005 | Belt | G01R 33/3415 |
|  |  |  |  | 324/318 |

(Continued)

*Primary Examiner* — Dixomara Vargas
(74) *Attorney, Agent, or Firm* — David Prashker, ESQ.

(57) ABSTRACT

The inventive subject matter as a whole is an improved transceiver apparatus and system for diagnostic evaluations of living subject, human or animal; and is particularly effective as a clinical tool for the spectroscopic scanning or magnetic resonance imaging of humans suspected of being afflicted with a particular disease, disorder, or pathology. The improved transceiver apparatus is used as an essential component in a computer controlled system suitable for magnetic resonance imaging ("MRI"), or nuclear magnetic resonance spectroscopy ("MRS"), and/or nuclear magnetic resonance spectroscopic imaging ("MRSI"); and the present improvement of these electromagnetic signaling systems will provide far more accurate and precise visual images and accumulated data for the clinician or surgeon, as well as serve as a basis upon which to make a diagnosis and decide upon a mode of therapeutic treatment for that individual.

16 Claims, 26 Drawing Sheets

(56) References Cited

U.S. PATENT DOCUMENTS

| | | | |
|---|---|---|---|
| 7,141,980 B2 * | 11/2006 | Belt | G01R 33/3415 324/318 |
| 7,215,120 B2 * | 5/2007 | Vaughan | G01R 33/34046 324/318 |
| 7,345,483 B2 * | 3/2008 | Vaughan | G01R 33/34046 324/318 |
| 7,375,527 B2 * | 5/2008 | Vaughan, Jr. | G01R 33/34046 324/318 |
| 7,659,719 B2 * | 2/2010 | Vaughan | G01R 33/3046 324/318 |
| 7,999,548 B1 * | 8/2011 | Brown | A61B 5/055 324/307 |
| 8,022,705 B2 * | 9/2011 | Bogdanov | G01R 33/34046 324/318 |
| 8,193,809 B2 * | 6/2012 | Akgun | G01R 33/34007 324/318 |
| 8,193,810 B2 * | 6/2012 | Otake | G01R 33/34046 324/307 |
| 2007/0066885 A1 * | 3/2007 | Vaughan | G01R 33/34046 600/411 |
| 2007/0108980 A1 * | 5/2007 | Adriany | G01R 33/34046 324/318 |

* cited by examiner

Fig. 1
Fig 1A
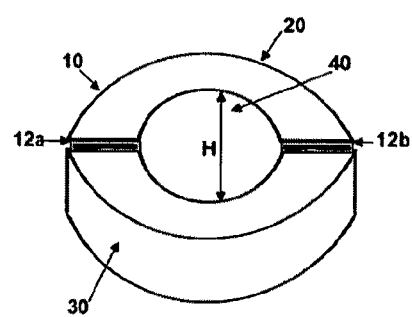
Fig 1B
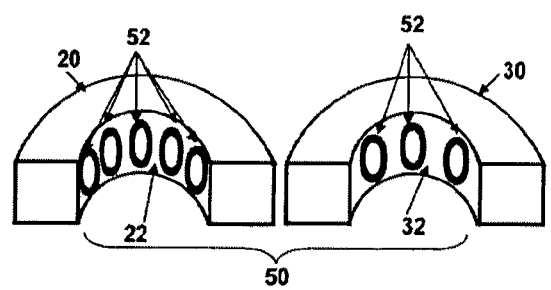
Fig 1C
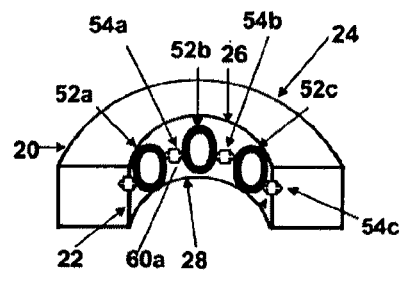
Fig 1D
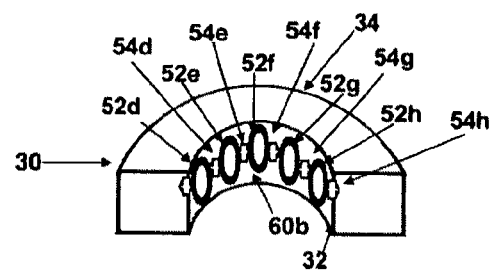

RF coil #1

RF coil #2

RF coil #3

RF coil #4

RF coil #5

RF coil #6

RF coil #7

RF coil #8

Posterior Section    Anterior Section

A: TEM

B: TEM

PCr  ATP    ATP         ATP

A: TX Array

PDE Pi PME

B: Tx Array

US 9,316,709 B2

TRANSCEIVER APPARATUS, SYSTEM AND METHODOLOGY FOR SUPERIOR IN-VIVO IMAGING OF HUMAN ANATOMY

PRIORITY CLAIM

The present invention was first submitted as U.S. Provisional Patent application Ser. No. 61/164,096 filed on Mar. 27, 2009 and as U.S. Provisional Patent Application Ser. No. 61/164,054 filed on Mar. 27, 2009. The legal priority and effect of these first filings are expressly claimed herein. The present filing is also a Continuation of PCT International Patent Application No. PCT/US2010/000871 filed on 24 Mar. 2010. The legal priority and benefit of this filing is also expressly claimed herein.

FIELD OF THE INVENTION

The present invention is concerned with improvements to the equipment and procedures used today for performing nuclear magnetic resonance imaging ("MRI"), nuclear magnetic resonance spectroscopy ("MRS"), and nuclear magnetic resonance spectroscopy imaging ("MRSI"); and is directed to an improved transceiver apparatus which can provide more accurate and precise, high resolution visualizations and images of particular anatomic systems, organs and tissues existing within the body of a living subject.

BACKGROUND OF THE INVENTION

Magnetic Resonance Imaging (MRI)

MRI has proven to be a valuable clinical diagnostic tool for examination of a wide range of organ systems and physiological processes. Anatomic, functional and biochemical information can be obtained from the data collected; and new applications continue to be developed as the technology improves. It is also noteworthy that as technological advances have improved achievable spatial resolution, increasingly finer anatomic and biochemical details have been able to be imaged and evaluated using MRI.

Operationally, a conventional MRI device establishes a substantially homogenous temporally static magnetic field, commonly referred to as $B_0$, typically along an axis of a person's body that is to undergo examination. The $B_0$ field conditions the interior of the person's body for imaging by causing the nuclear spins of certain nuclei (in atoms and molecules forming the body tissue) to align themselves along the axis of the magnetic field. Depending upon the strength of the $B_0$ field and the gyromagnetic ratio ($\gamma$) of the nuclei of interest, the summed net nuclear magnetic moment will vary.

The orientation of the net nuclear moment of these nuclear spins can be substantially altered by application of a time varying magnetic field (commonly referred to as $B_1$) of a specific frequency, which is oriented perpendicular to the axis of the $B_0$ field. The frequency of this $B_1$ field (i.e., the resonant frequency) is given by $\gamma B_0$, which is typically within the radio frequency (RF) range (3 Hz-3 GHz).

The $B_1$ fields are typically applied as brief bursts (microseconds to tens of milliseconds), and are referred to as radiofrequency pulses (RF pulses). RF pulses are typically generated by one or more structures known as RF coils which are placed upon or about the person. Following the application of the RF pulse, the nuclei attempt to regain their previous orientation; and in doing so, emit radiofrequency signals (RF signals), including a time varying magnetic field, that may be detected by the same or different RF coils used to generate the RF pulse.

A large variety of MRI equipment has been developed over time and is conventionally known for imaging purposes. The range and diversity of these developments are merely represented by U.S. Pat. Nos. 7,573,270; 7,501,823; 7,358.923; 7,358,923; 7,345,485; 7,298,145; 7,285,957; 7,173,425; 7,088,104; 7,088,100; 7,012,429; 6,940,466; 6,853,193; 6,771,070; 6,552,544; 6,538,442; 6,107,798; 6,011,395; 5,998,999; 5,791,648; 5,642,048; 5,610,521; 5,565,779; 5,483,163; 5,483,158; 5,473,252; 5,461,314; 5,365,173; 5,243,286; 5,196,797; 5,185,575; 5,172,061; 5,159,929; 5,081,418; 4,926,125; 4,918,388; 4,885,539; 4,879,516; 4,871,969; 4,820,985; 4,788,503; 4,783,641; 4,780,677; 4,752,736; 4,751,464; 4,737,718; 4,731,584; 4,725,780; 4,721,915; 4,129,822; 4,320,342; and 4,638,253 respectively. All of these are also expressly incorporated by reference herein.

Specialized RF coils for application-specific imaging modalities are common in the field of magnetic resonance imaging (MRI). In particular, for the magnetic resonance imaging of the female breast in horizontal and vertical clinical MR instruments, a number of single-loop and multi-loop RF coil concepts for single channel, quadrature, and phased array configurations have been devised. Examples of these RF coil concepts are described by U.S. Pat. Nos. 7,084,631; 6,850, 065; 6,493,572; 6,377,836; 6,163,717; 6,023,166; and 5,699, 802—each of which is expressly incorporated by reference herein.

Transceiver Devices

Transceivers are widely used for performing nuclear magnetic resonance imaging ("MRI"), nuclear magnetic resonance spectroscopy ("MRS"), and nuclear magnetic resonance spectroscopy imaging ("MRSI"). A conventional transceiver device is comprised of one or more RF coils; and is alternately connected to an RF amplifier or similar source for transmission (i.e., generation of the RF pulse) as well as to an RF receiver for reception.

The spatial pattern of the $B_1$ field is determined by geometry of the RF coil(s) and the combination of the amplitudes and phases of the RF pulses. By varying the phase and amplitude of the RF pulse provided to each RF coil from their respective sources or amplifiers, the overall spatial pattern and intensity of the $B_1$ field generated within an object can be varied. By appropriate choice of phase and amplitude of the RF pulses delivered to each RF coil, the transmission field can be made either more homogeneous or contoured so as to effect, excite, or perturb certain spatial locations. The spatial pattern of the reception field can be detected individually by each RF coil and digitized; or is alternately combined to a single output by the use of appropriate combiners and phase shifters and then digitized.

The Nature of the Continuing Problems

Nevertheless, despite the recent developments in transceiver designs, there remains the long recognized difficulties and presently continuing problems concerning: (1) The sensitivity of different RF coil structures to changes in human sizes, shapes, and dielectric properties; (2) the present lack of control regarding transceiver performance characteristics (such as $B_1$ field homogeneity and amount of power deposited into the tissue as reflected by the specific absorption rate or SAR); and (3) the need for repeated adjustments to an RF coil to accommodate different persons in the clinical MRI environment.

As merely one illustrative example, despite the availability of 7 T systems dating from late 1990s, their use in clinical applications of the human brain has been slowed by technical hurdles associated with detector design. This limitation is primarily due to drastically increased $B_1$ inhomogeneity for conventional head-sized volume coils [see Vaughan, J. T., et al., *7 T vs. 4 T: RF power, homogeneity, and signal-to-noise comparison in head images*. Magn Reson Med, 2001. 46(1): p. 24-30]; and a variation of more than 50% of the $B_1$ field has been reported over axial slices located near the center of a human head.

Another critical factor limiting progress at high magnetic field strength is the efficiency of transmission and the limitations that such a field imposes on excitation and refocusing bandwidth, and on power deposition. For example, at 7 T $B_0$ strength, a 90 degree pulse time of 369 to ~516 μs (3 dB higher) is needed for a 1 kW RF pulse depending on the head size and location (center of the brain versus periphery), a factor of ~2-4 higher than the power required for an equivalent strength RF pulse at 4 T for a TEM volume coil [see for example, Vaughan, J. T., et al., *7 T vs. 4T: RF power, homogeneity, and signal-to-noise comparison in head images*. Magn Reson Med, 2001. 46(1): p. 24-30]. Despite these significant limitations, there remains a substantial demand for 7 T $B_0$ field strength systems (projected to be used at over 50 site locations by 2011), with brain imaging studies representing the most likely clinical application.

To overcome the limitations of RF inhomogeneity and relatively poor efficiency for conventional head volume coils (i.e., TEM and birdcage coils), recent research efforts have focused on the development of transceiver devices having multiple RF coils [see for example, Adriany et al., *A geometrically adjustable 16-channel transmit/receive transmission line array for improved RF efficiency and parallel imaging performance at 7 Tesla*. Magn Reson Med, 2008. 59(3): p. 590-7; and Van de Moortele et al., *B(1) destructive interferences and spatial phase patterns at 7 T with a head transceiver array coil*. Magn Reson Med, 2005. 54(6): p. 1503-18]. These systems employ multiple RF coils for both transmission and reception.

However, the differences in head size and position can cause loading conditions for individual RF coils in these transceivers to vary dramatically from subject to subject. This results in variable coupling between the multiple RF coils within the transceiver, and decreased performance with respect to transmission efficiency. In particular, the mutual inductive coupling between the individual RF coils causes distortions in the amplitude and phase of the $B_1$ fields generated, and creates regions where the $B_1$ fields can cancel completely. In addition, the overall size of the multiple RF coils is dictated by fixed geometries which are not optimal; can result in decreased signal to noise ratios; and often cause increases in required power (up to 40%) to achieve a given transmit field strength for imaging the human brain. Moreover, the effects of variable degrees of mutual decoupling can also result in large amounts of reflected power (up to 40%), and thus indicate poor overall coil efficiency.

The range and variety of these long-standing obstacles and continuing problems have attracted both the interest and attention of the scientific community. Merely representing some of their published reports are the following: Vaughan J T, Garwood M, Collins C M, Liu W, DeLaBarre L, Adriany G, Andersen G P, Merkle H, Goebel R, Smith M B, Ugurbil K. 7 T vs. 4 T: RF power, homogeneity, and signal-to-noise comparison in head images. Magn Res Med 2001; 46:24-30; Van de Moortele P-F, Akgun C, Adriany G, Moeller S, Ritter J, Collins C M, Smith M B, Vaughan J T, Uğurbil K, $B_1$ destructive interferences and spatial phase patterns at 7 T with a head transceiver array coil. Magn Reson Med. 2005; 54:1503-1518; Collins C M, Liu W, Schreiber W, Yang Q Y, Smith M B. Central brightening due to constructive interference with, without, and despite dielectric resonance. 3 Magn Reson Imag 2005; 21:192-196; Adriany G, Van de Moortele P-F, Wiesinger F, Moeller S, Strupp J P, Andersen P, Snyder C, Zhang X, Chen W, Pruessmann K P, Boesiger P, Vaughan J T, Uğurbil K. Transmit and receive transmission line arrays for 7 Tesla parallel imaging. Magn Reson Med 2005; 53:434-445; Pinkerton R G, Barberi E A, Menon R S. Transceive surface coil array for magnetic resonance imaging of the human brain at 4 T, Magn Reson Med 2005; 54:499-503; Adriany G, Van de Moortele P F, Ritter J, Moeller S, Auerbach E J, Akgun C, Snyder C J, Vaughan T, Ugurbil K. A geometrically adjustable 16-channel transmit/receive transmission line array for improved RF efficiency and parallel imaging performance at 7 Tesla. Magn Reson Med 2008; 59:590-597; Avdievich N I, Pan J W, Baehring J M, Spencer D D, Hetherington H P. Short Echo Spectroscopic Imaging of the Human Brain at 7 T Using Transceiver Arrays. Magn Reson Med, 2009; 62(1):17-25; Hetherington H P, Avdievich N I, Kuznetsov A M, Pan J W. RF shimming for spectroscopic localization in the human brain at 7 T. Magn Reson Med, 2010; 63(1):9-19; Mao W, Smith M B, Collins C M. Exploring the limits of RF shimming for high-field MRI of the human head. Magn Reson Med 2006; 56(4):918-922; Ibrahim T S, Tang L. Insight into RF power requirements and $B_1$ field homogeneity for human MRI via rigorous FDTD approach. J Magn Reson Imaging 2007; 25(6):1235-1247; Avdievich N I, and Hetherington H P. 4 T Actively-Detuneable Double-Tuned $^1H/^{31}P$ Head Volume Coil and Four-Channel $^{31}P$ Phased Array for Human Brain Spectroscopy. J Magn Reson 2007; 186:341-346; Yang Q X, Wang J, Collins C M, Smith M B, Zhang X, Ugurbil K, Chen W. Phantom design method for high-field MRI human systems, Magn Reson Med 2004; 52:1016-1020; Harpen M D. Radiative losses of a birdcage resonator. Magn Reson Med 1993; 29(5): 713-716; Vaughan J T, Hetherington H P, Otu J O, Pan J W, Pohost G M. High frequency volume coils for clinical NMR imaging and spectroscopy. Magn Reson Med 1994; 32:206-218; Strupp J P, Auerbach E J, Gozubuyuk A, Adriany G, Ugurbil K and Van De Moortele P-F. Efficient tune and match with multiple transmit coils. In: Proceedings of the 16$^{th}$ annual meeting of ISMRM, Toronto, Canada, 2008, p 1135; and Pan J W, Twieg D B, and Hetherington H P. Quantitative spectroscopic imaging of the human brain. Magn Reson Med 1998; 40:363-369.

Overall therefore, despite the advantages of simultaneous independent transmission from transceiver arrays consisting of multiple RF, coils there still are relatively few choices available today for imaging applications using moderate to high field strength systems. Accordingly, an innovation which is able to resolve these substantial difficulties and dominating obstacles would be seen as a major improvement and an unforeseen advance by ordinarily skilled persons working in this technical field.

SUMMARY OF THE INVENTION

The present invention has several different aspects.

A first aspect is an improved transceiver apparatus capable of transmitting radio frequency pulses and receiving radio frequency signals at specified frequencies for superior in-vivo imaging of at least a part of the anatomic systems, organs and tissues then existing within the body of a living subject, said improved transceiver apparatus comprising:

an erectable on-demand containment chamber able to generate and maintain radiofrequency pulses for spectroscopy, spectroscopic imaging, and anatomical and functional magnetic resonance imaging, said containment chamber being comprised of a structured housing formed of at least two pre-shaped housing segments, each of which can be substituted at will to provide alternative dimensions, adjustable exterior and interior surface geometries, and at least one open end, and a shaped cavity space having modifiable dimensions and configuration, and an open end suitable for insertion and containment of at least that part of a living subject's body intended for examination, wherein (i) the containment chamber is erected on-demand by the juncture of at least two pre-shaped housing segments, (ii) the overall configuration and volume of the cavity space within the erected containment chamber can be modified on-demand by a substitution of at least one alternatively shaped housing segment in the erection of the containment chamber, (iii) the juncture of the pre-shaped housing segments conforms the interior surface geometry of the structured housing to a limited gap distance from the surface of the contained part of the subject's body and concomitantly controls the void volume of the cavity space (and that fraction of the interior volume which is not occupied by the object to be imaged) surrounding the surface of the contained part of the subject's body in accordance with the ratio of the unloaded Q divided by the loaded Q (i.e., $Q_U/Q_L$) such that effective transmission of RF pulses and reception of RF signals is substantially maintained at specified frequencies; and at least one identifiable array comprised of not less than six discrete RF coils which are individually aligned in a preselected orientation and collectively positioned in a pre-chosen pattern adjacent the interior surface geometry of at least one pre-shaped housing segment in the erected containment chamber, wherein each RF coil in said array (a) is operative to generate a magnetic field directed towards the surface of that part of the subject's body then lying within the cavity space of the erected containment chamber, (b) can currently transmit RF pulses and receive radiofrequency signals, (c) is individually tuned to transmit RF pulses at least at one preset frequency and to receive RF signals at least at one known frequency, (d) is individually matched such that impedance of the RF coil is adjusted to maximize the efficiency of transmission and reception, and (e) is individually reactively decoupled to control the $B_1$ field interactions between the multiple RF coils of said array.

A second aspect provides an improved system capable of transmitting RF pulses and receiving RF signals at specified frequencies for superior in-vivo imaging of at least a part of the anatomic systems, organs and tissues then existing within the body of a living subject, said system comprising:

an improved transceiver apparatus including an erectable on-demand containment chamber able to generate and maintain RF pulses for spectroscopy, spectroscopic imaging, and resonance imaging, said containment chamber being comprised of a structured housing formed of at least two pre-shaped housing segments, each of which can be substituted at will to provide alternative dimensions, adjustable exterior and interior surface geometries, and at least one open end, and a shaped cavity space having modifiable dimensions and configuration, and an open end suitable for insertion and containment of at least that part of a living subject's body intended for examination, wherein (i) the containment chamber is erected on-demand by the juncture of at least two pre-shaped housing segments, (ii) the overall configuration and volume of the cavity space within the erected containment chamber can be modified on-demand by a substitution of at least one alternatively shaped housing segment in the erection of the containment chamber, (iii) the juncture of the pre-shaped housing segments conforms the interior surface geometry of the structured housing to a limited gap distance from the surface of the contained part of the subject's body and concomitantly controls the void volume of the cavity space surrounding the surface of the contained part of the subject's body in accordance with the ratio $Q_U/Q_L$ such that effective transmission of RF pulses and reception of RF signals is substantially maintained at specified frequencies, and at least one identifiable array comprised of not less than six discrete RF coils which are individually aligned in a preselected orientation and collectively positioned in a pre-chosen pattern adjacent the interior surface geometry of at least one pre-shaped housing segment in the erected containment chamber, wherein each RF coil in said array (a) is operative to generate a magnetic field directed towards the surface of that part of the subject's body then lying within the cavity space of the erected containment chamber, (b) can currently transmit RF pulses and receive RF signals, (c) is individually tuned to transmit RF pulses at least at one preset frequency and to receive RF signals at least at one known frequency, (d) is individually matched such that the impedance of the RF coil is adjusted and maximizes the efficiency of transmission and reception, and (e) is individually reactively decoupled to control the magnetic field interactions between the multiple RF coils of said array;

a spectrometer;

a magnet able to generate a magnetic field strength ≥3 Tesla;

a gradient set with a set of shims;

a plurality of fully independent transmit channels, RF amplifiers, and preamplifiers in communication with each of the discrete RF coils in the identifiable array; and an interface able to provide RF power to each of the discrete RF coils in the identifiable array during transmission and to connect the each of the discrete RF coils to a preamplifier during reception.

BRIEF DESCRIPTION OF THE FIGURES

FIGS. 1A-1D shows alternative views of a typical improved transceiver apparatus;

DETAILED DESCRIPTION OF THE INVENTION

Figure 2A:
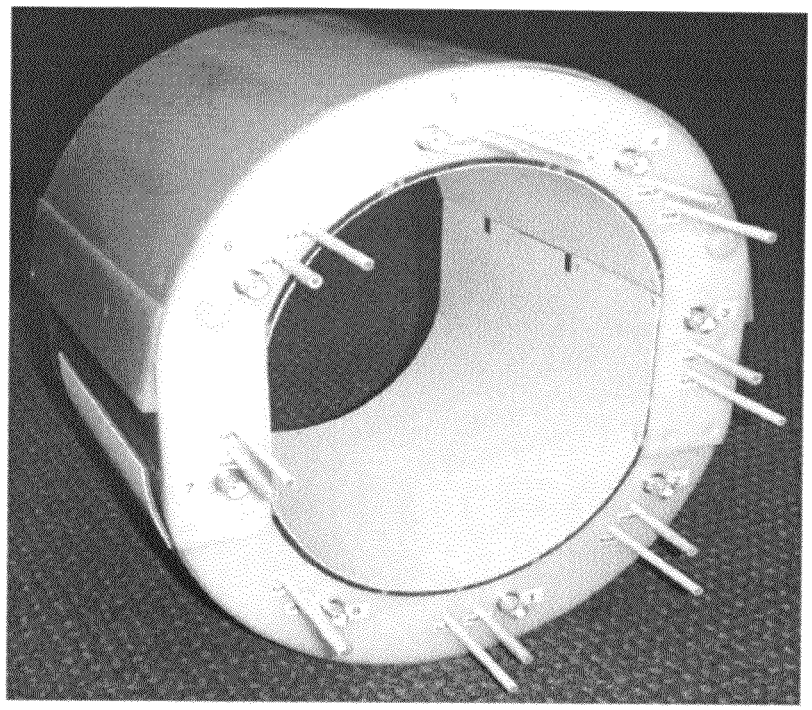
FIGS. 2A and 2B show an embodiment of a minimalist split containment chamber having three different and alternatively dimensioned anterior housing segments suitable for juncture with a single posterior housing segment.

The present invention provides an improved transceiver apparatus capable of transmitting RF pulses and receiving RF signals at specified frequencies; and which functions to provide superior in-vivo spectroscopy or imaging of a particular portion or all of the anatomic systems, organs and tissues then existing within the body of a living subject. The structure and design of the improved transceiver apparatus is a unique achievement and represents an unpredicted advancement in this technical field.

Accordingly, the breadth and scope of the present invention includes a system of enhanced capabilities in which the improved transceiver apparatus is used as an essential component in a computer controlled disposition. Moreover, the methods of the invention are suitable for use in three different clinical procedures: magnetic resonance imaging ("MRI"); nuclear magnetic resonance spectroscopy ("MRS"); and nuclear magnetic resonance spectroscopic imaging ("MRSI"). Each of these three alternative clinical techniques has its own substantial diagnostic benefits and advantages, as well as its own particular limitations

I. OVERVIEW

1. In-Vivo Applicability

The inventive subject matter as a whole is an apparatus, system and methodology useful for diagnostic evaluations of any living subject, human or animal; and is particularly effective when used as a clinical tool for magnetic resonance spectroscopic imaging or magnetic resonance imaging of humans suspected of being afflicted with a particular disease, disorder, or pathology. The improved transceiver apparatus is used as an essential component in a computer controlled system suitable for magnetic resonance imaging ("MRI"), or nuclear magnetic resonance spectroscopy ("MRS"), and/or nuclear magnetic resonance spectroscopic imaging ("MRSI"); and the present improvement of these techniques will provide far more accurate and precise visual images and accumulated data for the clinician or surgeon, as well as serve as an objective basis upon which to make a diagnosis and decide upon a mode of therapeutic treatment for that individual.

For these reasons, it is useful to present here a short summary of the technological fundamentals upon which these systems and techniques are based.

Nuclear Magnetic Resonance and Nuclear Magnetic Resonance Spectroscopy:

Nuclear magnetic resonance ("NMR") is the phenomenon and effect created by the nuclei of certain atoms which have a placed in a strong magnetic field. However, atoms having nuclei with even mass and atomic number (e.g., $^{12}C$ and $^{16}O$) have no magnetic properties and do not exhibit this kind of behavior.

After placed in a strong magnetic field, the nuclear movements of these susceptible atoms can only take up certain discrete orientations, each orientation corresponding to a different energy state. Transition of nuclei between these differing energy levels can be induced by the application of an RF pulse emitted by a RF coil whose axis lies at right angles to the generated magnetic field. The frequency at which energy is absorbed by the nuclei is termed the resonant frequency, and will vary with the type of nucleus, and is proportional to the $B_0$ (the strength of the magnetic field or flux density). The proper resonant frequency therefore depends upon the magnetic field at the nucleus; which in turn, depends upon the particular environment in which the particular nucleus exists. For example, the protons in water experience the resonance effect in a magnetic field of 7 T (Tesla) at a frequency of 298 MHz (MegaHertz).

NMR provides valuable information on the structure of molecules; and has been developed to provide a system for non-invasive clinical imaging of the human body. Today, magnetic resonance imaging ("MRI") is commonly utilized as a powerful diagnostic tool and clinical aid.

In contrast, nuclear magnetic resonance spectroscopy ("MRS") and nuclear magnetic resonance spectroscopic imaging ("MRSI") are based on the fact that the resonant frequencies for identical nuclei in a constant external field vary slightly with the chemical environment of the nucleus (about 1-10 ppm for $^1H$).

By providing a RF pulse, a broad range of frequencies (i.e., nuclei in different chemical environments) can be excited simultaneously. As the nuclei relax, their signal—a free induction decay ("FID")—is generated. This FID is comprised of a summation of sinusoidal signals, where each signal is characterized by an amplitude (measured in volts) and a frequency (measured in Hz). The amplitude is proportional to the concentration of those nuclei in the sample; while the frequency is characteristic of the unique chemical environment of those nuclei.

Fourier transformation of the FID generates a spectrum, with multiple peaks (or resonances) resolving the signals from nuclei with different chemical environments along a frequency axis. This spectrum provides much information about the concentration and structure of the targeted molecules. For this reason, both spectroscopic data and spectroscopic images are commonly utilized as diagnostic aids and modes of clinical evaluation.

2. Some Unique Advantages and Benefits of the Present Invention

Among the major advantages and unexpected benefits provided by the subject matter as a whole comprising the present invention are the following:

(a) The transceiver apparatus offers a simplified design which overcomes the long recognized problem of excessive size.

(b) The transceiver apparatus can be used with systems operating at a moderate magnetic field strength (3-6 Tesla), and with systems generating a high magnetic field strength (7 Tesla and greater).

(c) The transceiver apparatus provides a substantially maximal degree of $B_1$ homogeneity when used in high magnetic field strength ($\geq 7$ T) systems, as well as when used with low moderate magnetic field strength (3-6 T) systems.

(d) The transceiver apparatus provides a split containment chamber which is erectable on-demand by the juncture of at least two pre-shaped housing segments;

(e) The transceiver apparatus can be dimensioned in the alternative to accommodate either the entire human body or any particular anatomic part of the human body for clinical evaluation.

(f) The transceiver apparatus provides a containment chamber able to provide a range of different cavity space void volumes, each alternative spatial volume being suitable for insertion and containment of at least a part of the human anatomy; and where the interior surface geometry of the containment chamber delineates a perimeter edge which exists at a limited gap distance from the surface of the contained part of the human body.

(g) The transceiver apparatus presents and utilizes at least one identifiable array comprised of not less than six discrete RF coils which are each reactively decoupled, are individually aligned in a preselected orientation, and are collectively positioned in a pre-chosen pattern adjacent to the perimeter edge of the internal cavity space.

(h) The transceiver apparatus provides substantial improvements in transmission efficiency providing equivalent strength $B_1$ fields at 75% or less of the required power of conventionally known transceiver devices.

(i) The transceiver apparatus allows for shaping of the RF field spatially to provide excitation or suppression of signals from specific regions within the cavity.

(j) The transceiver apparatus enables increased sensitivity by combining the signals from individual channels and by optimally weighting the acquired signals.

II. THE PERFORMANCE BASIS OF THE PRESENT INVENTION

Due to the strong interactions between living tissue and the individual RF coils in the array of the transceiver when used at moderate and high field strengths ($\geq 3$ T), the performance of individual RF coils and the interactions between the individual RF coils (mutual inductive coupling) within the array can vary widely—depending upon the composition of the object being studied and its overall size and relative position (i.e., the load). For these reasons, when only a single fixed geometry and size of the RF coils constituting an array is available, this results in decreased efficiency, increased power deposition, distortions of the spatial distributions of the generated $B_1$ fields and increased reflected power as the load varies.

Accordingly, to minimize the variation from subject to subject or load to load, the present invention uses an on-demand changeable construction for the containment chamber so that optimal multiple RF coil configurations can be erected for each situation. By limiting the range of variability in the size of the objects to be imaged in each unique chamber configuration, the performance of the individual RF coils can be optimized over a relatively narrow range of load conditions.

However, to enable erection of an on-demand structure on a practical basis, each of the RF coils should be self-contained and physical electrical connections between individual RF coils should be avoided. Furthermore, for practical application in a busy environment, the need for time consuming adjustments of the decoupling networks between individual RF coils should also be avoided. Thus the decoupling of the individual RF coils (the means by which mutual inductive coupling is effectively minimized) should be provided without physical electrical connections across each unit and be fixed for each unit.

These conditions are accomplished here by using inductive decoupling between each of the individual RF coils. Although the degree of decoupling provided is dependent upon the loading conditions, optimal decoupling is maintained by limiting the range of conditions (loads) for which each RF coil is utilized. This also eliminates the need for additional adjustments to the decoupling network as the configuration is modified by the use of alternate housing segments to form the erected containment chamber. Thus an on-demand erectable transceiver apparatus and the use of RF coil decoupling is essential for providing improved performance across a broad range of subjects and/or loading conditions.

III. DEFINITIONS

In order to avoid inconsistencies in terminology, eliminate ambiguities in denotative and connotative meanings, and to increase the clarity and completeness of comprehension and understanding, a set of carefully recited definitions are presented below. The nomenclature and terminology, as well as particular names, terms and jargon, will be employed consistently and repeatedly herein to describe and claim the present invention in a manner that not only sets forth what the present invention is and how it is to be made and used, but also separates and distinguishes the inventive subject matter from what it is not.

Radiofrequency (RF) coil: The structural article as a whole which is used to generate RF pulses and/or detect RF signals in magnetic resonance studies. Typically, a RF coil has a resonance frequency in the range of 1 MHz-1 GHz, which is formally within in the radiofrequency range of 3 Hz-3 GHz.

Array: An organized set or displayed grouping of six or more individual and separate radiofrequency (RF) coils which are employed in combination as a unified assembly and are collectively positioned as an aggregate in a determinable arrangement. Denotatively and connotatively, this collective term is restricted in its meaning and limited in its usage herein. It always identifies and invariably specifies only the unified assembly and aggregate format of multiple discrete RF coil structures; and never indicates nor refers to any of the component parts or constituent elements which are then present within any single RF coil structure.

Surface versus volume RF coils: Surface RF coils are characterized as individual inductive loops which typically circumscribe only a portion of the object which they are being used to image. Volume coils may be comprised of multiple surface coils or other inductive structures and circumscribe or enclose the object they are imaging.

Radiofrequency pulses (RF pulses): Temporally brief bursts of time varying magnetic fields. In magnetic resonance studies, they are typically applied at the resonance frequency of the nucleus of interest (usually 1 MHz-1 GHz, depending upon nucleus and static magnetic field strength).

Amplitude of radiofrequency pulses: Radiofrequency pulses are characterized by a sinusoidal temporal dependence of their electric and magnetic fields. For purposes of magnetic resonance, the magnetic field component is used to excite the nuclei of interest. The time dependence of the magnetic field component is given by $B_1 \sin(\omega t + \phi)$. The amplitude of the pulse is given by $B_1$—i.e., its maximum intensity in units of gauss or tesla or other equivalent.

Phase of radiofrequency pulses: The time dependence of the magnetic field component is given by $B_1 \sin(\omega t + \phi)$. The phase of the pulse is given by $\phi$ i.e. a temporally independent offset in units of radians or degrees.

Reactive decoupling: For purposes of characterizing magnetic resonance RF coils, reactive decoupling is a class of techniques used to minimize the effects of mutual inductance between two or more inductive elements used in an RF coil or array.

Capacitive decoupling: A subset of reactive decoupling techniques in which a capacitor is used between two or more inductive elements or coils so as to minimize the effects of mutual inductive coupling between those coils or elements.

Inductive decoupling: A subset of reactive decoupling techniques in which a set of secondary inductors (e.g. loops) in series or between two or more primary inductive elements or coils are placed so as to cancel the mutual inductance between the primary elements or coils.

$B_0$ Field: The static magnetic field used in NMR studies.

$B_1$ Field: The time varying magnetic field applied perpendicular to the $B_0$ field which is used to alter the orientation of the nuclear spins.

RF shimming: The process by which the relative phases and amplitudes of the RF pulses applied to different RF coils within and array are selected so as to achieve a specific spatial distribution of the resultant $B_1$ field.

Performance ($B_1$/Watts): The intensity of the $B_1$ field generated by an RF coil(s) in a unit of intensity (uT, gauss or Hz equivalent), as a function of the power applied to the RF coil(s) to achieve that intensity.

$B_1$ Homogeneity/Inhomogeneity: The homogeneity or inhomogeneity of a $B_1$ field can be quantified by the standard deviation of the amplitude of the $B_1$ field over a given region.

Radiofrequency signals (RF signals): The radiofrequency signals emitted by nuclear spins following an RF pulse which characterize the nuclear spins. The signals manifest themselves as a time varying magnetic field.

High magnetic field strength: Magnetic field strengths of 7 T and above

Low and modest magnetic field strengths: A low magnetic field strength is below 3 T, while a moderate field strength is 3-6 T.

Power and power deposition: The rate of energy generation or usage in watts or equivalent. For the purposes of magnetic resonance imaging, power deposition refers to the amount of power or rate of energy transferred to the object being measured.

IV. THE IMPROVED TRANSCEIVER APPARATUS AS A WHOLE

Essential Parts of the Transceiver Apparatus

The improved transceiver apparatus is an erectable on-demand containment chamber able to transmit RF pulses and receive RF signals for spectroscopy, spectroscopic imaging, and resonance imaging. Each embodiment of the transceiver apparatus will therefore present and include two essential parts:

An erectable on-demand containment chamber comprising a structured housing formed of at least two pre-shaped housing segments, and a shaped cavity space within the structured housing suitable for the insertion and containment of at least that part of a living subject's body intended for examination; and At least one identifiable array of not less than six discrete RF coils disposed within the erected containment chamber.

Specific features and attributes of each requisite component part, as well as details of their capabilities and functions, are described below.

Intended Formats of the Transceiver Apparatus

It is expected and intended that the transceiver apparatus as a whole will be constructed in various overall sizes and differently shaped formats, all of which are suitable for containing one or more specific parts of the human body or for encompassing the entirety of the human body. This range and variety of embodiments anatomically allows the clinician:

(i) To choose exactly what part(s) of the body are to be examined by scanning—i.e., the fingers or toes, the upper or lower limbs, the abdomen, the thoracic cavity, and the head; or alternatively (ii) To focus upon particular targets such as whole dynamic systems (e.g., vascular, skeletal, nervous, lymphatic, endocrine, gastro-intestinal, and the like), or upon particular organs (e.g., brain, heart, stomach, intestine, pancreas, gallbladder, etc.), or upon specific tissues (muscular, adrenal, bone and cartilage, skin, etc.).

Consequently, many desirable embodiments of the transceiver apparatus typically will be markedly different in overall bulk and general appearance, as well as vary in external and internal dimensions and surface geometries; and each embodiment will be formed to accommodate the necessary anatomical parts or the entirety of the patient's body in order to evaluate his particular medical problem or condition.

Suitability with Systems of Differing Magnetic Field Strength

The present transceiver apparatus can be used with all $1_{systems}$ capable of generating a low magnetic field strength (typically less than 3 T), or a moderate magnetic field strength (typically 3-6 Tesla), or a high magnetic field strength (typically 7 Tesla or greater). In addition, the present transceiver apparatus provides a substantially maximal degree of $B_1$ homogeneity when used in high magnetic field strength ($\geq 7$ T) systems, as well as when used with moderate (3-6 T) magnetic field strength systems. Such a capability is unknown and non-existent within the technical field.

In addition, it will be appreciated that despite the availability of high magnetic field strength ($\geq 7$ T) systems since the late 1990s, their use in clinical applications has been seriously hindered by multiple technical obstacles associated with signal detector design. This technical failure is due in major part to two factors: an increased $B_1$ inhomogeneity for conventional head-sized volume coils; and the need for increased power requirements to achieve $B_1$ homogeneity in 7 T systems which are at least similar to those achievable in low to moderate (1-6 T) systems.

For example, in conventionally known 7 T systems, more than 50% variation of the $B_1$ field typically occurs for axial slices located near the center of a human head. Moreover, in addition to the recognized increases in $B_1$ inhomogeneity, the power required to achieve an equivalent $B_1$ is ~4 fold higher for TEM designs at 7 T in comparison to 4 T systems.

All of these technical obstacles and difficulties are overcome and eliminated by the transceiver apparatus of the present invention.

Noteworthy Characteristics and Features of the Present Invention

A. Initially, it is important to recognize and appreciate how the improved transceiver apparatus addresses the substantial problems created by the differing shapes and sizes of the human body. Basically, there are two major sources of anatomic variability: (1) Site variability within a given living subject [i.e., different anatomic sites for examination in one person); and (2) variability across different subjects needing examination at the same anatomical site or region [e.g., the brain in different persons].

Nevertheless, based upon empirical data from 89 living human subjects characterizing the performance of the improved transceiver apparatus [RF homogeneity and efficiency ($\mu T@1$ kW)] which used three differently sized top housing segments to construct the containment chamber [see the exemplary systems described subsequently herein], the following results were obtained: (i) For any given anatomical location and without regard to the number of persons being examined, the standard deviation in efficiency was ~10%; and (ii) For any given individual person, the RF homogeneity was independent of which sized top segment was used in the transceiver.

This consistency in transceiver performance is due to two specific features: (a) the use of differently-sized top housing segments in the erection of the containment chamber of the transceiver apparatus [each top housing segment differing by 2 cm in the anterior-posterior or "AP" direction]; and (b) the effect of inductive decoupling between adjacent RF coils in the deployed array.

The use of differently sized top housing segments allows the inductive decoupling of each top segment in the erected construction to be optimized over a meaningful range of different human head sizes [±1 cm], thus insuring good decoupling [>18 dB] between individual RF coils across all the subjects. The high degree of RF coil decoupling also reduces the variability of phase and amplitude and maintains decoupling of the coils for SNR purposes.

B. The enhanced performance of the improved transceiver array is owed in major part to the functional capabilities of the array's RF coil configuration as deployed within each of the alternative top housing segments in the containment chamber. The empirical data obtained using the exemplary systems described subsequently herein in comparison to the conventional RAPID transceiver device (courtesy of the University of Pittsburgh) revealed that the array of eight RF coils deployed within the improved transceiver apparatus achieved a factor of 1.99 improvement in transmit efficiency ($\mu T$ per volt of input) and 1.87 in signal-to-noise ratio (or "SNR"). Thus, although the array of RF coils' efficiency and sensitivity at 7 T is markedly enhanced by using different alternative RF coils size, the resultant overall RF homogeneity for the array of RF coils is also substantially improved via the use of RF shimming.

C. As is conventionally known in this field, as the number of RF coils in a transceiver device is increased, the complexity of setting up a transceiver for each human subject also substantially increases. The increased complexity typically manifests itself as: (1) greater intricacy and complications for tuning and matching; and (2) the process of effecting RF shimming.

Strongly coupled coils (e.g., the conventional RAPID transceiver's eight RF coils' ~7 dB isolation) require complex tuning and matching algorithms to insure correct tuning and matching during simultaneous transmission. Otherwise, up to 40% of the power emanating from the conventional RAPID transceiver can be reflected.

The present invention, however, markedly reduces operational complexity in comparison to conventionally known transceiver devices. The improved transceiver apparatus preserves RF coil decoupling despite its use with a wide range of different human subjects. Also, each of the discrete RF coils present within the deployed array(s) is separately tuned, matched, and inductively decoupled independently of all the other RF coils in the arrangement.

This practice and procedure dramatically simplifies the set-up procedure for the transceiver apparatus (~1-1.5 min total, <10 sec per coil). Using this set-up procedure also markedly affected and reduced the reflected power levels during concurrent RF coil transmissions—in that the individual RF coil transmissions vary by less than 1 dB on average. Consequently, these capabilities effectively eliminate any need for continuous adjustment of the RF coils, and also remove the conventional requirement that RF coil decoupling be continuously adjustable. Finally, the availability of a robust and easily implemented non-iterative automated method for RF shimming further simplifies the set-up procedure for the transceiver apparatus—such that it can be used for evaluation of many different human subjects without increased complexity.

V. THE ERECTABLE ON-DEMAND CONTAINMENT CHAMBER

1. The Structured Housing

The structured housing is formed of at least two pre-shaped housing segments, each of which can be substituted at will to provide alternative dimensions and configurations, adjustable exterior and interior surface geometries, and at least one open end.

The use of two pre-shaped housing segments to form the erected containment chamber is the minimal requirement; and the two section constructs are deemed to be highly effective as well as commercially desirable embodiments. It is expected and intended, however, that three and four pre-shaped housing segments frequently will also be used to erect the containment chamber; and in medical specialty situations, as many as six to ten separate pre-shaped housing segments will be joined together in the fully erected containment chamber.

Nevertheless, for simplicity and descriptive clarity, the description is limited herein to the minimal requirements as illustrated by FIGS. 1A-1D respectively.

The Minimalist Mode of Split Construction

FIG. 1A shows a side view of a minimalist, fully erected containment chamber 10 which has been constructed by the juncture of an anterior (or top) pre-shaped housing segment 20 and a posterior (or bottom) pre-shaped housing segment 30; and includes an elliptically-shaped open cavity space (or bore) 40 having a preset height dimension H.

FIG. 1B shows some structural details for each of the two pre-shaped housing segments 20, 30 as separate constructs prior to their being joined together to form erected containment chamber 10. Each of the two pre-shaped housing segments 20, has predetermined length, width and depth dimensions, a substantially semi-elliptical overall appearance, fixed exterior and interior surface geometries, and two substantially U-shaped open ends. FIG. 1B also shows the general location and positioning of an identifiable array 50 comprised of eight discrete RF coils 52 which is deployed in part within the interior surface geometry 22 of the anterior housing segment 20 and deployed in part within the interior surface geometry 32 of the posterior housing segment 30.

FIG. 1C illustrates the structural details and features of the anterior housing segment 20. The substantially semi-elliptical overall appearance of the anterior segment 20 presents an interior surface geometry 22 which delineates an internal perimeter edge, and presents an exterior surface geometry 24 which determines the external configuration; a generally U-shaped internal void volume having a height dimension H1 (where H1+H2=H); and two substantially U-shaped open ends 26, 28. Disposed over the interior surface geometry 22 of the anterior housing segment 20 is a protective shield 60a, a durable sheet of resilient material, which secures and protects a portion of the deployed array 50 and three discrete RF coils 52a-52c with corresponding inductive decoupling loops 54a-54c which are positioned internally within the anterior segment 20 and lie adjacent to the interior surface geometry 22.

FIG. 1D shows the structural details and features of the posterior housing segment 30. The substantially semi-elliptical overall appearance of the posterior segment 30 exhibits an interior surface geometry 32 which defines an internal perimeter edge, and exhibits an exterior surface geometry 34 which delineates the external configuration; a generally U-shaped internal void volume having a height dimension H2 (where H1+H2=H); and two U-shaped open ends 36, 38. In addition, over the interior surface geometry 32 of the posterior housing segment 30 is a protective shield 60b which serves to secure and protect another portion of the deployed array 50; and has five discrete RF coils 52d-52h with corresponding inductive decoupling loops 54d-54h, each of which is individually positioned internally within the posterior segment 30 and rests adjacent to the interior surface geometry 32.

The Availability and Use of Alternatively Sized Anterior Housing Segments

It is intended and expected that the anterior housing segment will be routinely manufactured as a series of 2-4 interchangeable multiples—each of which is dimensioned differently, and each of which can be substituted at will for another similarly constructed but alternatively dimensioned anterior housing segment. In this manner, and by the exchange of one alternatively dimensioned anterior housing segment for another in combination and juncture with a single posterior housing segment, the overall configuration and volume of the cavity space within the erected containment chamber could be easily modified at will, without need for any meaningful adjustment of individual RF coils.

Thus, merely by substituting one alternatively dimensioned anterior housing segment for another in the erected containment chamber, the juncture of each substituted and alternatively dimensioned housing segment will alter and adjust the height dimension H of the cavity space; and will conform the interior surface geometry (and internal perimeter edge) of the anterior segment to lie at a different gap distance from the surface of the contained part of the subject's body. In this manner, the contours and dimensions of the cavity space and the internal volume of air actually surrounding the contained part of the human body within the bore of the containment chamber can be markedly changed in a controlled and predetermined manner—but without substantially affecting any other parameters or factors in the system.

Figure 2B:
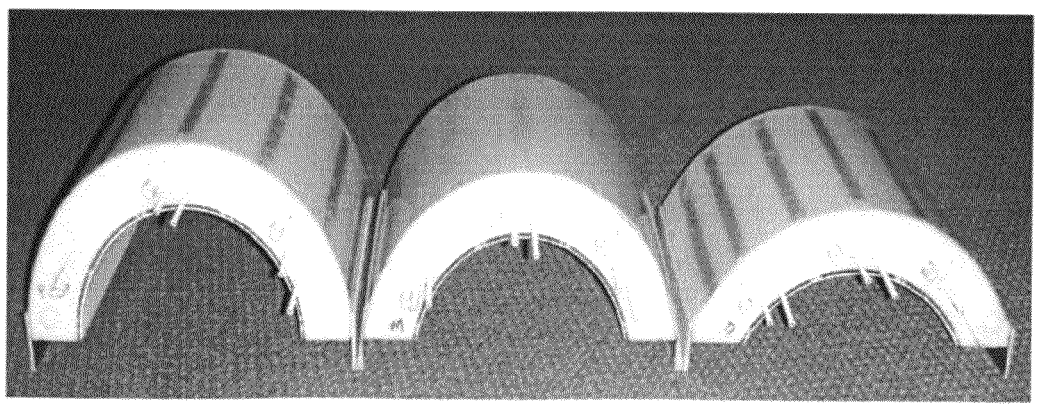

To emphasize as well as demonstrate this mode of cavity space control and means of change, a manufactured and functional embodiment of the minimalist split containment chamber having three different and alternatively dimensioned anterior housing segments suitable for juncture with a single posterior housing segment is illustrated by FIGS. 2A and 2B respectively.

In order to accommodate a range of different human head sizes and shapes using one transceiver apparatus, three different and alternatively dimensioned anterior housing segments were constructed as shown by FIG. 2B. The differences in size construction relate solely to the height dimension; and the manufacture of three alternative anterior housing segments allows the height dimension H of the cavity space of the containment chamber to be varied at will from 21 cm, to 23 cm, or to 25 cm. The width for all three alternative anterior housing segments is held constant and measures 19.5 cm.

In all other respects, there were no differences among the substitutable anterior housing segments; and each of them can be substituted for another and be joined at will to the same single posterior housing segment to form the fully erected containment chamber shown by FIG. 2A.

Alternative Posterior Housing Segments

It will be appreciated also that there is nothing to prevent the user from making and using a range of differently sized posterior housing segments, each of which has a different exterior and interior surface geometry. In these instances, it is intended and expected that the posterior housing segment 30 will be routinely manufactured as a series of 2-4 interchangeable multiples—each of which is dimensioned differently, and each of which can be substituted at will for another similarly constructed but alternatively dimensioned posterior housing segment.

In this manner, and by the exchange of one alternatively dimensioned posterior housing segment for another in combination and juncture with one or more anterior housing segments, the overall configuration and volume of the cavity space within the erected containment chamber is easily changed at will, and also without need for any meaningful adjustment of individual RF coils deployed within the chosen posterior housing segment.

2. The Shaped Cavity Space

As shown by FIGS. 1A and 2A, the internal cavity space lies within and is encompassed by the containment chamber of the transceiver apparatus. Also, via the use of multiple different and alternatively dimensioned anterior housing segments (see FIG. 2B) in combination with a single posterior housing segment (or a range of differently sized posterior housing segments), the resulting cavity space has all of the following features:

(i) A modifiable height dimension and variable overall configuration;

(ii) An internal void volume delineated by a perimeter edge which is coextensive with and contoured by the interior surface geometry of the joined housing segments forming the containment chamber; and (iii) At least one open end suitable for the insertion and containment of at least that part of a living subject's body intended for examination.

In particular, the juncture of pre-shaped anterior and posterior housing segments to form an erected containment chamber conforms the interior surface geometry of the cavity space to provide a determinable perimeter edge and a limited gap distance from the surface of the contained part of the subject's body; and concomitantly controls the internal air space and limits the void volume of the cavity space which will surround the surface of the contained part of the subject's body in accordance with the ratio $Q_U/Q_L$ such that effective transmission and reception is substantially maintained during the transmitting of RF pulses and receiving of RF signals at specified frequencies.

Relevance of the $Q_U/Q_L$ Ratio to Efficiency of Transmission

The transceiver apparatus of the present invention achieves efficiency of transmission by controlling the spatial distance of the deployed array of individual RF coils from the surface of the subject's body or body part while lying within the cavity space of the containment chamber. Transmission performance ($B_1$/watt) is defined by the size of the individual RF coils in the array (as described below); and this parameter permits the RF coil dimensions to be optimized in advance for a head model (or any other body part model) which has a characteristic size and shape. This relationship uses the ratio of the unloaded Q divided by the loaded Q or "$Q_U/Q_L$" to quantify the acceptable spatial volume of the cavity space and to control and limit the gap distance of the discrete RF coils to the exposed surface of the head or other contained body part. In this manner, that fraction of the total air volume provided by the perimeter edge of the cavity space which is not then occupied by the object to be imaged is constrained to be within preset limits, and the linear gap distance then existing between the deployed RF coils and the skin surface of the contained human body part is held to a pre-chosen and optimized interval.

Accordingly, the $Q_U/Q_L$ ratio can be successfully applied to a range of different human head sizes and shapes by controlling and altering the configuration and the void volume of the cavity space in the containment chamber illustrated by FIGS. 1 and 2 respectively. It is also noteworthy that a $Q_U/Q_L$ ratio of ~3 seems to be a threshold value or minimally required quantum, below which transceiver performance substantially decreases.

In dimensional terms therefore, this $Q_U/Q_L$ ratio translates into a limited maximal gap distance (as linearly measured in centimeters or inches) which can exist between the surface of the contained part (or whole) of the patient's body and the edge perimeter of the cavity space created by the combined interior surface geometries of the joined anterior and posterior housing segments.

Accordingly, in those transceivers structured for diagnostic evaluations of the human head, there should be no more than about a 2 cm gap distance at any point from the edge perimeter of the cavity space to the surface of the contained human head; and in the more preferred embodiments, there should be no more than about a 0.75-1.25 cm gap distance from at any point along the edge perimeter to any surface of the contained human head.

In a similar manner, a limited maximum gap distance (measured in centimeters or inches) should and will exist between the surface of the contained part (or whole) of the patient's body and the edge perimeter of the cavity space in any embodiment of the containment chamber of the present transceiver apparatus in order to obtain better performance and superior imaging. In each and every instance, therefore, it is

VI. AT LEAST ONE ARRAY COMPRISED OF MULTIPLE RF COILS

The transceiver apparatus requires the presence and use of at least one identifiable array comprised of not less than six discrete RF coils. Each of the RF coils is individually aligned in a preselected orientation within the array; and all the RF coils are collectively positioned in a pre-chosen pattern or arrangement and are jointly disposed adjacent to the interior surface geometry of at least one pre-shaped housing segment in the erected containment chamber.

1. The Attributes and Functions of the Deployed Array

Each identifiable array deployed adjacent the interior surface geometry of the housing structure in the transceiver apparatus must provide a variety of different functions and capabilities. These requisite functions and capabilities include the following:
 (a) Each identifiable array is operative to generate a magnetic field directed towards the surface of that part of the subject's body then lying within the cavity space of the erected containment chamber.
 (b) The array can transmit RF pulses; or can receive RF signals; or can both transmit RF pulses and receive RF signals concurrently.
 (c) Each RF coil in the array is individually tuned to transmit RF pulses at least at one preset frequency; or is tuned to receive RF signals at least at one known frequency; or is tuned to both transmit RF pulses at one preset frequency and to receive RF signals at another preset frequency concurrently.
 (d) Each RF coil in the array is individually matched to the intended anatomic target such that the impedance of the RF coil is adjusted and maximizes the efficiency of transmission and/or reception.
 (e) Each RF coil in the array is reactively decoupled to control the magnetic field interactions which may occur between the adjacently located RF coils.

The nature of the individual RF coils and the attributes of the array(s) are therefore described in detail below.

2. The Individual RF Coil Structure

A Single RF Coil can have Multiple Elements and Components

A single RF coil can be alternatively identified as a transverse electromagnetic ("TEM") coil, or as a volume coil, or as a surface coil, or as a CRC coil, or as a transmission line segment. In various conventionally known formats, a single RF coil structurally can and will include multiple strip-lines, micro-strips and TEM elements as separate distinguishable elements, and/or current controls (e.g. capacitors, inductors, PIN diodes etc.) as separate components.

By definition herein (as well as by commonly held understanding in this technical field), an "element" is only a part of one complete RF coil structure; and consequently, it will be recognized that all "elements" and "components" as such are merely those particular constituent entities and operative subdivisions then present within a single RF coil structure. Accordingly, a single RF coil commonly and routinely contains multiple discrete elements and components whose actual number is routinely varied to meet particular use conditions and applications [see for example U.S. Pat. No. 6,969,992].

Thus, a single multi-element radiofrequency coil is often constructed as an 8-element structure. However, a single RF coil having either a greater number or a lesser number of such discrete elements is conventionally known. For example, in its various forms, a single RF coil can contain 4 elements, or 16 elements, or even 32 elements [again see U.S. Pat. No. 6,969,992]. Nevertheless, regardless of the number of elements actually present in the overall structure, each of these structures constitutes only one single RF coil.

The Surface RF Coil Structure

Figure 3:
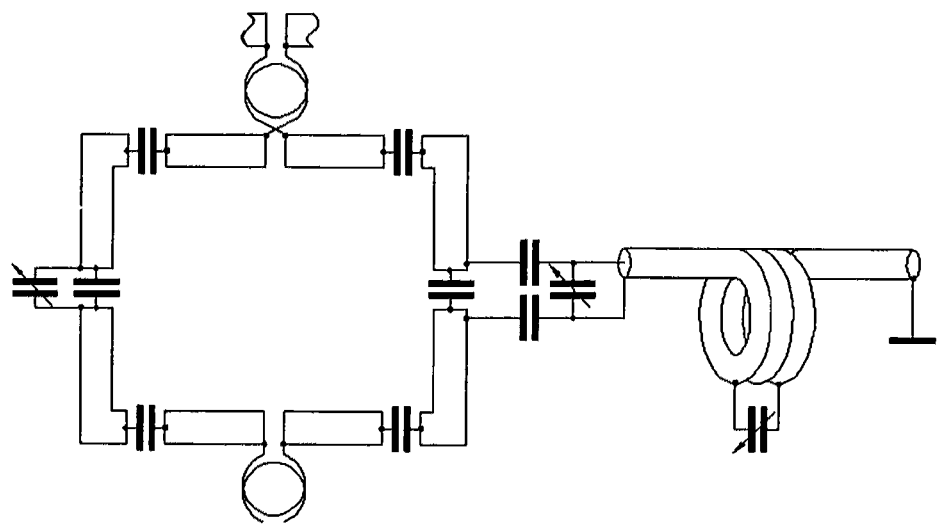
FIG. 3 is a schematic illustration of a single surface RF coil structure.

In preferred embodiments of the present invention, each of the individual RF coils in the deployed array is a surface coil whose typical structure is substantially rectangular in overall configuration and is about 9 cm in length. The individual surface RF coil is typically constructed from copper tape (6.4 mm width), and has multiple capacitors uniformly distributed along its length. A schematic illustration one surface RF coil structure is provided by FIG. 3.

An Alternate RF Coil Structure

Although homogeneous excitation of the entire object within an array is often desirable for anatomical imaging, restriction of the excitation pattern to a portion(s) of the object to suppress unwanted signals is often used for spectroscopy and spectroscopic imaging applications. The ability to create an RF field distribution which excites a narrow band about the periphery of the brain (i.e., including skeletal muscle, skin and bone marrow within the skull) without the use of magnetic field gradients requires a rapid decrease of the summed RF fields emanating from the individual RF surface coils as they penetrate into the brain.

When using an array of multiple RF surface coils which are designed to provide homogeneous excitation, it can be difficult to generate a relatively uniform RF field which is limited to only the periphery of the head, with minimal excitation of the central brain region. Therefore, the use of an alternate RF coil structural geometry in the array (i.e., one which has a more rapid rate of decay of $B_1$ with increasing distance away from the RF coils) to suppress unwanted signals in one zone—combined with preservation of the multiple RF coils for excitation of the desired signals in another zone—would be a major benefit.

One such alternate design is a counter rotating current (CRC) coil structure. This alternate RF coil design is illustrated by FIGS. 4 and 5 respectively.

Figure 4:
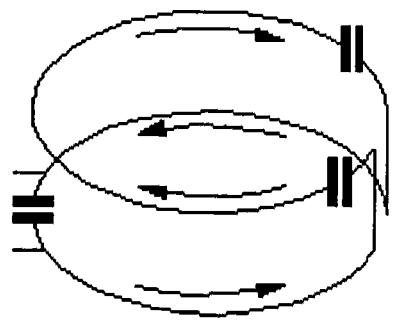
FIG. 4 shows a single CRC coil as a structural arrangement of two individual loops of multiple RF elements, the two loops are connected in series.

As seen in FIG. 4, the CRC coil is a structural arrangement of two individual loops of multiple RF elements, the two loops are connected in series. together forming a single RF coil; and is an arrangement in which the current flows in opposite directions within each separate loop in each of the eight individual RF coils constituting the array as a unified whole.

Figure 5:
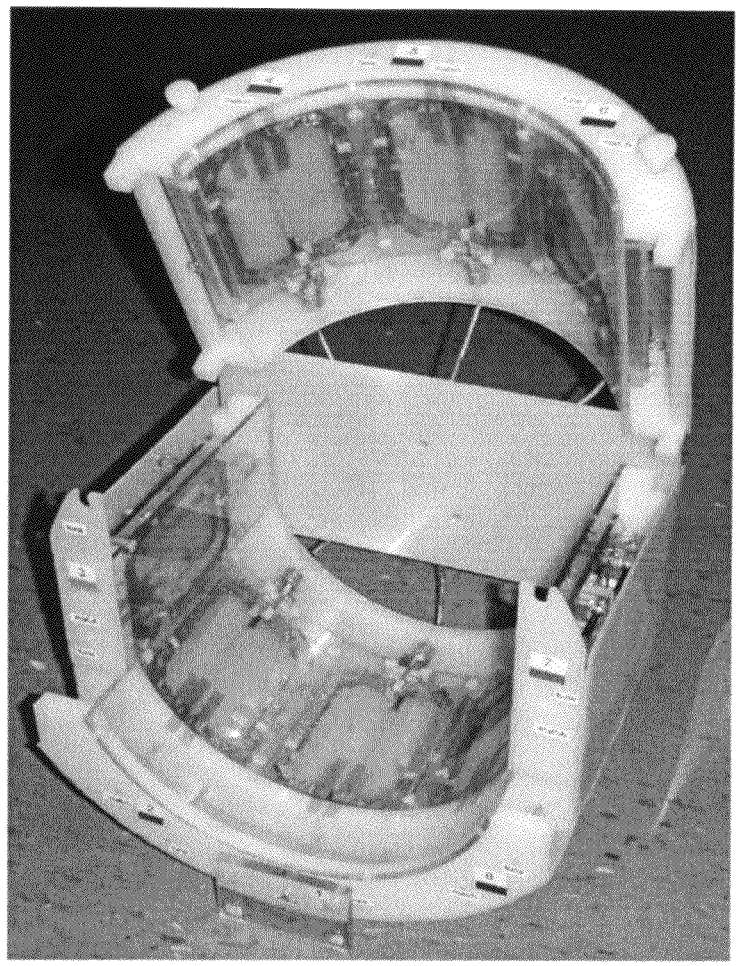
FIG. 5 shows a preferred embodiment of a transceiver apparatus having a single identifiable array comprised of a single row of eight CRC coils in series.

Accordingly as shown by FIG. 5, in a preferred embodiment of a transceiver apparatus, the single identifiable array comprises of a single row of eight CRC coils, each of these eight CRC coils structurally appearing as two separate loops.

Figure 6:
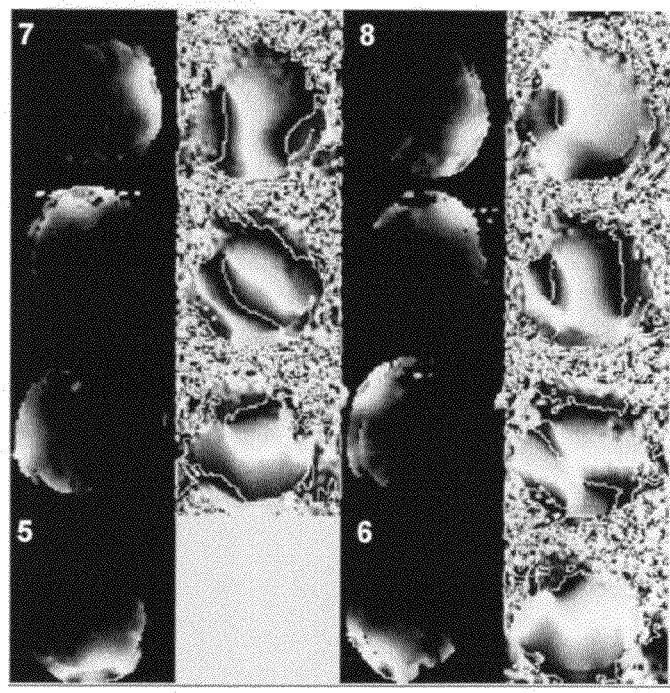
FIG. 6 shows $B_1$ maps (amplitude and phase) from a human head which were acquired using the CRC transceiver apparatus of FIG. 5.

The enhanced imaging value of this CRC coil arrangement in the single identifiable array is revealed by the $B_1$ maps (amplitude and phase) from a human head which were acquired using the CRC arrangement in the transceiver, and is shown by FIG. 6. The use of this particular CRC coil structure has a much more rapid decay of the RF field into the head in comparison to the single turn array pattern describe above, despite a similar RF amplitude directed at the periphery of the head.

A Double Resonance, Single RF Coil Structure

Figure 7:
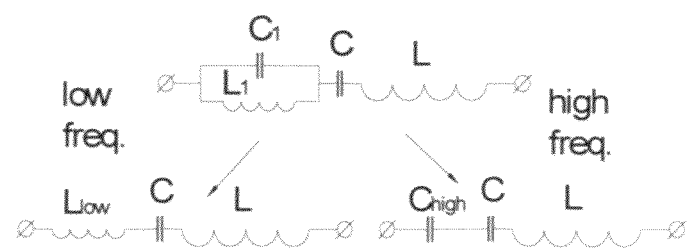
FIG. 7 shows the general construction of a single, double-tuned, surface RF coil suitable for use in an identifiable array.

Double resonance (or "double-tuning") of a single RF coil can be achieved by using a resonant trap circuit. This is illustrated by FIG. 7 which shows the general construction of a single, double-tuned, surface RF coil suitable for use in an identifiable array. In the construct of FIG. 7, the inductive loop (L) is used to produce a $B_1$ field for transmission and receive RF signals. A resonant trap, formed by a parallel resonance circuit ($L_1$, $C_1$) and capacitor C, is connected in series with a surface coil presented in figure by inductor L.

In addition, via the schematic design shown by FIG. 7, the impedance of the trap is given by $Z_{trap}=j\omega L_1/(1-\omega^2 L_1 C_1)$. At low frequencies ($\omega^2 L_1 C_1 < 1$), $Z_{trap}$ is equivalent to an inductor while at higher frequencies ($\omega^2 L_1 C_1 > 1$) it acts as a capacitor.

However, addition of the trap to the resonant circuit results in additional resistance, $R_T$—which degrades the overall performance of the RF coil. The performance of the surface RF coil at both frequencies can be estimated as $E=[P_L/(P_L+P_T)]^{1/2}=[R_L/(R_L+R_T)]^{1/2}$, where $P_{L,T}$ and $R_{L,T}$ are power losses and resistances associated with inductor L and the trap.

Taking into account sample losses, one obtains:

$$E=[(R_L+R_S)/(R_L+R_S+R_T)]^{1/2} \quad \text{[Equation 1]}$$

where $R_S$ is resistance associated with sample losses. In addition, one obtains:

$$E_{low}=[(1+R_S/R_L)/(1+R_S/R_L+L_1/L)]^{1/2} \quad \text{[Equation 2]}$$

$$E_{high}=[(1+R_S/R_L)/(1+R_S/R_L+L/L_1)]^{1/2} \quad \text{[Equation 3]}$$

If the ratio of $R_S/R_L=1$ at the lower frequency and 1.5 at the higher frequency, values estimated experimentally for coils of about 8 cm in size resonating at $^{31}$P (120.7 MHz at 7 T) and $^1$H (298 MHz at 7 T) frequencies with $L_1/L=0.3$, one obtains $E_{low}=0.93$ and $E_{high}=0.65$.

In order to improve efficiency of the double-tuned surface RF coil at higher frequency, the trap inductance $L_1$ should be increased. This increase, in turn, will decrease the low-frequency coil performance. Therefore, it is difficult to optimize RF coil performance at both frequencies.

For this reason, at higher frequencies, multiple traps should be introduced into a surface RF coil—which is the functional equivalent of distributing capacitors along the length of the coil. However, since each trap circuit introduces additional losses, this also causes a further reduction in coil performance.

Figure 8:
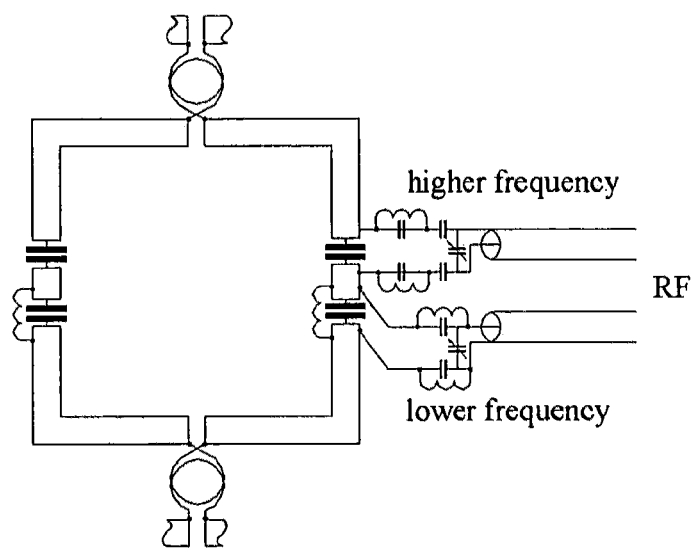
FIG. 8 shows a schematic illustration of a single RF coil having only two trap circuits.

For illustrative purposes, FIG. 8 presents a schematic of a single RF coil having only two trap circuits. Also for simplicity, only a single double resonance RF surface coil is shown by FIG. 8. Tuning and matching can be performed independently at both frequencies; and parallel resonant traps have been placed into the matching network to provide a sufficient level of decoupling between RF ports at both low and high frequencies.

Another issue complicating the construction of a double-tuned RF coil is the necessity to decouple all the individual RF coils in the array at both frequencies of interest. Therefore, to decouple adjacently located surface RF coils in the identifiable array, inductive decoupling is preferably used. Structurally, the tangible inductive decoupling means comprised two small (~1 cm) strongly coupled loops connected in series with each discrete surface RF coil (see FIG. 8); and these coupled loops connected in series produce a neutralizing voltage which effectively resolves the problem.

Although the inductive decoupling is frequency independent, due to differences in RF distributions at higher and lower frequencies, the isolations between the adjacently located surface RF coils typically measured −14 dB or greater at $^{31}$P frequency, and −10 to −12 dB at $^1$H frequency.

3. At Least One Identifiable Array

A Single Array Comprised of not Less than Six Individual RF Coils

The present invention requires each identifiable array to be comprised of not less than six discrete RF coils—which are individually aligned in a preselected orientation and collectively positioned in accordance with a pre-chosen pattern or arrangement adjacent to the interior surface geometry of at least one pre-shaped housing segment in the erected containment chamber. The actual number of discrete RF coils which can be employed to form one identifiable array has no meaningful restriction or limit; and single arrays comprised of eight (8), or twelve (12), or sixteen (16), or even thirty two (32) discrete RF coils are envisioned and deemed to be practical for use. A schematic illustration of a preferred single array formed of eight individual RF surface coils coil is presented by FIG. 9.

It will be recalled also that each discrete RF coil in the array may contain multiple internal elements (e.g., 4 elements, or 16 elements, or even 32 individual elements) and multiple internal components (e.g., capacitors, inductors, and PIN diodes); and that in every instance, regardless of the true number of internal elements and components actually present, only a single discrete RF coil structure actually exists.

In addition, any of the individual RF coils in the deployed array is able to be used for: (i) only transmission of RF pulses; or (ii) only reception of RF signals; or (iii) both transmission of RF pulses and reception of RF signals concurrently.

Deployment of the Identifiable Array

In the improved transceiver apparatus, at least one identifiable array is positioned in accordance with a pre-chosen pattern, plan, or organizational scheme adjacent to the interior surface geometry of at least one pre-shaped housing segment in the erected containment chamber. In this regard, the manufacturer or user is free to deploy the array in any desired or required manner to suit either the need or the occasion. Accordingly, the deployment pattern actually used may be regular or irregular; symmetrical or asymmetrical; geometric or non-geometric; and uniform or non-uniform; or appear as any combination of these alternatives.

In preferred embodiments, the single array will be deployed co-extensively with and along the perimeter edge of the cavity space in the containment chamber; and will typically be split into two or more sections of multiple RF coils for deployment on both the anterior and posterior housing segments. The most common arrangement is believed to be an elliptical pattern which circumscribes the entire cavity space, as illustrated by FIGS. 1B and 2A respectively. In these instances, the identifiable array may be alternatively positioned in variety of circumferential arrangements such as hyperbolic, oval, oblong, and polygonal patterns.

Clearly however, there is no requirement or necessity that the identifiable array be deployed in any circumferential pattern as such. Instead, it is expected that in some specific clinical applications, the identifiable array will be deployed in orderings and groupings which are not completely encompassing. Thus, the identifiable array may be entirely deployed adjacent to the interior surface geometry of the anterior housing segment alone, or lie completely disposed along the interior surface geometry of the posterior housing segment alone. Accordingly, the true requirement is merely that the identifiable array be positioned in a pre-chosen pattern and lie disposed adjacent to the interior surface geometry of at least one pre-shaped housing segment in the erected containment chamber.

In a similar fashion, the discrete RF coils comprising the array are to be individually aligned in a pre-selected orientation. This requirement allows considerable freedom as to the specific choices of RF coil alignment and orientation—i.e., the series of RF coils can lie along a cylindrical surface with a single elliptical cross sectional area or exist in a tapered orientation reflecting a spatially varying cross section; or be aligned as multiple discrete coils along an X or Y axis; or appear as overlying loops of multiple RF coils along a Z axis; or appear in a birdcage, dome, U-shaped, spiral, or dog-bone shaped pattern.

Decoupling of the Multiple RF Coils in a Single Array

In preferred embodiments, all the adjacently positioned RF coils in each array are individually decoupled inductively using electrically insulated decoupling loops (~12 mm in diameter). Each decoupling loop is connected adjacent to and in series with each of the RF coils. This arrangement is shown by the multiple surface RF coils 52a-52H and the series of decoupling loops 54a-54h appearing within FIGS. 1C and 1D respectively.

Figure 9:
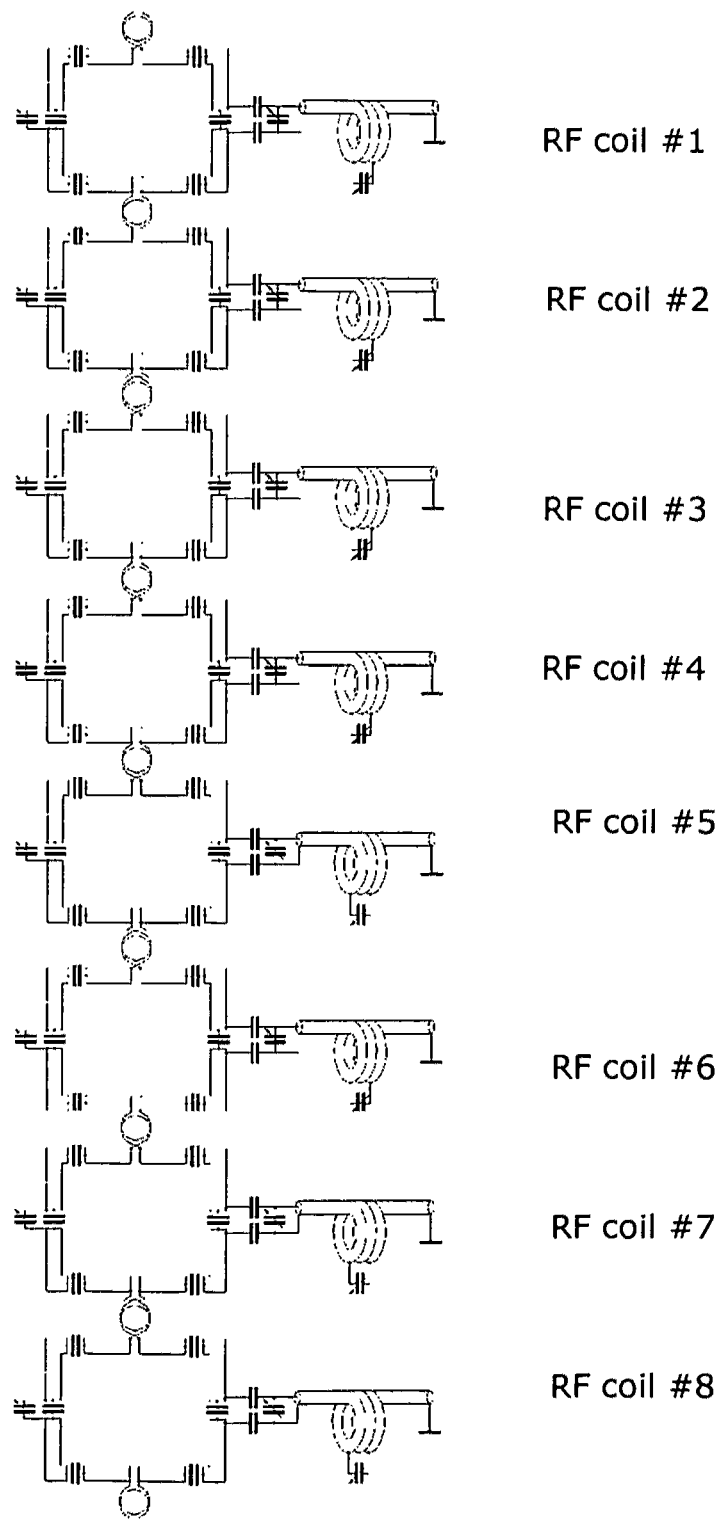
FIG. 9 shows a schematic illustration of a preferred single array formed of eight individual RF surface coils.

To verify the effect of the inductive decoupling, a head mimicking phantom target (a 16 cm sphere containing 90 mM NaCl) was positioned 2-3 cm away from the array of multiple RF coils shown by FIGS. 1 and 9. Empirical measurements revealed that a decoupling isolation of at least 16 dB between adjacent single RF coils was consistently achieved; and moreover, not less than this quantum of inductive decoupling (at least 16 dB) was maintained between each of the individual surface RF coils in the array.

Positioning of at Least One Array in a Pre-Chosen Pattern Adjacent the Interior Surface Geometry of at Least One Pre-Shaped Housing Segment For clarity and ease of understanding, this description will be restricted to an improved transceiver apparatus suitable for imaging of the human head. It will be expressly understood, however, that similar alternative embodiments for imaging any other part of the human body, or for imaging the entire human body are also intended and encompassed hereby.

In order to provide better conformity to the human head, the array as a unit is desirably deployed in a substantially elliptical pattern adjacent to the interior surface geometry of the joined pre-shaped housing segments in the erected containment chamber. Thus, in a preferred embodiment, the bottom (or posterior) housing segment of the transceiver apparatus supports five individual RF coils, while the top (or anterior) housing segment supports three individual RF coils. Also, owing to the effect of inductive decoupling between each of the individual RF coils, no electrical connection between the 5-coil portion and the 3-coil portion of the array was required. See FIG. 1B and FIGS. 2A and 2B as an example of this arrangement.

In accordance with this pattern, the single array is positioned circumferentially adjacent to the elliptically-shaped interior surface geometry of the joined anterior and posterior housing segments such that the arrangement of multiple RF coils in series lies co-extensive with and at the perimeter of the cavity space. Each of the RF coils in the array was individually tuned and matched using variable capacitors.

Properties of the Individual RF Coils within the Identifiable Array

Each and every individual RF coil structure present within an identifiable array will exhibit at least three different characteristics and attributes:

(i) Each RF coil is tuned to at least one specified frequency. It has long been recognized that variations in the size and tissue composition of the anatomy placed in an imaging coil affect the amount of RF energy getting into the body and the amount of signal detectable from the imaged anatomy. For these reasons, the RF coil should be tuned whenever it is known that the nature of the anatomy or the kind of material to be imaged changes.

Tuning of the RF coil entails adjusting either the inductance and or capacitance of the RF coil to achieve a specific resonance frequency. One method for tuning uses a variable capacitor in parallel to the RF coil and is known as the "tuning capacitor".

(ii) Each RF coil is matched such that the impedance of the coil at the resonant frequency is adjusted to maximize the efficiency of transmission and/or reception. To ensure maximum power transfer between the RF power amplifier and the RF coil, the coil's input impedance must match the amplifier output impedance. Additionally, the RF coil impedance must match the characteristic impedance of the transmission line coupling the RF coil to either the RF power amplifier. This can be achieved by using adjustable impedance matching networks. One method uses a variable capacitor in series with the RF coil and is known as the "matching capacitor".

(iii) Each RF coil is individually decoupled to control the magnetic interactions between it and the other RF coils in the array. Inductive decoupling typically uses two small inductor loops which are connected in series to two adjacently positioned RF imaging coils. The two small inductor loops are used to cancel the mutual coupling between the two RF coils; and the small inductor rings are placed very close to each other so that their mutual coupling can counteract the mutual coupling of the RF coils. Alternately, for conditions when the mutual inductive decoupling between adjacent RF coils is weak, two small loops connected in series can be placed in the proximity of the RF coils to be decoupled. In this implementation no direct electrical contact between the decoupling loops and the RF coils is used.

Note also that inductive decoupling is different and distinguishable from "capacitive decoupling" which employs capacitors (rather than inductors) to decouple the mutual coupling effect. In this alternative technique, adjacent RF coils and non-adjacent RF coils are connected together through a capacitor network whose capacitor values, when carefully chosen, can decouple the mutual coupling between RF coils.

4. Multiple Tandem-Paired, Double-Tuned RF Coils Forming a Single Array

Figure 10:
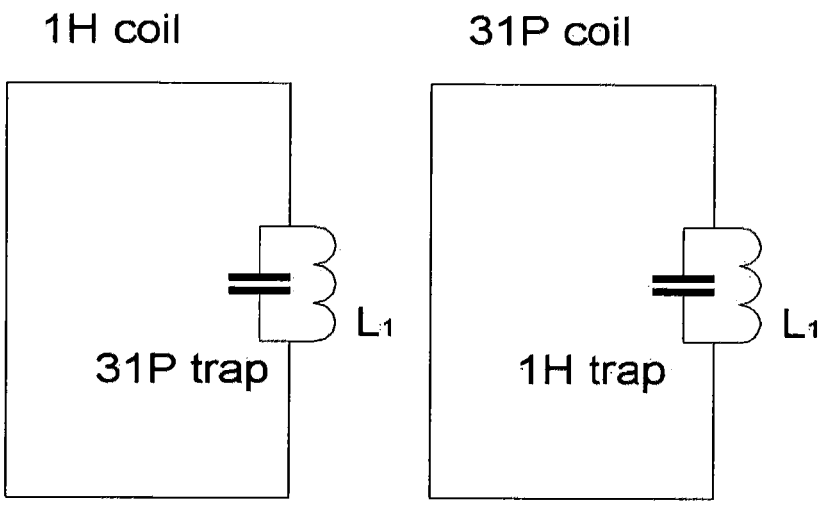
FIG. 10 shows a view of one functional unit in the double-tuned ($^{31}P/^1H$) phased array comprising two discrete (single-tuned) surface RF coils joined in tandem.
Figure 11:
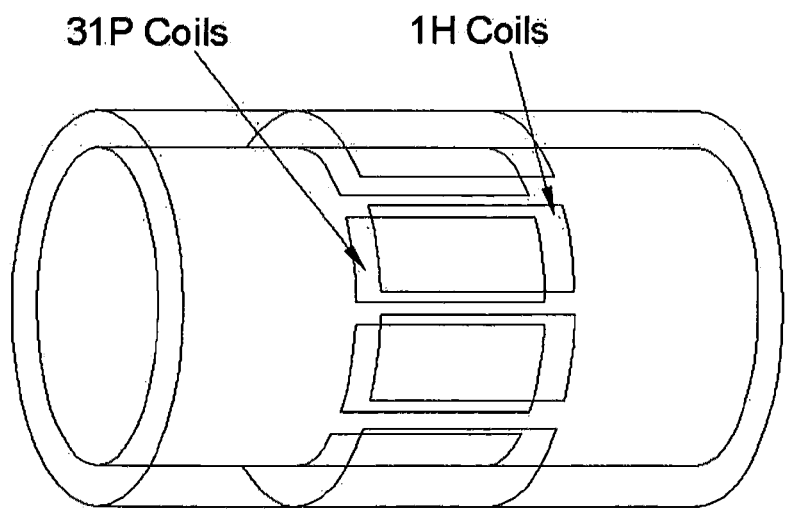
FIG. 11 shows a different view of one functional unit in the double-tuned ($^{31}P/^1H$) phased array of FIG. 10 which comprises two discrete (single-tuned) surface RF coils joined in tandem.

A double-tuned phased single array of six or more surface RF coils can also be constructed by separating the structure of individual double-tuned RF coils resonating at the X-nuclei and $^1$H-frequencies into tandem pairs. In this model format, one functional unit in the double-tuned ($^{31}$P/$^1$H) phased array comprises two discrete (single-tuned) surface RF coils in tandem, as shown by FIGS. 10 and 11.

In this format, the values of the trap inductances ($L_1$) can be optimized independently for each double-tuned RF coil in the array. In addition, since the number of traps can be limited to merely one or two, the losses associated with traps are further minimized.

The performance, $E_{low}$, for the low frequency RF coil can be estimated by $$E_{low}=[(1+R_S/R_L)/(1+R_S/R_L+L_1^{low}/L)]^{1/2} \quad \text{[Equation 4]}$$

and can be improved by further minimizing $L_1^{low}$. The performance of the high frequency coil, $E_{high}$ value can be evaluated using $$E=[(R_L+R_S)/(R_L+R_S+R_T)]^{1/2} \quad \text{[Equation 5]}$$

Taking into account that $R_T=R_1/(1-\omega_0^2/\omega_1^2)$, where $R_1$ is resistance associated with the $L_1$, $\omega_0$ is the $^1$H resonance frequency, and $\omega_1$ is the $^{31}$P resonance frequency, one obtains $$E_{high}=[(1+R_S/R_L)/(1+R_S/R_L+L_1^{high}/5L)]^{1/2} \quad \text{[Equation 6]}$$

Using $R_S/R_L=1.5$ with L=200 nH (inductance of 8×9 cm² coil) and $L_1^{high}$=110 nH ($^{31}$P resonance with $C_1$=10 pF), one obtains $E_{high}$=0.98.

Thus, the performance of the each of the two coils in the tandem pair can be optimized, thereby improving the performance of the functional unit at both resonance frequencies.

If desired, the low and high frequency coils in the tandem pair unit can be arranged into two aligned upper and lower concentric elliptical cylinders, as shown in FIG. 11. Inductive decoupling between the adjacent coils within a given layer is provided in a manner similar to that shown in FIG. 9; and the decoupling can be optimized independently at both frequencies for the surface RF coil. If necessary, parallel resonance traps can be introduced in series into matching network to improve decoupling between individual RF coils forming the tandem pair at the low and high frequencies.

A preferred embodiment of a transceiver apparatus using this tandem pair unit format arranged into two aligned upper and lower concentric elliptical cylinders is illustrated by FIGS. 12A-12D respectively. As seen therein, FIG. 12A displays a double resonant ($^1$H and $^{31}$P) transceiver apparatus comprised of 8 tandem coils; FIG. 12B shows the two portions forming the transceiver apparatus; and FIGS. 12C and 12D show the top portion of the apparatus without its inner cover.

5. Multiple Array Embodiments

Multiple Identifiable Arrays

It is expected and intended that two of more identifiable arrays (each comprised of at least 6 discrete RF coils) will be employed in some preferred embodiments of the improved transceiver apparatus. In general, from two (2) to about twelve (12) identifiable arrays can be individually aligned in a pre-selected orientation and collectively positioned in a pre-chosen pattern adjacent the interior surface geometry of at least one pre-shaped housing segment in the erected containment chamber. However, there is no limit as such for the total number of identifiable arrays that can be deployed within the transceiver apparatus for any given embodiment.

Desirability for Using Double Resonance RF Coils

To provide anatomical landmarks for interpretation of X-nuclei ($^{31}$P, $^{13}$C, $^{23}$Na etc.), spectroscopic high-resolution $^1$H anatomical images are also required. Thus, in order to eliminate uncertainties associated with either repositioning the patient or changing the RF coil settings, the RF coil must also resonate at the $^1$H frequency to support $^1$H imaging.

For this purpose, double-resonant volume head coils, based on both birdcage (BC) and transverse electromagnetic (TEM) designs have been developed and are conventionally known. However, at RF frequencies higher than ~120 MHz ($^1$H frequency at 3 T), the RF field profile of a volume head coil becomes substantially inhomogeneous. For example, the level of inhomogeneity over the human brain is about 15% at 3 T ($^1$H frequency ~120 MHz). Moreover, such inhomogeneity increases to 25-30% at 4 T (170 MHz), and further increases to more than 50% at 7 T (300 MHz).

It is also noted that at field strengths of 7 T and above, even X nuclei such as $^{31}$P (120 MHz @ 7 T), begin to experience significant $B_1$ inhomogeneity due to high frequency effects. Under these circumstances, a phased array of multiple double-tuned volume head coils (in combination with RF shimming) will provide a better solution.

However, in so far as is known to date, a phased array of multiple double resonance RF coils does not exist in this technical field. One clear reason for this absence is that an array comprised of multiple double-tuned RF coils is a substantially more complicated design than an array of single-tuned RF coils—since all the individual RF coils must be tuned to different frequencies (transmitting and receiving) and decoupled at both resonance frequencies at the same time.

These problems can be overcome in either of two different ways: (i) by using a single RF coil operating at both frequencies simultaneously; or (ii) by using two separate RF coils positioned in close proximity, one RF coil operating individually to transmit signals at a preset single frequency and the other RF coil operating independently to receive signals at another pre-chosen single frequency.

In the former instance, if the RF coils used are resonant at both the transmission and reception frequencies concurrently (i.e., either in sequence or simultaneously), a single array of double resonance RF coils may be used to create the resonant structure, as illustrated by FIGS. 7 and 8 respectively.

Figure 12:
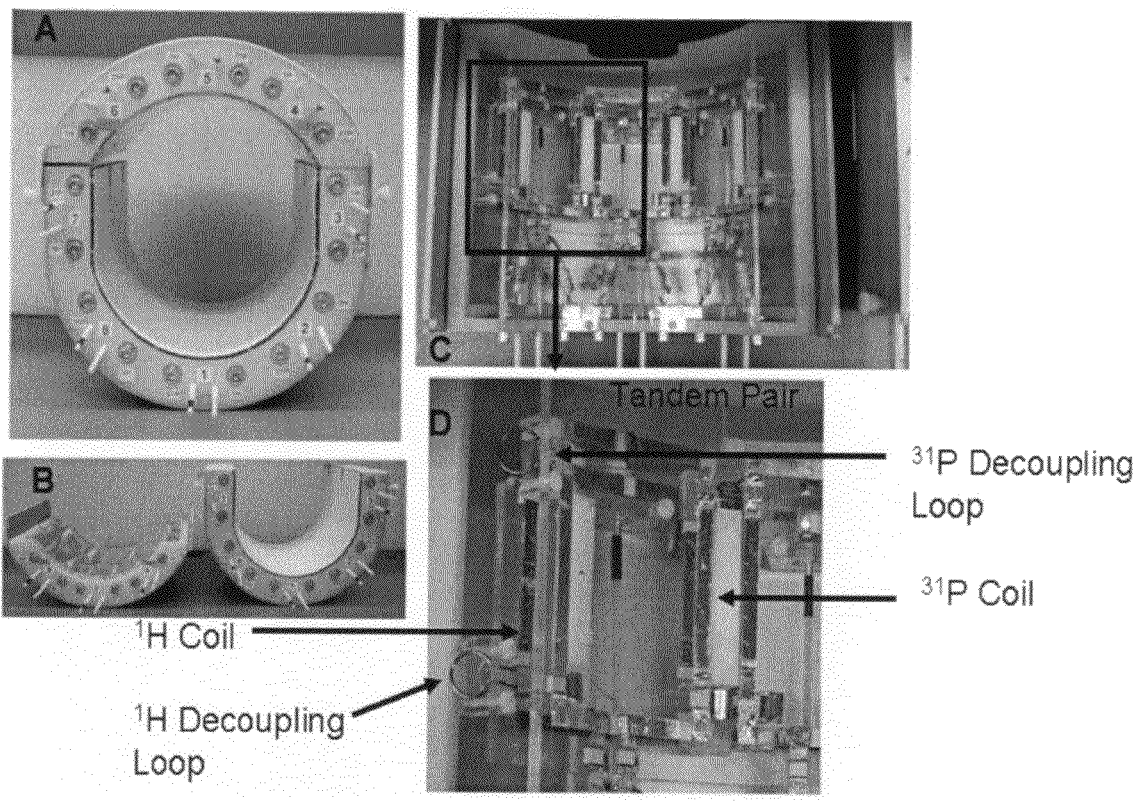
FIGS. 12A-12D show different views of a double resonant transceiver apparatus ($^1H$ and $^{31}P$) using a single array of 8 tandem coils.

Alternatively, in the latter instance, where two coils are placed in close proximity and each coil is tuned to a different frequency, the transceiver can be constructed using two contiguous and abutting array layers of RF coils, with an inner array layer operating at one frequency and the outer array layer operating at another frequency. This arrangement is described below and is illustrated by FIG. 12.

The Arrangement and Positioning of Two Identifiable Arrays

The transceiver apparatus comprising the present invention can be constructed as a multi-layer stack of 2 or more identifiable arrays, wherein each separate layer in the stack arrangement constitutes one identifiable array comprised of at least 6 independent RF coils.

In some of these embodiments, at least two identifiable arrays are employed which are individually aligned as contiguous layers and co-extensively positioned as abutting arrays adjacent the interior surface geometry of at least one pre-shaped housing segment in the erected containment chamber, wherein (a) each of said RF coils in the array layer is individually operative to generate a magnetic field directed towards the surface of that part of the subject's body then lying within the cavity space of the erected containment chamber, (b) each of said RF coils in one array layer transmits RF pulses and is tuned to transmit RF pulses at a preset frequency, (c) each of said RF coils in the other array receives RF signals and are tuned to receive RF signals at a pre-chosen frequency, (d) each of said RF coils in the other array transmits RF pulses and is tuned to transmit RF pulses at a preset frequency, (e) each of said RF coils in both array layers is individually matched such that the impedance of the RF coil is adjusted to maximize the efficiency of transmission, and (f) each of said RF coils in both array layers is individually reactively decoupled to control the magnetic field interactions between the multiple RF coils.

Note also that, within each identifiable array layer of the stack arrangement, all of the discrete RF coils have been individually tuned, matched, and inductively decoupled.

Thus, in transceiver embodiments of this format which are suitable for imaging the human head, each of the two concentric layers of arrays presents a series of evenly spaced RF coils which are positioned to circumscribe the entire human head (there being 6 or more RF coils in each array layer).

Also in these constructions, the stack of two or more array layers is to be split into two (equal or non-equal) portions and preferably will be disposed adjacent the internal surface geometries of the anterior and posterior housing segments in the erected containment chamber. The splitting of the stack of multiple array layers into two separate portions allows for easy patient access and the maintenance of an optimal $Q_U/Q_L$ filling factor. Typically, the posteriorly deployed portion of each array layer has 10 surface RF coils (5 for each frequency), while and the anteriorly deployed portion of each array layer contains 6 RF coils (a 2×3 coil pattern). Owing to inductive decoupling in each array layer, no electrical connection between the deployed parts of the array is required.

Alternatively, if concurrent transmission and reception from each layer is not required (i.e., each array layer of the stack is used only for specific pulses in the sequence), the RF coils existing in different array layers can be decoupled from each other using active detuning. For active detuning each surface coil contains a resonant tank circuit (formed of a capacitor, two small inductors, and a PIN diode, driven by DC voltage) applied through the RF cable. Using this configuration noise injection due to DC wires is eliminated by directly connecting to the coils.

VII. COMPARISONS OF TRANSCEIVER CAPABILITIES AND OTHER POINTS OF DIFFERENCE

The present invention is markedly different from conventionally known and commercially sold transceivers in its performance and capabilities. A brief summary of some distinguishing attributes, features and capabilities is presented below.

Performance Comparisons with Conventional Transceiver Devices

1. Recently, a set of performance specifications for a 16 element coil in a transceiver used at 7 T magnetic field strength was published in the scientific literature [see Adriany, G., et al., *A geometrically adjustable* 16-*channel transmit/receive transmission line array for improved RF efficiency and parallel imaging performance at 7 Tesla*. Magn Reson Med, 2008. 59(3): p. 590-7]. For central brain locations at the level of the thalamus and ventricles, these studies used a 90 pulse duration ranging from of 469-492 us at 1 kW (or 3.5 kW to 3.9 kW) to achieve 1 kHz of peak B1 at the center of the head.

In comparison, a preferred embodiment of the transceiver apparatus having 8 RF coils in a single array achieved 1 kHz over this brain locale at powers of 2.01+0.42 kW, 2.77+0.47 kW, and 3.42+0.94 kW using the small, medium and large sized anterior housing segments described above. Of the 48 separate studies targeted at the center of the human head, 42 clinical evaluations could be performed using the smallest-sized (9 persons) or medium-sized (33 persons) top segment, and only 6 persons required the use of largest-sized top segment. Thus, the improved transceiver apparatus achieves substantially better transmit efficiency for the two smaller sized top segments.

2. In order to provide a direct comparison with a conventional 8 coil RAPID transceiver, $B_1$ maps and images were acquired from the same volunteer using the RAPID device and the preferred 8 RF coil single array transceiver apparatus with the same medium-sized top housing segment (the most commonly used configuration). For a brain slice selective 90 degree pulse of 5 mm, the improved transceiver required only 188V, while the RAPID transceiver required 374V. Thus, the conventional RAPID transceiver was less efficient (µT@1 kW), by nearly a factor of 2, and thus required approximately a 4 fold increase in power.

In addition, to evaluate receive sensitivity using the RAPID transceiver and the preferred 8 RF coil array transceiver, gradient echo images were acquired using TE/TR 4.53/700 ms 512×512 3 mm and the same pulse angle. The obtained data revealed that the improved transceiver achieved a 1.87 fold improvement in signal-to-noise ratio from central brain regions (117.54 v. 62.98), consistent with the ~2 fold improvement in transmit efficiency.

Numerical Modeling of RF Coil Performance

Initially, it will be appreciated that the tuning of all 8 RF coils in the single identifiable array of the improved transceiver apparatus is achieved by setting all of the distributed capacitors along each discrete coil to a single value. Matching of all 8 RF coils in the array is achieved by calculating the normalized complex reflection coefficient ($\rho=(Z_T-1)/(Z_T+1)$) and determining the required values of the match capacitor to achieve 50Ω.

After each discrete RF coil in the array(s) has been tuned and matched, the respective $B_1$ fields and maps of SAR can be calculated. Extraction of $B_1$ (r) and the transmit phase $\phi j(r)$ from the $B_1$ maps allows calculation of the RF amplitude and RF phase for RF shimming.

The $B_1$ amplitude and phase maps for the small-sized top segment for a slice through the thalamus and basal ganglia were calculated using REMCOM's FDTD software and compared with empirical measurements obtained from live volunteers. The empirical data showed that, despite the large differences in head size and shape among the live volunteers, the phase and amplitude maps are very similar. This empirical evidence and result fully supports and confirms the accuracy and value of the tuning and matching technique.

RF Coil Size and Spacing in the Array

A. The overall size and relative spacing of the individual RF surface coils within an identifiable array is determined by several factors:

(1) A minimum circumferential size is preferred, so as to permit the entire head or other body part to be circumscribed;

(2) A maximum circumferential size is preferred, so as to so as to optimize the distance from each RF coil in the array to the head for efficient transmission; and (3) An optimal separation of the individual RF coils is preferred, so as to allow sufficient overlap of the individual generated $B_1$ fields to provide homogeneity—but which will also minimize both phase cancellation and the resultant inhomogeneity and inefficiencies in transmission.

B. To evaluate and demonstrate the role of maintaining an optimal distance between the RF coil and the object to be imaged, an empirical comparison was made between the 8 coil improved transceiver array shown in FIG. 2A and a test control device, a non-split circular transceiver having 8 RF coils of similar size and a fixed circular geometry of 25 cm diameter as shown by FIG. 13.

With relevance to the results of this direct comparison testing, several points of information are empirically demonstrated and are now particularly noted. First, the diameter of the individual RF coil, independent of how the multiple RF coils are deployed adjacent the interior surfaces of the top and bottom housing segments, is constrained by the actual size of the human head (or other body part to be examined) and by the distance $d_i^{HS}$ from the head surface (or other body part surface) to the material face of the individual RF coil. This relationship is illustrated in detail by FIG. 14.

Figure 14:
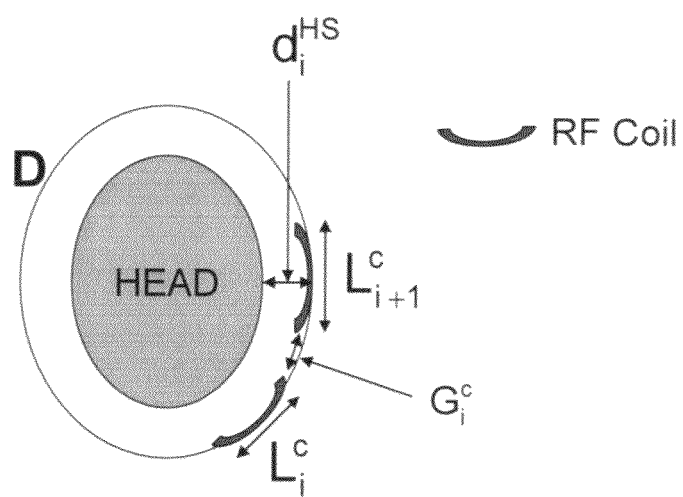
FIG. 14 is a diagram showing how the multiple RF coils deployed adjacent the interior surfaces of the top and bottom housing segments are constrained by the actual size of the human head and by the distance from the head surface to the material face of the individual RF coil.

Accordingly, as shown by FIG. 14, the distance from the surface of the head to the ith RF coil in an elliptical array (shown by FIG. 2A) is relatively constant for the individual RF coils (for coils #1, #2, #3, #7 and #8, the $d_i^{HS}$~1 cm); and thus the individual RF coils each required relatively similar peak $B_1$ levels.

Figure 13:
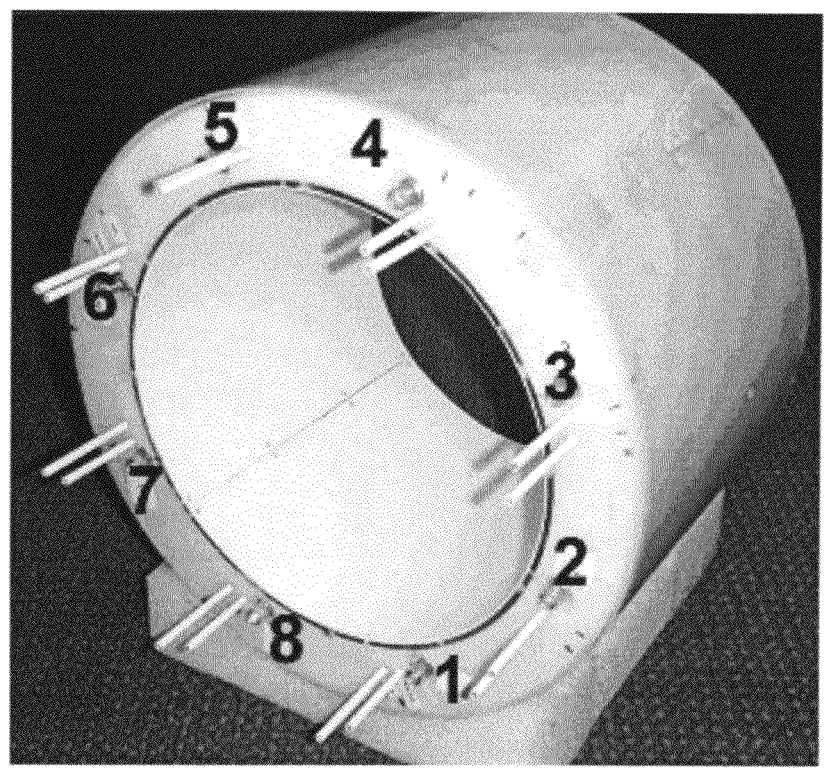
FIG. 13 shows an empirical test control formed as a non-split circular transceiver device of 8 RF coils deployed in a fixed circular geometry having a 25 cm diameter.

Empirically, it has been found that increasing the $d_i^{HS}$ for RF coils #4-#6 with the larger-sized elliptical top housing segments in the transceiver apparatus of FIG. 2A resulted in significant declines in the $B_1$ levels generated at a given input power level; and this effect is also seen in coils #2-#7 for the control circular device of FIG. 13, where the $d_i^{HS}$ ranges from 2 to 3 cm. However for RF coil #1 in the non-split, circular transceiver device shown by FIG. 13, the required $B_1$ is lower than any coil in the elliptical array transceiver, and has a $d_i^{HS}$~1.5 cm. This evidence and empirical result demonstrates and reveals that there is in fact an optimal spacing distance which exists between the surface of the human head (or the surface of another body part) and each of the RF coils of the array—i.e., an optimal spacing distance which will maximize the efficiency of transmission.

C. Given the existence of an optimal spacing distanced $d_i^{HS}$ as such, this parameter therefore theoretically defines and controls what the overall circumference "D" of the individual RF coil in the array should be. However, in reality and actual practice, there is a family of different RF coil sizes and alternative gap distances which can satisfy this parameter's requirements. Specifically, a RF coil of circumference "D" can be constructed from n coils such that $$D = \sum_{i=1}^{n} L_i^c \cdot S_i \text{ and } S_i = (L_i^c + G_i^c((n-1)/n))/L_i^c$$

where $L_i^c$ is the length of coil i in the circumferential direction, and $G_i^c$ is the size of the gap (distance in circumferential direction) between the ith and i+1th coil. This is clearly illustrated by FIG. 14.

As seen therein, the head is represented by the blue ellipse. The diameter of the elliptical coil (D) is displaced $d_i^{HS}$ cm from the edge of the head at each of the ith coil locations. The overall length of the ith coil (green) along the ellipse defined by D is $L_i^c$. The coils are separated from each other along D by $G_i^c$.

Accordingly, using a fixed overall RF coil diameter D, the choice of the coil length $L_i^c$ dictates what the gap distance $G_i^c$ can be for any given anatomic surface. For a fixed number of RF coils n (in this instance 8 discrete RF coils forming a single array), increasing the length $L_i^c$ extends the $B_1$ distribution, thereby providing greater coverage for any individual surface RF coil. However this outcome also results in a less efficient RF coil (i.e., one having a larger size) and in increased cancellation of the peripheral $B_1$ at the surface during simultaneous transmission. Moreover, very small coil lengths, $L_i^c$, result in insufficient coverage of the peripheral portions of the brain and may decrease overall efficiency of transmission in the center of the brain.

To facilitate the calculations, one assumes that all the RF coils in the array have equal lengths $L_i^c$ and have equal gap distances $G_i^c$, such that $L_i^c = D/8S_i$. Then, by optimizing $S_i$ for the value D (determined in the previous optimization) this will maximize the efficiency of the RF coil at the center of the brain while retaining adequate or superior $B_1$ homogeneity (<10% SD).

The overall homogeneity and efficiency at the center of the coil will thus vary depending upon the choice of amplitude and phase parameters. However, to maximize the efficiency in the center of the coil, the phases should be chosen so as to be perfectly constructive, $\eta=1.0$. Once the phases are specified, the amplitude coefficients can be optimized to maximize the homogeneity across the head.

D. Several caveats are also carefully noted here. As described above, one tacitly assumes that the optimal distance between the surface of the head and material face of the RF coils is independent of the overall size of the coils. Nevertheless, this is not true in fact; and in general, the actual optimal distance $d_i^{HS}$ is likely to vary with the true RF coil size. Thus, after obtaining an optimal value for $S_i$, one should again perform the optimization of $d_i^{HS}$.

Also, if there are significant gains with respect to transmit efficiency or overall homogeneity, one should then carry out additional rounds of optimization of both $d_i^{HS}$ and S until convergence is reached.

Finally, since the factors governing what is an optimal configuration for transmission (homogeneity and efficiency) and reception (sensitivity and coverage) are not equivalent, one should characterize both the transmission and reception fields.

VIII. THE GENERAL METHODOLOGY AND ITS APPLICATIONS

As noted previously herein, at least one identifiable array in the transceiver apparatus will act as both the means for transmission and for reception of magnetic resonance signals. The transceiver apparatus is also used to excite, refocus, saturate and generally manipulate magnetization so as to prepare it for detection and reception of such signals. Once suitably prepared, the signals arising from that magnetization are then detected by multiple RF coils in the array(s).

Accordingly, for clarity and ease of understanding, the following procedure broadly describes a typical series of steps which utilize the transceiver apparatus and its array(s) for these purposes.

1. Depending upon the anatomical region being imaged and the general size of the subject or sample, one or more individual sections of the transceiver apparatus—i.e., posterior housing segments—are positioned on the magnet bed.
2. The living subject or object (body part) is then positioned over or within these posterior housing segments.
3. The appropriate anterior housing segment(s) are then "mated" to the posterior housing segment(s) to erect the containment chamber. Choice of an appropriate section(s) is made based on achieving the target void volume so as to achieve a sufficiently high Qu/Ql ratio. Typically this choice is based on visual inspection of the size of the subject or object.

4. The individual RF coils deployed within each housing segment of the erected containment chamber are then tuned and matched if necessary. Depending upon the level of performance required for the specific measurement, sufficient tuning and matching of individual RF coils may be provided by the default or initial settings of each of the transceiver sections—in which case no additional tuning or matching is then necessary.
5. If higher levels of performance are required or desired, the tuning and matching of individual RF coils in the array can be optimized for each subject or sample. This is typically achieved by using one of two specific methods.
   A first method uses a device which applies a small amount of RF power to the coil and displays the reflected power as a function of frequency. Using this device, the operator minimizes the reflected power at the target frequency by adjusting the tuning and matching.
   As an alternative, a second method uses a device which displays the impedance of the coil as a function of frequency. The operator then adjusts the tuning and matching such that the impedance is 500 hm at the resonant frequency.
6. If the coil interface is integrated into the magnet bed, the coils are then connected to that interface and the magnet bed and patient is slid into the magnet. If the interface is a separate unit at the back of the magnet, the magnet bed and patient is then moved into the magnet bore and the coils are connected to the interface.
7. A set of rapid images are then typically acquired so as to verify proper positioning of the subject and to establish coordinates relative to the magnet frame of reference for future images. These initial images are typically acquired using a "default" set of phases and amplitudes for the RF pulses applied to the individual RF coils within the arrays. The default values can be determined empirically based on previous experience; or alternately be set to specific values based on hardware calibrations.
   One common default configuration based on hardware calibrations and uses equal power output (in Watts) applied to all coils in the array and a phase distribution where the phase applied to each coil (including the effects of cable lengths) is incremented by 360/n, where n is the number of coils that span the circumference of the array.
8. Depending upon the nature of the imaging study (including its goals and required RF homogeneity) and if multiple RF distributions or specialized waveforms (e.g. TRANSMIT SENSE) are required, maps of the phase and amplitude of the transmit $B_1$ field from each of the RF coils may be required.
   There are also a multitude of $B_1$ mapping methods and analysis methods, which will vary according to vendor specific applications.
9. After establishing the necessary values for both amplitude and phase for all waveforms to be used, the relevant images, spectroscopy data, or spectroscopic images are then acquired.
   The specific pulse sequences used to acquire these images are highly variable and depend entirely on the specific application, and include the underlying pathology to be evaluated, anatomical region, and vendor platform.
   However, within each pulse sequence are several common components, which include:
   a. Transmission of RF pulses through the transceiver apparatus to excite, refocus, or saturate an anatomical region or subset of molecules or portions of molecules within an anatomical region. During transmission, the individual coils within the array(s) are connected to an RF amplifier or amplifiers.
      Typically this connection is made through a transmit receive (T/R) switch. The T/R switch is part of the coil interface and alternately connects the individual coils in the transceiver apparatus to the RF amplifier(s) during transmission or the NMR receiver (including preamplifiers) during reception. RF pulses from the amplifiers are delivered with specific amplitude and phase relationships both within a given pulse applied to a specific coil and across different coils within the array(s) for different pulses within the pulse sequence.
   b. After suitable preparation of the signals for detection by application of RF pulse(s) and possibly gradient pulse(s), signals from the sample are then detected by the coils in the array(s). During this portion of the measurement, the state of the T/R switch is changed so as to connect the RF coils in the array(s) to the preamplifier(s). These signals are typically amplified by preamplifiers, and the amplified signal is filtered and digitized.
   c. The acquired digital signals are then mathematically manipulated (or reconstructed) using a variety of proprietary vendor specific algorithms based on the pulse sequence used to provide the data in an easily interpretable format. This data can the be presented in the form of images (MRI), or individual spectra for specific locations (MRS), or higher dimensional images—where each element in the image has a spectrum associated with it (MRSI).

VIII. THE SYSTEMS OF THE PRESENT INVENTION

In addition to the improved transceiver apparatus described above, the systems of the present invention will typically include the following:
   a spectrometer;
   a magnet able to generate a magnetic field strength ≥3 Tesla;
   a gradient system equipped with a set of $B_0$ shims;
   a plurality of fully independent transmit channels, RF amplifiers, and preamplifiers in communication with each of the discrete RF coils in the identifiable array(s); and
   an interface able to provide RF power to each of the discrete RF coils in the identifiable array(s) during transmission and to connect the each of the discrete RF coils to a preamplifier during reception.

In order to better appreciate the components and uses of these systems, as well as to demonstrate the broad range and variety of embodiments and applications encompassed by the subject matter as a whole comprising the present invention, a detailed description of five different exemplary systems is given below. It is clearly understood, however, that these exemplary systems are merely representative illustrations of what is envisioned and intended; and that none of these exemplary system descriptions either limit the diversity or restrict the scope of the present invention in any manner whatsoever.

A First Exemplary System

A first exemplary system is described here which is intended for imaging only the human skull and brain (rather than other body parts or the whole human body); and therefore, the descriptive details of this exemplary system's components and use parameters will accommodate and pertain to the human head alone. It will be expressly understood, therefore, that these system particulars, requirements and limitations do not pertain, nor will necessarily appear, in alternative system designs intended to image other anatomic parts of the human body or the entirety of the human body as such.

1. The Transceiver Apparatus

In this system, the transceiver apparatus comprises eight evenly spaced rectangular surface RF coils (of 9 cm length along the holder axis) which are positioned as a single identifiable array adjacent the interior surface geometry of a substantially cylindrical containment chamber—with a cross sectional area approximating an ellipse and which circumscribes the overall configuration and volume of the cavity space within the erected containment chamber at ~equal angular increments about the surface. FIGS. 2A and 2B show the erected containment chamber, while FIG. 9 presents a schematic illustration of the eight (8) individual surface RF coils constituting the array positioned upon the chamber's interior surface geometry. All the particulars for this embodiment of the transceiver apparatus have been previously described in detail herein.

In this embodiment of the transceiver apparatus, each surface RF coil (schematically illustrated by FIG. 3) is typically formed from copper tape (6.4 mm width); and has eight discrete capacitors (100C series, American Technical Ceramics, Huntington Station, N.Y.) distributed along the coil's length. All the RF coils in the array were individually tuned and matched using variable capacitors (Voltronics, Denville, N.J.). In this instance, the 8 RF coils are tuned and matched to a single frequency, the 1H frequency at 7 T, 298 MHz.

In addition, in order to prevent wave propagation on the protective shielding of the transceiver, a cable trap grounded to the shield was used. All adjacent coils were decoupled inductively using electrically insulated loops (~12 mm in diameter) connected in series with each surface coil.

Preliminary Assessments

Using a spherical phantom target (16 cm diameter, 90 mM NaCl) which was positioned ~2 cm away from the array of eight surface RF coils, an isolation of at least −16 dB was achieved between the adjacently positioned individual RF coils. This quantum of isolation between all the other surface RF coils was also consistently maintained.

After adjusting the RF coil isolations using the phantom target, the settings were then verified on living subjects (human heads) and adjusted if necessary. This in-vivo confirmation provided sufficient isolation between all the individual surface RF coils in the array both during transmission and reception; and for this reason, no preamplifier decoupling was utilized in the system at any time.

Deployment of the Single Array

In order to obtain better conformity to the shapes and sizes for the human head, the array was deployed in a circumferential or "elliptical" arrangement. In addition, in order to bring the side-positioned surface RF coils of the single array closer to the surface of the contained human head, two vertical straight pieces (having the width of one surface RF coil) were introduced between two half-cylindrical housing segments forming the erected containment chamber as a whole [see FIGS. 2A and 2B]. These two straight pieces were permanently connected to the bottom half-cylinder housing segment.

To improve patient access, the transceiver apparatus was split in two parts with the bottom housing segment (the posterior half-cylinder with two straight pieces attached) having five positioned and aligned RF coils adjacent the interior surface, while the top housing segment (the anterior half-cylinder) had three positioned and aligned RF coils adjacent its interior surface. Owing to inductive decoupling for each individual RF coil, no electrical connection between the two portions of the array was required.

To accommodate a range of different human head sizes and shapes, three different pre-shaped top (or anterior) housing segments were constructed, as illustrated by FIG. 2B. These alternative top housing segments allowed the height dimension (H) of the cavity space to be varied at will; and in particular, to be adjusted on-demand to 21 cm, or to 23 cm, or to 25 cm distances. In contrast, the width dimension for the cavity space was consistently maintained by all three differently shaped top housing segments at a measured 19.5 cm distance.

Also, all of the surface RF coils in the positioned single array had the same length along the axis of the main field (i.e., 9 cm). The individual surface RF coils disposed in the bottom (or posterior) housing segment in combination with the medium-sized top housing segment (and providing a 23 cm height) measured 9×7.4 cm with a gap between the individual RF coils of 1.3 cm. In comparison, those individual surface RF coils disposed within the smallest-sized top housing segment (providing a 21 cm height) measured 9×6.5 cm and had a 1.1 cm gap; while the largest-sized top housing segment ((providing a 25 cm height) measured 9×8.2 cm and had a 1.5 cm gap.

Lastly, in order to decrease radiation losses and improve performance, the entire RF coil array was shielded using a 50 μm polyamide film with a 5 μm copper layer (Sheldahl, Northfield, Minn.). The thickness of the copper layer is slightly larger than the skin depth at 298 MHz ($^1$H frequency at 7 T), which preserves the unloaded Q-factor while suppressing gradient eddy currents. The shield is located 4 cm away from the surface coils; and decreased radiation losses ($Q_U$ increased from 220 to 350) after placement.

2. Other System Components

In this exemplary first system, all data were acquired using a Varian Direct Drive system [Palo Alto, Calif.] and a head only (68 cm ID) actively shielded 7 T magnet. This system also utilizes a Magnex/Varian head gradient insert (50 mT/m, 250 μs rise times) equipped with a complete set of $2^{nd}$ and $3^{rd}$ order shims, with each of the shims being powered by 20 A [Resonance Research Inc, Billerica, Mass.].

For the pulsed transceiver apparatus, 8 fully independent transmit channels were used to drive eight 1 kW RF amplifiers [Communication Power Corporation, Hauppauge, N.Y.].

Figure 15A:
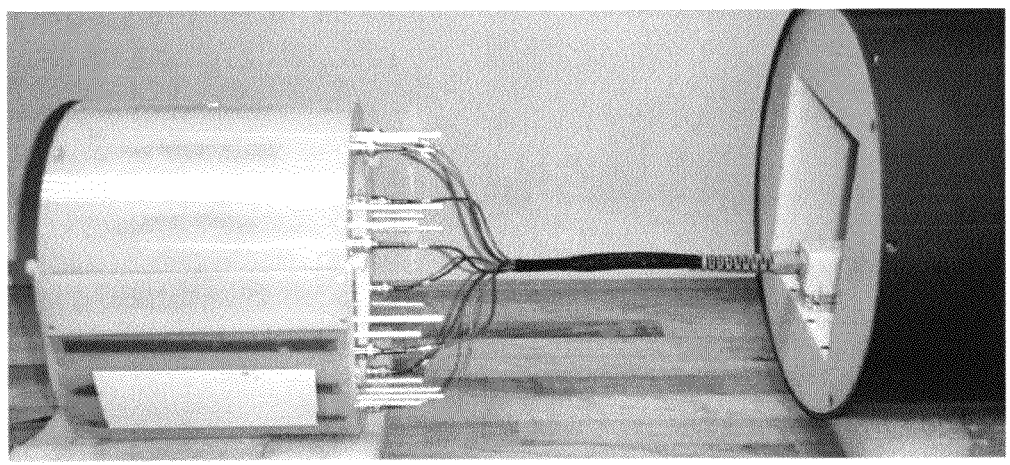
FIG. 15A shows an interface to provide RF power to each of the 8 surface coils constituting the deployed array during transmission and to connect the coils to preamplifiers during reception.

An interface was also constructed to provide RF power to each of the 8 surface coils constituting the deployed array during transmission and to connect the coils to preamplifiers during reception. The interface is illustrated by FIG. 15A; and contains 8 preamplifiers [Advanced Receiver Research, Burlington, Conn.] and 8 homebuilt single-pole double throw (SPDT) PIN diode switches each capable of handling 1 kW of RF. The SPDT switches were constructed using lump-element quarter wave length transformers and provide greater than 50 dB of isolation and less than 0.2 dB of insertion loss. A PIN diode driver was also constructed to provide 50-100 mA per diode. The interface is placed into the magnet bore in front of the transceiver apparatus (FIG. 15A) to minimize the cable length.

Figure 15B:
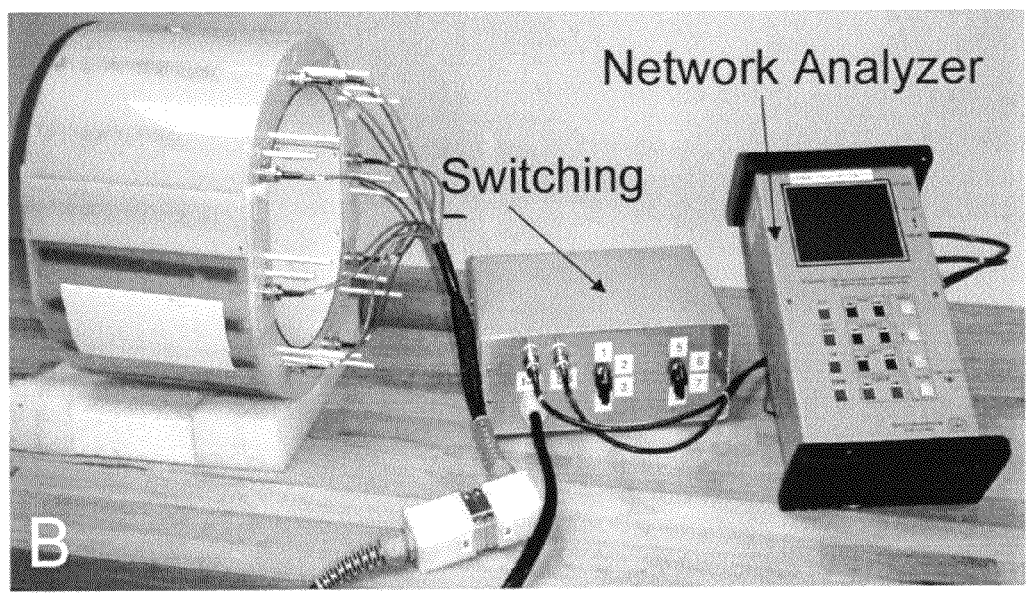
FIG. 15B shows a switching box used to simplify the array tuning and matching procedure.

To simplify the array tuning and matching procedure, a switching box was constructed, as illustrated by FIG. 15B [see Strupp J P, Auerbach E J, Gozubuyuk A, Adriany G, Ugurbil K and Van De Moortele P-F. Efficient tune and match with multiple transmit coils. In: Proceedings of the 16$^{th}$ annual meeting of ISMRM, Toronto, Canada, 2008, p 1135]. Connection of the deployed RF coil array to the interface or to the switching box is made using multi-cable connectors [ODU-USA, Camarillo, Calif.] and by combining all eight cables into a single connector.

3. $B_1$ Optimization for the System

To optimize the system, $B_1$ maps (phase and amplitude) of the individual coils (single coil transmitting) and of the entire array (all eight RF coils transmitting simultaneously) were acquired using a double excitation method [see Pan J W, Twieg D B, and Hetherington H P. Quantitative spectroscopic imaging of the human brain. Magn Reson Med 1998; 40:363-369].

For this optimization purpose, the $B_1$ maps used a target $B_1$ of 1 kHz and a nominal excitation pulse of 60°. The images were acquired at 64×64 resolution over a FOV of 192 mm using a 2 mm slice thickness. After selecting a target slice using default parameters (equal power with incremental 45° phase shifts), the $B_1$ of each coil was mapped with each coil transmitting separately (8 RF coils×0.5 s×64=256 s).

The $B_1$ generated at any given point within the sample from a set of j independent RF coils driven simultaneously can be expressed as $$B_{1(r)} = \sum_{j=1}^{n} a_j B_{1j(r)} \cdot \exp(-i(\phi_j(r) + \phi_{0j}))  \quad \text{[Equation 7]}$$

where the amplitude ($B_{1j}(r)$) and phase ($\phi_j(r)$) are both functions of spatial coordinates determined by coil geometry and loading conditions, and $a_j$ and $\phi_{0j}$ are amplitude scaling and phase parameters set by the user.

Since $\phi_{j(r)}$ and $B_{1j(r)}$ vary throughout the sample for each RF coil and $a_j$ and $\phi_{0j}$ are spatially invariant, the phase of the RF generated by each coil cannot be perfectly coherent over all regions of the sample simultaneously. Thus phase cancellation of the $B_1$ will occur in some regions, reducing the amplitude of the $B_1$ generated. The efficiency (fraction of $B_1$ generated divided by maximal $B_1$ if all coils were "in phase") is given by $$\eta(r) = \left| \sum_{j=1}^{n} a_j B_{1j(r)} \cdot \exp(-i(\phi_j(r) + \phi_{0j})) \right| \Big/ \sum_{j=1}^{n} a_j B_{1j(r)} \quad \text{[Equation 8]}$$

such that "perfect" constructive interference ($\eta(r)=1$) occurs at a given location when $\phi_j(r)+\phi_{0j}$ is equal for all coils. Thus RF shimming and $B_1$ optimization are achieved by varying $a_j$ and $\phi_{0j}$.

For this example, the RF phases for each RF coil, $\phi_{0j}$, were calculated to maximize the efficiency of the $B_1$ field over an elliptical ROI ($ROI_{Phase}$~60-80 mm) at the center of the brain, using the formula $\phi_{0j}\overline{\phi_j(ROI_{Phase})}=0$.

Using these phases, the amplitudes, $a_j$, were numerically optimized over a second ROI ($ROI_{Amp}$~120-160 mm) encompassing the majority of the brain within the slice using a least squares algorithm. A second $B_1$ map was then acquired with all coils transmitting simultaneously to verify achievement of the target performance.

4. Capabilities, Properties, and Advantages of the Exemplary System

To evidence the functional capabilities, advantages and benefits of the first exemplary system as a whole, a series of experiments were carefully performed and a variety of empirical data collected. A summary of these procedures and empirical results are provided below.

An Experimental Control Transceiver

Purely for experimentation purposes, as well as to demonstrate the advantages of the split elliptical symmetry for cavity space in the erected containment chamber of FIG. 2A, a non-split and circular-shaped (25 cm diameter) phased transceiver (shown by FIG. 13) also having one single deployed array comprised of eight individual surface RF coils (9×8 cm) of the same length was constructed and used as a test control device.

Inductive Decoupling of the Individual RF Coils in the Array

To evaluate the advantages of using alternative elliptical geometries for the cavity spaces in the improved pulsed transceiver apparatus, the performance of all four transceiver formats (i.e., the split elliptical transceiver with three alternatively sized top housing segments and a single bottom housing segment, and the non-split/circular transceiver control device) on two human subjects having differing head shapes and head sizes.

Human subject #1 (a female) was able to fit her head into the cavity spaces of all four transceiver formats. However, human subject #2 (a male) could not fit his head into the cavity space of the smallest sized transceiver apparatus (where the split top housing segment provided a height distance of only 21 cm).

Given this restriction, the effect of the RF coil size in the deployed array to the coupling between the individual surface RF coils for both human subjects was measured.

In the alternatively-sized elliptical transceiver embodiments, the five surface RF coils positioned on the posterior housing segment of the chamber (RF coils 1-3 and 7-8; FIG. 2A) were found to be relatively insensitive to changes in the size of the top housing segments, and were decoupled to below −20 dB for both test subjects.

This empirical result is consistent with the position of the back of the human head being fixed relative to the bottom portion of the elliptically-shaped array of coils. However, for the anteriorly positioned RF coils in the same single array (i.e., RF coils 4-6; FIG. 2A), the decoupling between adjacent individual RF coils varied substantially and depended upon the head size and loading. Table 1 below presents empirical values obtained for each of the three differently sized elliptical cavity space heights. In the worst instance, (the head of subject #1 in the largest sized top portion), decoupling decreased to −11.5 dB. A similar trend was observed for the circularly disposed array of the experimental control transceiver device.

TABLE 1

| Coupling | Subject #1 | | | Subject #2 | | |
|---|---|---|---|---|---|---|
| | Small Top | Medium Top | Large Top | Small Top | Medium Top | Large Top |
| $S_{45}$, dB | −20.5 | −16.5 | −13.5 | — | −18.5 | −14.5 |
| $S_{46}$, dB | −18.5 | −13.5 | −11.5 | — | −16.5 | −13.5 |
| $S_{56}$, dB | −18.0 | −14.0 | −13.0 | — | −17.0 | −15.0 |

Figure 16:
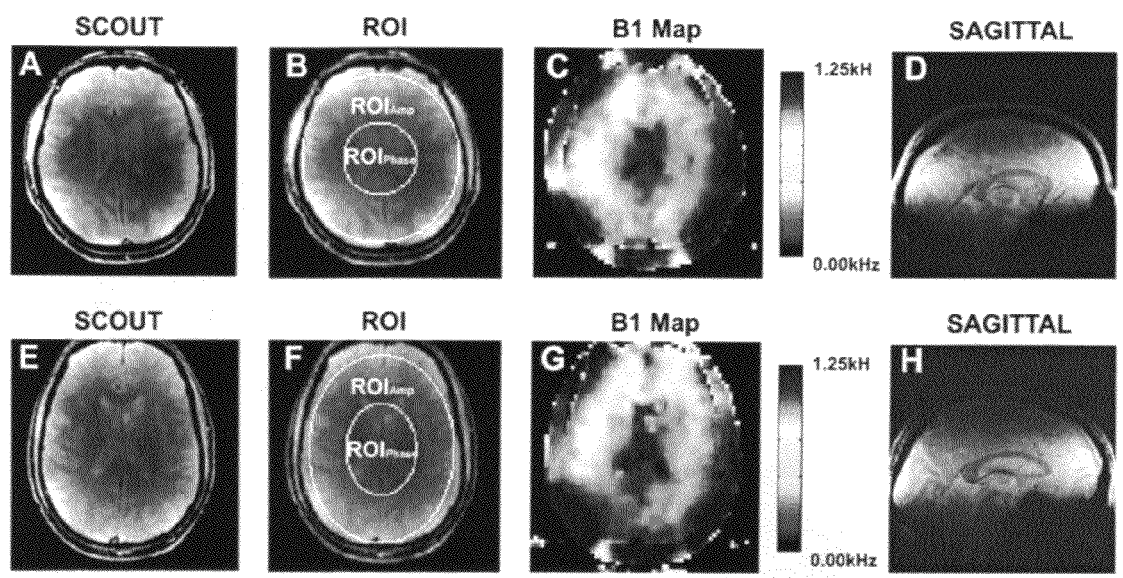
FIGS. 16A-16H show examples of axial images and $B_1$ maps acquired using the small-sized and medium-sized top portions in the containment chamber for living subjects.
Figure 17:
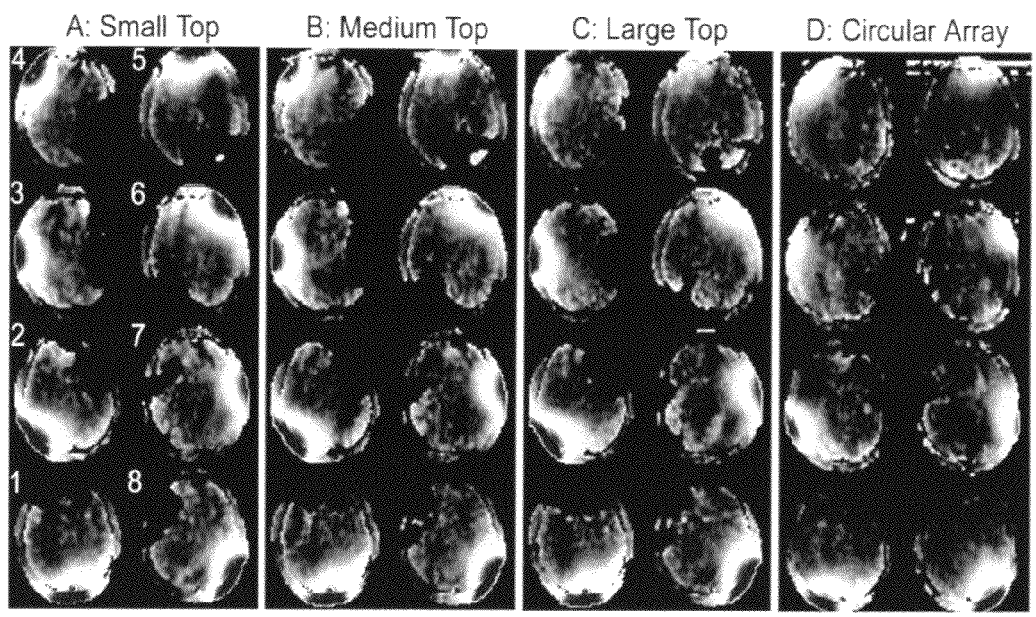
FIGS. 17A-17D show $B_1$ maps of individual surface coils obtained from an axial slice for a living human subject using the differently sized containment chamber formats, with equivalent power applied to all eight RF coils in the deployed array.

FIG. 16 shows examples of the axial images and $B_1$ maps acquired using the two arrays with the closest fit (i.e., the small-sized and medium-sized top portions in the containment chamber) for subject #1 and subject #2 respectively. Since the transmission performance and homogeneity will vary with the anatomic location of an axial slice of the brain (see details below), the transmission performance of the deployed RF coil array was measured for the same specific anatomic location.

Axial images and corresponding $B_1$ maps obtained after adjustment of the phases and amplitudes are illustrated by FIG. 16. For subject #1, these are FIGS. 16A-16C; and for subject #2, they are FIGS. 16E-16G. All of these were obtained using array combinations with the closest fit—i.e., the smallest-sized and medium-sized top segments, respectively, for the central slice (along the coil axis).

Sagittal images obtained for subject #1 and #2 are displayed by FIGS. 16D and 16H respectively. The images displayed by FIG. 16B and FIG. 16F show two ROIs. The smaller $ROI_{Phase}$ is used for RF phase optimization, while the larger elliptical $ROI_{Amp}$ is used to optimize the RF amplitude.

After RF shimming, the standard deviation (SD) of the $B_1$ field over $ROI_{Amp}$ varied from 9 to 13% for all four transceiver formats using both subjects (see Table 2 below). Thus, the achieved homogeneity is largely independent of the array configuration as used as long as sufficient decoupling between the individual coils is maintained.

TABLE 2

| Subject | | 1 | 2 |
|---|---|---|---|
| Small Semi-Elliptical Top | Power*, kW | 1.76 | — |
| | $B_1^\#$, uT/kW | 17.70 | — |
| | SD, % | 10.4 | — |
| | $\eta^\#$ | 0.62 ± 0.2 | — |
| Medium Semi-Elliptical Top | Power*, kW | 1.96 | 2.04 |
| | $B_1^\#$, uT/kW | 16.78 | 16.44 |
| | SD, % | 9.7 | 11.1 |
| | $\eta^\#$ | 0.66 ± 0.2 | 0.65 ± 0.19 |
| Large semi-Elliptical Top | Power*, kW | 2.26 | 2.42 |
| | $B_1^\#$, uT/kW | 15.62 | 15.10 |
| | SD, % | 10.0 | 11.3 |
| | $\eta^\#$ | 0.63 ± 0.19 | 0.63 ± 0.19 |
| Non-Split Circular Control | Power*, kW | 2.4 | 2.91 |
| | $B_1^\#$, uT/kW | 15.16 | 13.77 |
| | SD, % | 9.4 | 13.9 |
| | $\eta^\#$ | 0.72 ± 0.17 | 0.65 ± 0.19 |

Attention is also directed to FIGS. 16D and 16H which show sagittal images acquired along the intra-hemispheric fissure. Despite the relatively short length of the RF coil array (9 cm), the longitudinal coverage provided by a single array of eight individual RF coils is similar to that coverage obtained with a 17-cm long TEM volume coil.

In addition, although the $B_1$ homogeneity after RF shimming was similar for all of the tested transceiver format combinations, each individually required substantially different RF power to produce the same average $B_1$ value over $ROI_{Amp}$ (see Table 2 above). In particular, it is noted that the split top and bottom elliptical chambers where the RF coil array had the smallest gap distance and the closest fit to the surface of the human head for both test subjects required ~40% less power than the same eight RF coil array deployed within the cavity space of the non-split and circularly shaped control transceiver format.

5. Performance of Individual RF Coils

Origin of the Increased Power Requirements

To identify the origin of the increased power requirements when using the larger-sized top housing segments to erect the elliptically shaped transceiver chamber, an experiment was conducted which evaluated: (a) the performance of the individual surface coils ($B_1$ levels at 400 W input); and (b) the extent of phase cancellation of the individual coils during simultaneous transmission. The empirical results are illustrated by FIGS. 17A-17D as $B_1$ maps of individual surface coils obtained from an axial slice for subject #1 using the 4 different containment chamber formats, with equivalent power applied to all eight RF coils in the deployed array.

The evidence reveals that, for the RF coil arrays in the elliptically shaped containment chambers, minimal variations were seen in the $B_1$ distributions for the five lower surface coils (RF coils 1-3, 7 and 8) for all three different sized top housing segments, based on the invariance of their distance to the brain. However, for RF coils 4-6 of the array, increasing the height dimension of the cavity space, and thus concomitantly also increasing the measured gap distance to the human brain (illustrated by FIG. 14), results in decreased RF performance (lower $B_1$ values in the brain at a given power level).

Similarly, for the non-split and circularly shaped control transceiver format, where laterally disposed RF coils 2, 3, 6 and 7 are placed at a greater gap distance from the brain, the $B_1$ performance of these individual RF coils is also substantially lower.

Maintenance of Sufficient Decoupling Between RF Coils

It also became important to evaluate whether the decrease in the RF coils' performance could be explained by increases in reflected power due to mismatches in impedance produced when all eight RF coils in the array are driven simultaneously. It has been recently reported that transceivers with substantial inductive coupling between the individual coils can show up to 40% reflected power when all coils in the array are driven simultaneously. In order to evaluate this possible effect, an experiment used a 2.0 L spherical phantom and a variety of human head sizes.

After tuning and matching each RF coil individually, the reflected RF power was found to be −14.5 to −16 dB, which corresponds to less than 3.5%. No substantial change in the reflected power was observed when all eight RF coils in the array were driven simultaneously. In the worst case scenario (small head/large top combination) the level of reflected power changed from −14.5 dB to −14 dB (from 3.5% to 4%). This indicates that maintenance of sufficient decoupling between RF coils minimizes the reflected power during simultaneous transmission and virtually eliminates the potential effects.

Changes in Coil Loading

Figure 18:
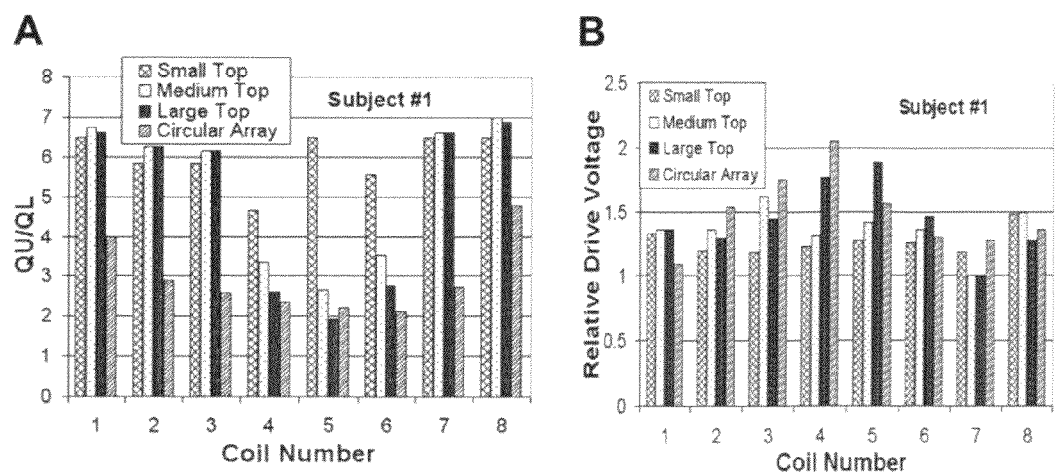
FIG. 18A is a table whose data displays the $Q_U/Q_L$ ratios for a living subject.
FIG. 18B is a table whose data displays the relative drive voltages (B) for a living subject.

In marked contrast, however, the observed decrease in the RF coils' performance correlates well with the observed changes in coil loading, as shown by the table data of FIG. 18. As shown therein, FIG. 18A displays the $Q_U/Q_L$ ratios for subject #1; and FIG. 18B displays the relative drive voltages (B) for subject #1.

Thus, as concerns subject #1, the $Q_U/Q_L$ ratio of the posterior coils in the elliptically deployed array (RF coils 1-3, 7, 8) were relatively independent of which size top housing segment was used to erect the elliptically-shaped containment chamber, each of these having $Q_U/Q_L$ ratios of 6 to 7. In contrast the $Q_U/Q_L$ ratios in the anteriorly positioned RF coils in the array (RF coils 4-6) were heavily dependent upon individual RF coil distance to the brain, with $Q_U/Q_L$ ratios decreasing to ~2 for the largest size top segment.

Lower $Q_U/Q_L$ values were also measured for the for the RF coils constituting the array in the non-split, circularly shaped control transceiver format, with a greater number of surface RF coils having a $Q_U/Q_L < 3$. Thus, reduction in the size of the coil and use of more anatomically conforming RF coils will result in a significant reduction in the required power to generate a given $B_1$ strength.

6. Performance Characteristics for Different Subjects and Across Different Brain Regions In order to determine the extent to which the three differently sized top housing segments can provide consistent performance across a broad range of volunteers, the data was pooled from 89 subjects (59 test patients and 30 control subjects) participating in clinical MRSI studies [conducted at Yale University using the 7 T system].

Since the homogeneity achievable and power required to achieve a given $B_1^+$ varies for different brain regions (owing to the intrinsic characteristics and geometry of the brain), the empirical data of three brain locations was pooled together and included: (i) a superior location, including slices in and around the motor strip and supplementary motor area (SMA); (ii) a more central location of brain slices located inferior to the SMA but superior to the temporal lobe [e.g., centrum semiovale and thalamus]; and (iii) an inferior location—a slice obliqued along the temporal pole.

Figure 19:
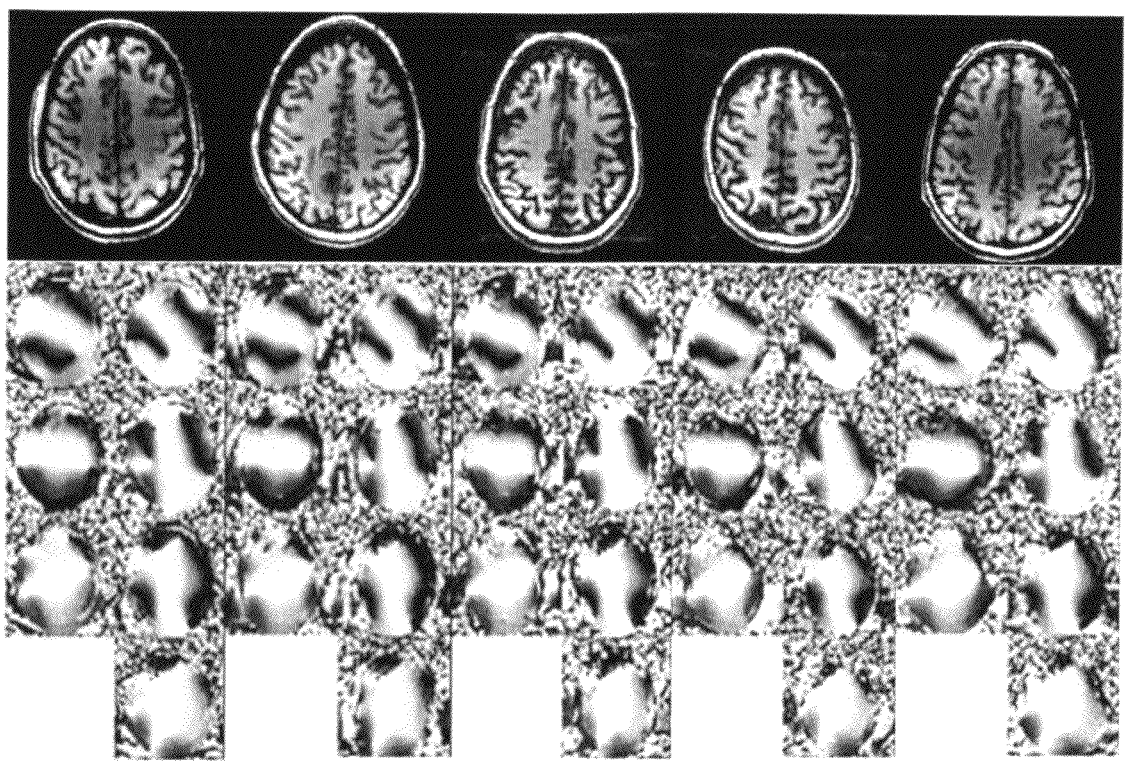
FIG. 19 shows Scout images and $B_1$ maps of phase and amplitude from the individual RF coils in the array prior to RF shimming, using the same default parameters from five different human subjects and the smallest-sized top housing segment in the containment chamber.

The results displayed by FIG. 19 are Scout images, and $B_1$ maps of phase and amplitude from the individual RF coils in the array prior to RF shimming, using the same default parameters from five different human subjects (from the superior location) using the smallest-sized top housing segment to erect the containment chamber. All images of FIG. 19 are presented using the same FOV; thus, the variation in human head size represents true biologic variability. It is noted that, despite the significant differences in head size and shape, the phase maps are remarkably similar—thereby indicating preservation of the decoupling between the individual RF coils in the deployed array.

In addition, the information presented by Tables 3-5 below present the efficiency and homogeneity data acquired for the 89 subjects described above. By providing three spatial configurations in the Anterior-Posterior direction, a closer and more optimal spacing between the head and the individual coils is possible, thereby preserving sensitivity and decreasing variability in loading. The decrease in variability in loading allows the inductive decoupling between individual RF coils in the deployed array to be maintained (>18 dB) across differently sized and shaped human heads. This capability insures that the RF coils of the array are well decoupled and preserve their independent $B_1^+$ distributions and decoupling for SNR purposes.

As a consequence, for a given brain location, the overall homogeneity (see Table 4) is nearly identical for the differently sized top housing segments in the erected containment chamber. The homogeneity is dependent upon the selected brain location, with greater inhomogeneity occurring from more caudal slices. Also, the μT generated at 1 kW declines with increasing RF coil size for the same brain location; however, the variation (SD) across subjects within a given RF coil array for the same brain location is small, varying between 3-15%, most typically is ~10%.

Inspection of the information given by Table 3 also reveals that the efficiency, μT@1 kW, decreases as the selected brain location is advanced in the caudal direction. However the same trend is also seen in conventional volume coils and is a general property of the human head at high field. The decreased efficiency and homogeneity seen for the temporal location is partially due to RF coil length. Nevertheless, the performance across the entire range and variety of human subjects is very predictable and reproducible.

TABLE 3 uT @ 1 kW

| Coil Size | n | Motor&SMA Mean | SD | n | CSO&Thal Mean | SD | n | Temporal Mean | SD |
|---|---|---|---|---|---|---|---|---|---|
| Small | 9 | 17.95 | 0.59 | 9 | 16.81 | 1.71 | 2 | 14.62 | 0.17 |
| Medium | 10 | 15.86 | 1.45 | 33 | 14.27 | 1.23 | 12 | 13.58 | 0.98 |
| Large | 0 | | | 6 | 13.02 | 1.91 | 8 | 11.73 | 0.98 |

TABLE 4

% SD of B1 Field Over the Slice

| Coil Size | n | Motor&SMA Mean | SD | n | CSO&Thal Mean | SD | n | Temporal Mean | SD |
|---|---|---|---|---|---|---|---|---|---|
| Small | 9 | 8.41 | 1.93 | 9 | 10.19 | 1.42 | 2 | 18.89 | 1.77 |
| Medium | 10 | 9.23 | 2.25 | 33 | 11.40 | 2.45 | 12 | 18.54 | 2.51 |
| Large | 0 | | | 6 | 11.23 | 1.54 | 8 | 18.21 | 1.43 |

TABLE 5

| | kW to achieve 1 kHz | | | | | | | |
|---|---|---|---|---|---|---|---|---|
| | Motor&SMA | | | CSO&Thal | | | Temporal | |
| Coil Size | n | kW | SD power | n | kW | SD power | n | kW | SD power |
| Small | 9 | 1.73 | 0.24 | 9 | 2.01 | 0.42 | 2 | 2.58 | 0.06 |
| Medium | 10 | 2.24 | 0.38 | 33 | 2.77 | 0.47 | 12 | 3.03 | 0.44 |
| Large | 0 | | | 6 | 3.42 | 0.94 | 8 | 4.08 | 0.71 |

A Second Exemplary System

1. The CRC Coil Geometry in the Array

The first exemplary system described above provides a demonstration of how the transceiver array can be constructed and utilized to provide a homogeneous RF field across the human head. This second example will demonstrate how alternative geometries for the coils in the transceiver array can be utilized to create different spatial distributions of the $B_1$ field. Different spatial distributions, such as narrow rings of excitation about the periphery of the object can be useful for localization of signals to different regions.

The ability to create a $B_1$ field distribution which excites a narrow band about the periphery of the brain (i.e. including skeletal muscle, skin and bone marrow within the skull) without the use of magnetic field gradients requires a rapid decrease of the summed $B_1$ fields of the individual coils as they penetrate into the brain. Therefore, the use of an alternate coil geometry (one which has a more rapid rate of decay of $B_1$ with distance away from the coil) to suppress unwanted signals in one layer combined with preservation of the conventional coils for excitation of the desired signals in another layer is a significant benefit.

A preferred alternate coil design is a counter rotating current (CRC) coil described in detail previously herein and illustrated by FIGS. 4 and 5 respectively. As shown therein, the CRC structure is formed by two concentric loops in series (stacked vertically) in which the current flows in opposite directions in each coil. Displayed in FIG. 5 is a single array appearing as a single row of 8 individual CRC coils. Also, FIG. 6 displays the $B_1$ maps (amplitude and phase) acquired using the CRC array in the transceiver directed at a live human head.

This particular 7 T CRC array and transceiver apparatus has a much more rapid decay of the $B_1$ field into the head in comparison to the conventional single turn surface coil transceiver, despite a similar $B_1$ amplitude at the periphery of the head. In this example, all other system components used in the previous example are used in this example with the exception that the 8 element transceiver array uses CRC coils as opposed to surface coils.

2. Acquired Images

Figure 20:
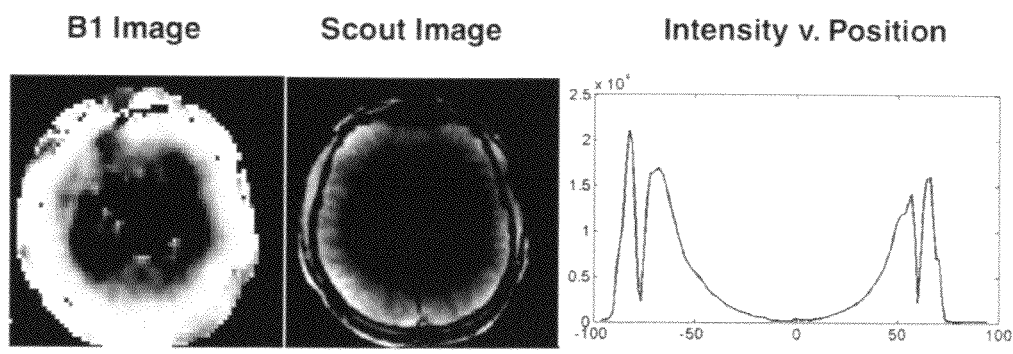
FIG. 20 is an image acquired using one exemplary system and a transceiver apparatus having an array comprising 8 CRC coils.

An image acquired using this exemplary system and a transceiver apparatus having an array comprising 8 CRC coils in series is shown by FIG. 20. Although some excitation penetrates into the brain, the $B_1$ profile over the surface of the head is moderately homogeneous; and inspection of a plot of intensity versus position from a row through the center of the image, reveals a true null at the center. This system thus allows suppression pulses to be targeted to the periphery of the head, with minimal unwanted effects on the center of the living brain.

3. An Alternative Multiple Array Construction

A multiple array transceiver apparatus can be constructed which comprises two or more separately identifiable arrays for circumscribing the human body, with each identifiable array containing at least 6 independent coils in series. This allows a single apparatus to provide multiple spatial distributions simultaneously, depending upon which set of individual coils is used at any point in time. For simplicity and ease of understanding, only two arrays are deployed as separate discrete layers of coils—i.e., an inner array layer and an outer array layer—are described herein.

The inner array layer in this representative transceiver embodiment is a set of eight surface RF coils similar to those illustrated by FIG. 9 which employs inductive decoupling loops between each of the adjacently located surface coils. In comparison, although the outer array layer also comprises a series of 8 individual RF coils, each of these is a CRC coil similar to those illustrated by FIGS. 4 and 5; and which also have inductive decoupling loops joined to and lying between each of the adjacently located CRC coils.

Figure 21:
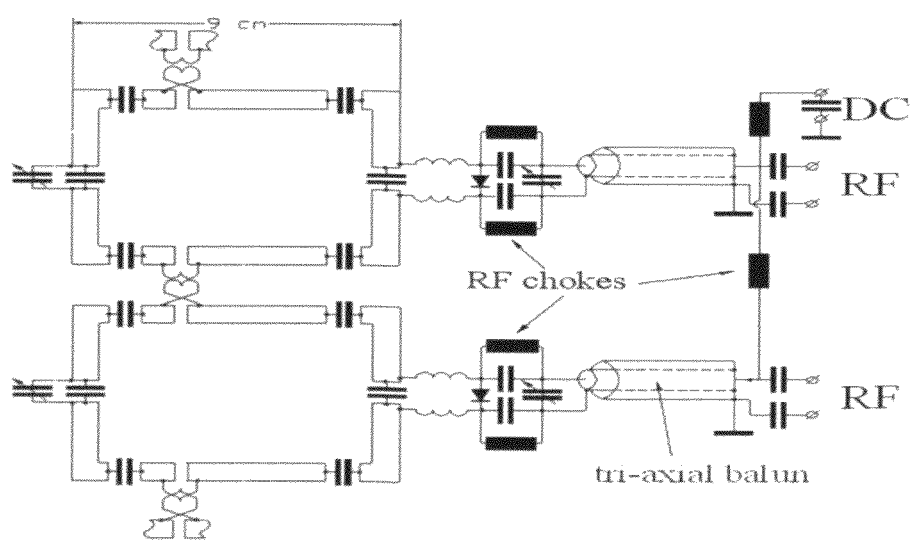
FIG. 21 is a schematic illustration of two individual RF surface coils present in the inner array layer (formed of 8 surface RF coils) which shows the distributed capacitance, inductive decoupling and active detuning circuits.

FIG. 21 presents a schematic of two individual RF surface coils present in the inner array layer (formed of 8 surface RF coils in series); and shows the distributed capacitance, inductive decoupling and active detuning circuits. Again for simplicity, only two of the surface RF coils are shown by FIG. 21 as they appear within the inner array layer (of 8 surface RF coils).

In addition, please note that the relative penetration of the $B_1$ field into the sample by the second array layer (formed of 8 CRC coils in series) can be modulated by the separation distance between the two loops forming each CRC coil and the phase of the applied RF pulses. To a first approximation, the closer the two loops of each CRC coil in the outer array layer are brought together, the greater the degree of cancellation of the $B_1$ fields and decreased penetration. Inductive decoupling between each of the identifiable array layers can be used to allow both arrays to be used simultaneously for excitation or reception.

In conformity with the requirements of the present invention, each of the two identifiable array layers is typically split into two portions in order to provide easy patient access into the transceiver apparatus (see FIG. 1B), as well as to maintain an optimal $Q_U/Q_L$ ratio for the shaped cavity space of the erected containment chamber.

Alternatively, if concurrent transmission and reception from each array layer is not required (i.e. each array layer is used only for specific pulses in the sequence), the multiple coils residing in different array layers can also be decoupled from each other using active detuning. For active detuning each surface coil will include a resonant tank circuit formed of a capacitor, two small inductors, and a PIN diode, driven by DC voltage applied through the RF cable. Using this configuration, noise injection due to DC wires is eliminated by directly connecting to the coils.

A Third Exemplary System

1. A Multiple Row Transceiver Array

Recent developments in transceivers has demonstrated their capability to provide relatively homogeneous axial $B_1$ fields (perpendicular to the axis of the magnet bore or the transverse plane) with significantly reduced total required power. However, due to properties of the human head, extending the $B_1$ fields longitudinally (i.e., along the magnet bore in the head to toe direction i.e. the Z direction) has proven more difficult. Simply extending the length of the detector in the Z direction provides only moderate improvements in the spatial extent of the $B_1$ field, while significantly reducing both transmit and reception efficiency.

The goal of this exemplary system and application is to demonstrate (given adequate decoupling as previously demonstrated herein) how a transceiver apparatus having an arbitrary number of identifiable arrays deployed in the longitudinal direction (i.e. multiple bands or rows) can be constructed. To demonstrate the advantages of such a construction capable of increasing spatial extent of the $B_1$ field and transmission performance, a two row set of arrays are used. In this instance, the number of discrete RF channels for transmission and reception is increased to 16 (2 rows×8 coils per row) while all other components of the system remain unchanged from the previous two system examples.

2. Rationale for Using Multiple Arrays Arranged in Rows

To date, most transceivers employ a single band or row of RF coils. However, despite improved $B_1$ homogeneity in the transverse plane, such transceivers are limited by the spatial extent of the $B_1$ field over the brain in the longitudinal (head-to-toe) direction. While the longitudinal extent of the $B_1$ field of the transceiver array is typically controlled by its length—unfortunately, the spatial extent of the $B_1$ field along this axis is attenuated because of high field RF-tissue interactions. This effect has also been seen in volume head coils at 7 T. Lengthening the individual elements of the transceiver array also decreases the transmission and reception efficiency for brain regions within the center of the structure.

As a result of these complexities for transceivers, the use of an actively detunable volume transmit coil in combination with a receive only surface coil remains popular—despite their poor transmit performance of the volume transmit coil. Receive only phased arrays achieve high sensitivity and coverage by using multiple small receiver coils arranged around and along the length of the head. Unfortunately preamplifier decoupling, which is commonly used for receive only arrays, cannot be used for decoupling during transmission.

However, if sufficient decoupling between all coils within and across different rows can be achieved by other means, multiple rows of arrays can be used. Such an arrangement would improve receive sensitivity (a larger number of smaller sized RF coils); and could significantly improve transmit homogeneity and coverage. Finally, total power deposition can be reduced in those instances where only a subset of the total number of coils is used for transmission purposes.

Figure 22:
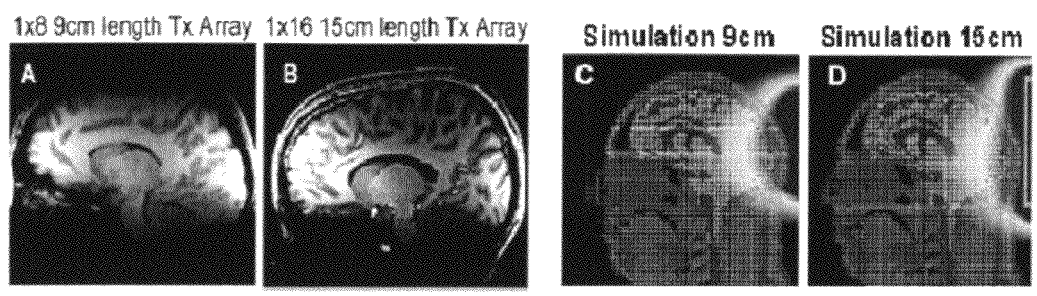
FIGS. 22A-22D show the effect of increased coil length and the intensity distribution of the RF fields generated thereby.

3. The Effect of Coil Length and the Intensity Distribution of RF Fields Generated The effect of increased coil length and the intensity distribution of the $B_1$ fields generated thereby is illustrated by FIGS. 22A-22D respectively. FIGS. 22A and 22B displays sagittal images using two different transceivers. The first transceiver apparatus comprises a single array of eight inductively decoupled surface coils wherein each coil is 9 cm in length. The second transceiver device has a single arrangement of 16 transmission line elements, where each transmission line element in the arrangement is 15 cm in length. Despite the substantially longer coil length (67%), there is only a minimal increase in spatial coverage in the Z (head to toe) direction for the 15 cm transmission line arrangement.

This effect can also be seen in numerical simulation of the transmission fields of a single RF coil as shown in FIGS. 22C and 22D respectively. In this instance, there is only a minor improvement in extent of the $B_1$ field in the Z direction for the 15 cm element arrangement in comparison to the 9 cm coil array. Despite the minor increase in spatial extent of the $B_1$ field in the Z direction, the overall intensity of the RF field decreases by ~40% (the red color represents a stronger RF field, while the green color is a weaker RF field). This effect is also seen in TEM volume coils at 7 T, and is due to the interaction of the RF field with the living tissue.

4. A 16 Coil Multiple Array Construction

To improve longitudinal coverage, a 16 coil multiple array arrangement (each array having 8 coils per array and 2 arrays disposed in the Z axis) can be used for concurrent transmission and reception purposes. This transceiver arrangement employs two separately identifiable arrays in combination, illustrated by FIGS. 23A-23C respectively.

Figure 23:
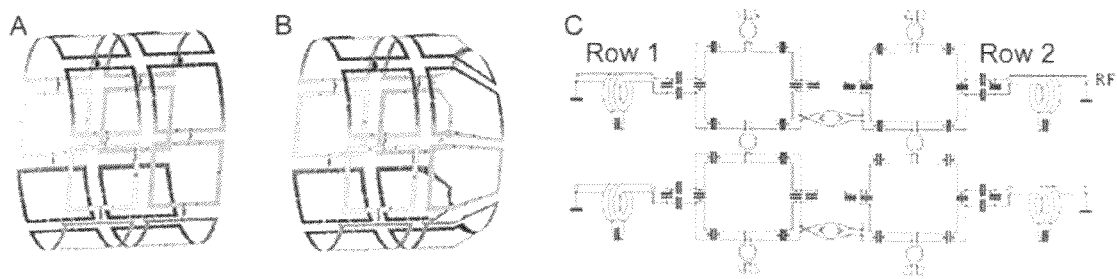
FIGS. 23A-23C show a transceiver arrangement which employs two separately identifiable arrays in combination.

As shown therein, FIG. 23A is a representation of two 8 coil arrays of uniform and equivalent diameter; while FIG. 23B is a representation of two 8 coil arrays where one of the arrays is conical or tapered with respect to the other array. FIG. 23C shows a diagramed section of the coil circuit having two array rows and at least 2 coils in each array row. Note also the presence of the inductive decoupling loops between the coils both within the same row and across rows in the circuit diagram of FIG. 23C.

To eliminate mutual coupling, inductive decoupling can be used in a manner similar to that for a single array of 8 coils. In this instance, the inductive decoupling network is extended to include coils across two different rows of coils (see the circuit diagram of FIG. 23C). If necessary, depending upon overall size and shape) additional inductive decoupling between coils positioned diagonally relative to each other (adjacent angular positions across two rows) can be utilized.

To improve performance, the top array of coils (shown as row 2 in FIG. 23C) can be tapered such that the more superior aspect of the coil has a smaller cross sectional area than the more posterior aspect (for the middle of the head), as appears in FIG. 23B. However, there is a tradeoff between improved proximity to the tissue and some loss in efficiency due to the lack of orthogonality with respect to the Z axis of the magnet.

Figure 24:
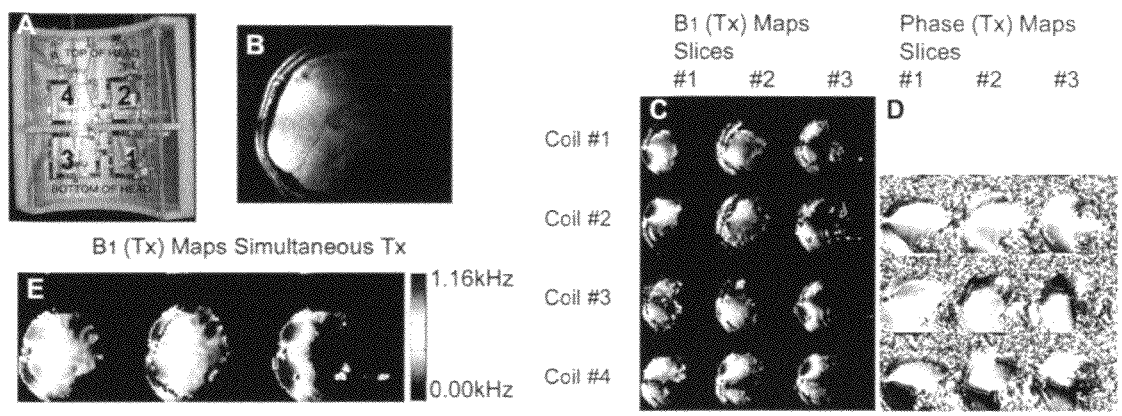
FIGS. 24A-24E show a part of a multiple array structure as 4 discrete coils arranged in 2 array rows of two coils each.

Attention is also directed to FIG. 24A which displays a part of the multiple array structure as 4 discrete coils (arranged in 2 array rows of two coils each). Use of the inductive decoupling yielded an isolation of 18-25 dB between all the coils. In this instance, each coil is 7 cm in width (similar to the 8 coil single array described previously); is also 7 cm in length; and has a 1 cm gap between the two rows. The capabilities of this multiple array structure are shown by FIGS. 24B-24E.

Figure 25:
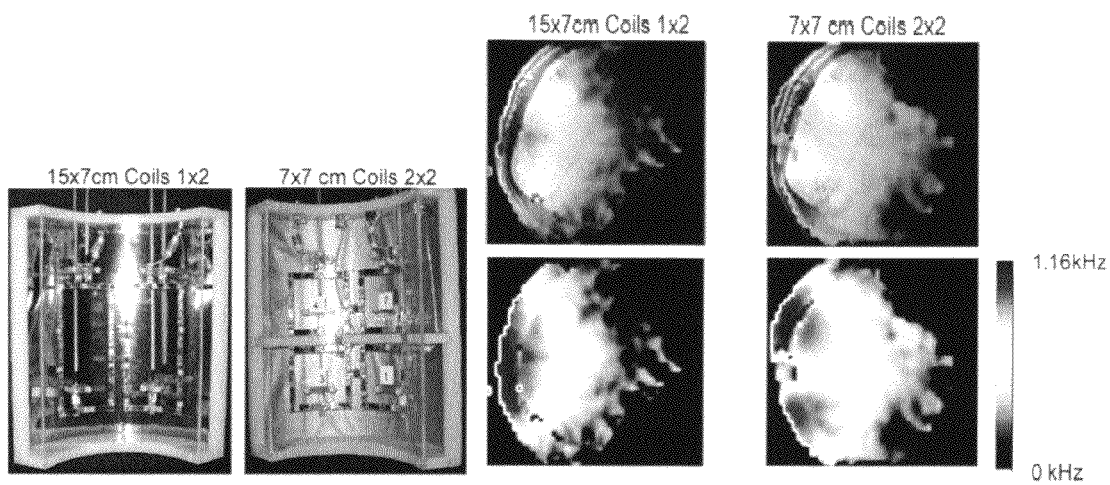
FIG. 25 shows a comparison of the 4 discrete coils multiple array structure with a single row of two coils design of equivalent overall length.

A comparison of the 4 discrete coil multiple array structure was then made with a single row of two coils design of equivalent overall length, 15 cm (2×7 cm+1 cm). The results of this comparison are illustrated by FIG. 25 as a whole. As seen therein, the 4 coil multiple array construction has both improved longitudinal extent of the $B_1$ field and far greater efficiency (higher $B_1$ field values) for equivalent total power.

In addition, although not explicitly demonstrated, the signal-to-noise ratio (SNR) for the 4 discrete coil multiple array structure is also enhanced relative to the 2 coil single array construct, owing to the use of smaller sized coils.

Figure 26A:
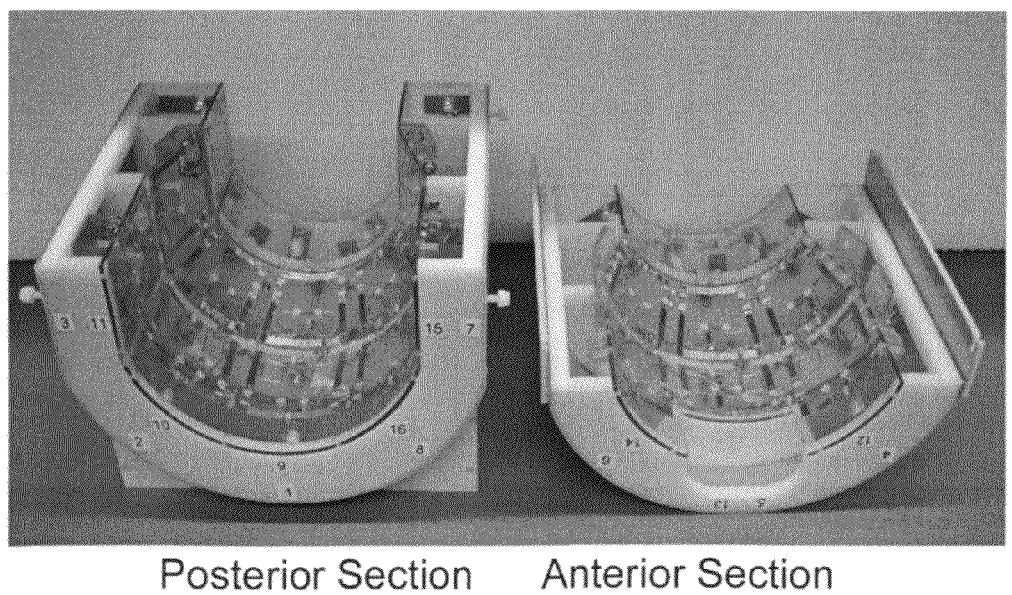
FIGS. 26A and 26B show a preferred array arrangement which is suitable for imaging the human head.
Figure 26B:
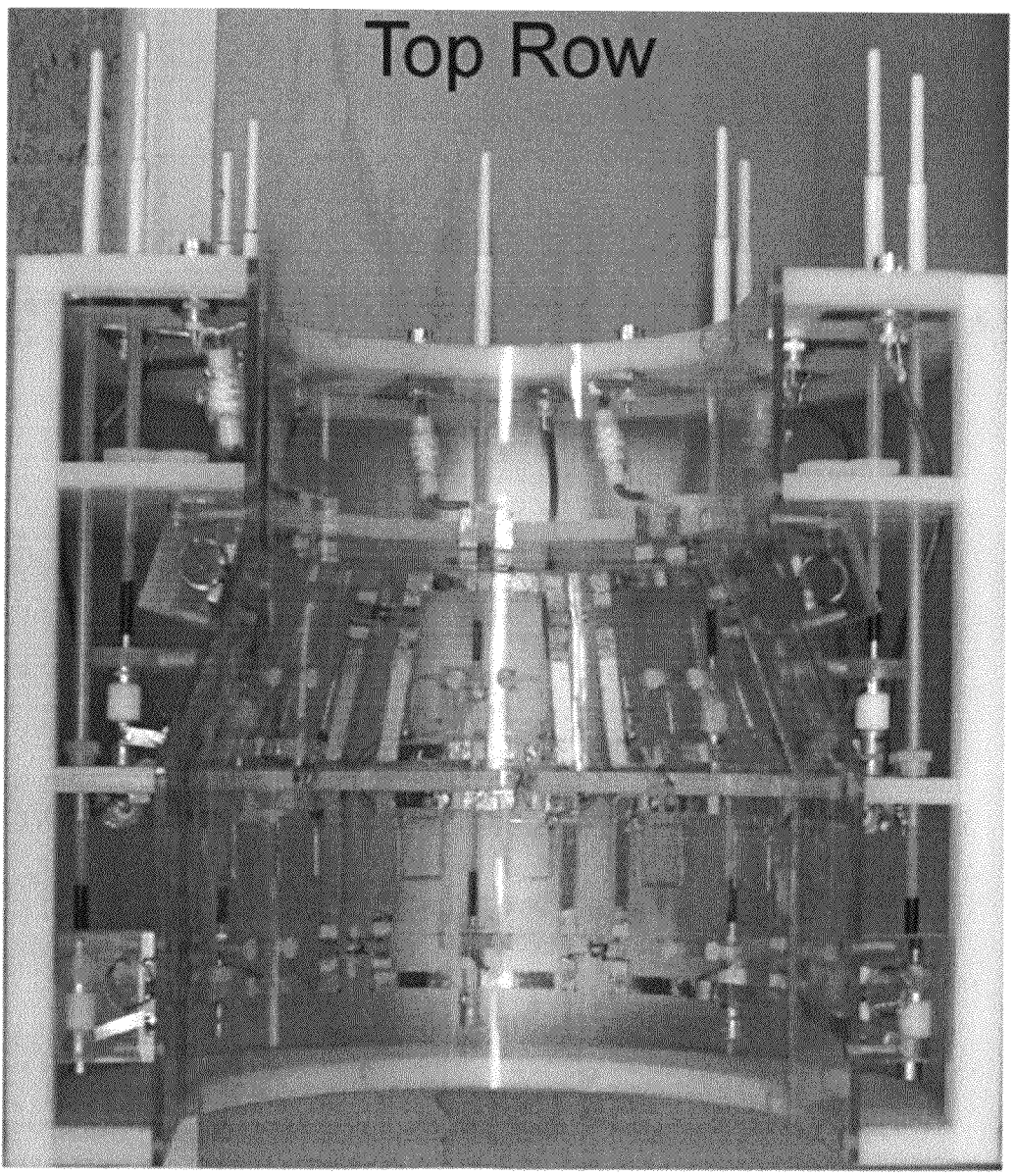

FIG. 26A displays a working version of the 16 coil transceiver apparatus depicted in the schematic of FIG. 23B. The transceiver apparatus has two sections, with 10 RF coils (5 from each array row) in the posterior section and 6 RF coils (3 from each array row) in the anterior section. FIG. 26B displays a top-down view of the anterior section highlighting the tapered profile of the RF coils in the top array row. The individual RF coils measured 7 cm in length, with a 1 cm gap between the arrays.

FIGS. 27A-C display $B_1$ maps acquired using only the top array of RF coils (FIG. 27A), only the bottom row of RF coils (FIG. 27B) or both rows simultaneously (FIG. 27C). When used simultaneously, the two arrays provide a highly homogeneous RF field over the entire cerebrum. FIGS. 27D-F display T1 weighted images acquire using only the top row of RF coils (FIG. 27D), only the bottom row of RF coils (FIG. 27E) and both array rows simultaneously (FIG. 27F). Simultaneous transmission from array rows simultaneously allows the tissue contrast and anatomical detail to be obtained from the entire cerebrum in the slice.

Figure 27:
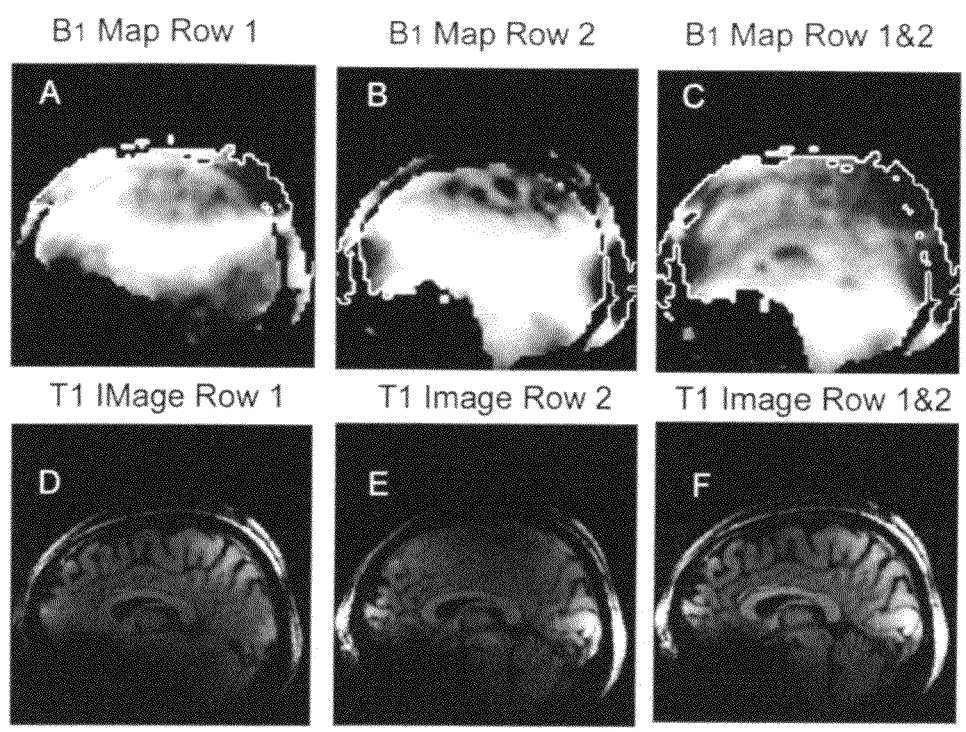
FIGS. 27A-27F display $B_1$ maps and T1 weighted images acquired using the preferred array arrangement of FIG. 26.

In addition, the evidence of FIGS. 25 and 27 as a whole demonstrates three important results:

(1) Longitudinal coverage can be improved by the use of multiple rows in the Z direction despite the same size of outer physical dimensions;

(2) RF pulses and signals from each identifiable array in the multiple array construction can be combined constructively to achieve efficient excitation and reception; and (3) Overall transmission efficiency is improved.

A Fourth Exemplary System

1. A Double Resonance Transceiver Apparatus

To provide anatomical landmarks for interpretation of X-nuclei ($^{31}$P, $^{13}$C etc), spectroscopic images high-resolution $^1$H anatomical images are also required. Furthermore, to eliminate uncertainties associated with either repositioning the patient or the RF coil, the RF coil must also resonate at both $^1$H and X nucleus frequencies.

Double-resonant volume head coils, based on both birdcage (BC) and transverse electromagnetic designs have been conventionally described. Nevertheless, based upon our knowledge to date, no instance of double-tuned RF coil phased arrays are known or have been reported. This type of arrangement, however, is substantially more complicated than the single-tuned array since all the individual RF coils in series must be tuned and decoupled at both resonance frequencies (transmission and reception) at the same time.

The present invention achieves its results by either using a single coil operating at both frequencies simultaneously; or by using two separate RF coils in close proximity, each operating at a single frequency. In this system example, the data presented below was acquired from a 16 RF coil array comprised of a single row of eight separate tandem paired units of RF coils (2 RF coils in tandem forming each unit). The inner RF coil of each pair is tuned to the $^{31}$P resonance frequency at 7 T (121 MHz), and the outer RF coil of each tandem unit is tuned to the $^1$H frequency (298 MHz).

In this exemplary system, eight 1 kW broad band amplifiers (120-300 MHz operating range) and eight broad band transmit and receive channels were used. The RF interface consisted of 16 SPDT switches (8 switches for 1H coils and 8 switches for $^{31}$P coils). All other system components including the magnet, gradient set and spectrometer remain the same as used in previous examples.

2. Decoupling the Tandem Paired RF Coils

To minimize the interaction between the $^1$H and $^{31}$P coils in each tandem pair unit, inductive traps as described previously herein were used. One functional unit of the double-tuned ($^{31}$P/$^1$H) phased array formed of two tandem surface coils is shown in schematically in FIG. 10. The values of the trap inductances ($L_1$) were optimized independently for each coil. Also since the number of traps is limited to one, the losses associated with the traps are further minimized.

The performance, $E_{low}$, for the low frequency RF coil can be estimated using Equation 4 [presented above] and can be improved by further minimizing $L_1^{low}$. The performance of the high frequency coil, $E_{high}$ value can be evaluated using Equation 6 above. Taking into account that $R_T=R_1/(1-\omega_0^2/(\omega_1^2)$, where $R_1$ is resistance associated with the $L_1$, $\omega_0$ is the $^1$H resonance frequency, and $\omega_1$ is the $^{31}$P resonance frequency we obtain $$E_{high}=[(1+R_S/R_L)/(1+R_S/R_L+L_1^{high}/5L)]^{1/2} \quad \text{[Equation 9]}$$

Using $R_S/R_L=1.5$, L=200 nH (inductance of 8×9 cm² coil) and $L_1^{high}=110$ nH ($^{31}$P resonance with $C_1=10$ pF), one obtains $E_{high}=0.98$. Thus 98% of the efficiency is maintained. Thus using this approach the performance of the each of the two coils can be optimized, improving the performance of the functional unit at both resonance frequencies. In this example the low and high frequency coils in the transceiver array can be arranged into two layers as shown in FIG. 10. Decoupling between the coils within a given layer is provided by inductive decoupling as previously described.

3. A 16 RF Coil, Double Resonant Array Suitable for Brain Imaging

Figure 28:
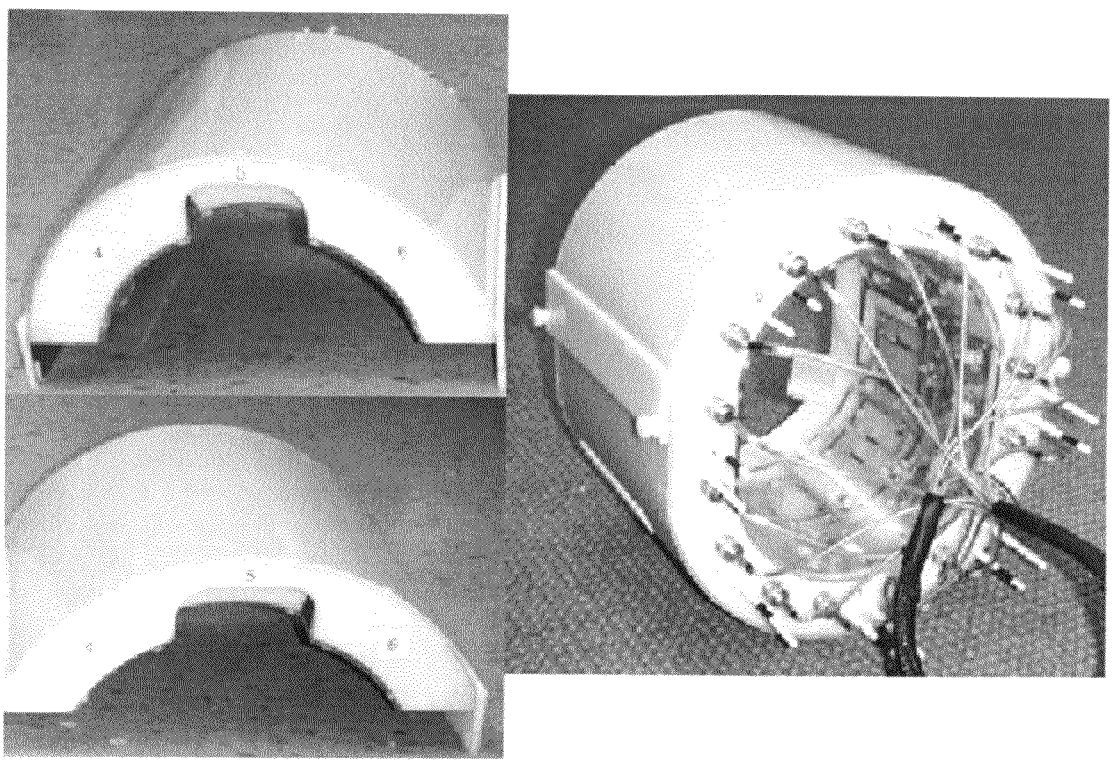
FIG. 28 displays a working embodiment of a preferred array arrangement formed as two concentric layers of evenly spaced rectangular surface coils which circumscribe the head (eight RF coils in each array layer) separated by 1 cm distance.

FIG. 28 displays a working version of a preferred array arrangement which is suitable for imaging the human head. The preferred array arrangement is formed as two concentric layers of evenly spaced rectangular surface coils which circumscribe the head (eight RF coils in each array layer) separated by 1 cm, with the inner array layer resonating at lower $^{31}$P frequency. The $^{31}$P and $^1$H arrays measured 10 and 9 cm in length, respectively.

All the adjacent surface coils are decoupled inductively. To decouple $^{31}$P- and $^1$H-components of the array, multiple $^{31}$P and $^1$H resonant traps were introduced into the surface coils in series. This format arrangement also uses double-tuned cable traps to suppress shield currents at both frequencies. To decrease radiation losses, the dual array format was shielded.

As seen in FIGS. 12 and 28, each of the dual arrays (eight RF coils in each array layer) is individually split in two sections, with the bottom section having 10 surface coils (5 coils for each frequency) and the top portion having six surface coils (3 coils for each frequency). Due to inductive decoupling, no electrical connection between the different sections of the array was required.

To accommodate a range of different head sizes, two different housing segment tops were built which (when combined with the bottom housing segments as shown by FIG. 28) allowed the deployed array's height to be varied at will from 21 to 23 cm. The width of the arrays measured 19.5 cm consistently regardless of which top segment was used.

This dual array arrangement of 16 surface coils was compared with a single, doubled tuned $^{31}$P/$^1$H, TEM volume coil ($^1$H length—13 cm, $^{31}$P length—16 cm, ID—25 cm). The inner layer of eight surface coils is tuned to 121 MHz ($^{31}$P frequency at 7 T) and the outer layer of eight surface coils is tuned to 298 MHz ($^1$H frequency at 7 T). Inductive decoupling between adjacent coils within a layer is used for both array layers and inductive traps are used between array layers to minimize interactions between the aligned coils.

3. Acquired Images and Spectra

For purposes of making an empirical test comparison, a single double tuned TEM volume coil having a 25 cm diameter, resonant at 121, and 298 MHz was built. The single, double tuned, TEM volume coil used twelve 13 cm long transmission line elements for $^1$H and 12 16 cm length transmission line elements for $^{31}$P.

Data was then acquired from a healthy control subject using both the single double tuned TEM volume coil with the larger top (23 cm) and the double resonant transceiver surface coil array shown in FIG. 28.

For $^1$H transmission, the 16 RF surface coil array transceiver achieved 1.00±0.16 kHz of $B_1$ at a summed power of 3.37 kW over an axial slice at the center of the coil (through the ventricles). In comparison, the single double tuned TEM coil required 6.41 kW to achieve 1.00±0.25 kHz at the same location. For $^{31}$P transmission, the 16 RF surface coil array transceiver and the single double tuned volume TEM coil achieved a mean $B_1$ over the head of 488 Hz at 1.75 kW and 1.94 kW respectively.

Figure 29:
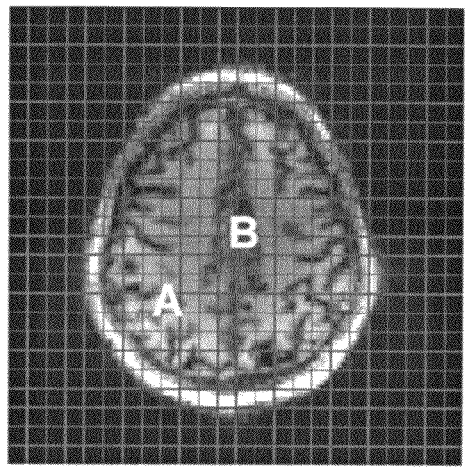
FIG. 29 shows a scout image acquired from peripherally located and centrally located voxels acquired using TEM coils and the preferred array of FIG. 28.
Figure 30:
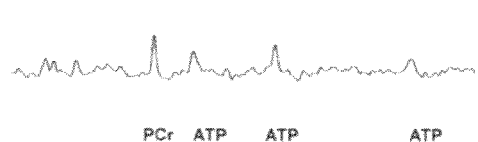
FIG. 30 shows spectra acquired from peripherally located and centrally located voxels acquired using TEM coils and the preferred array of FIG. 28.
Figure 30:
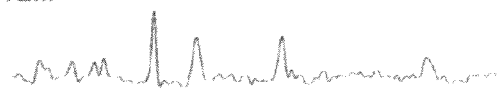
Figure 30:
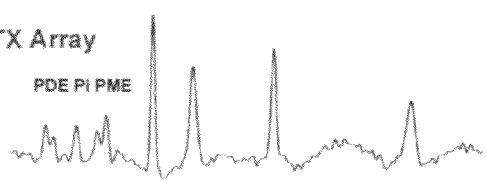
Figure 30:
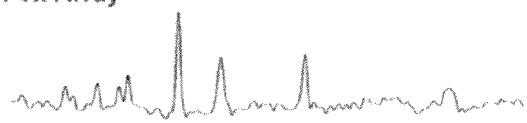

FIG. 29 displays a scout image and FIG. 30 displays spectra from peripherally located (left side "A") and centrally located (right side "B") located voxels acquired with the TEM and array. The spectra presented in FIG. 30 are plotted on the same vertical scale with identical processing. For $^{31}$P reception, the double tuned surface coil array achieved up to a factor of 4 increase in SNR over the TEM volume coil over the periphery of the brain, and 20% higher SNR from central brain regions.

Thus in summary, the double resonance 16 RF surface coil array transceiver apparatus empirically demonstrated the following properties:
1) It decreases the required power to achieve a given $^1$H $B_1$ field value by 90% in comparison to a double tuned TEM volume coil;
2) It decreases the $B_1$ inhomogeneity (standard deviation) of the $^1$H $B_1$ field by 56% in comparison to a double tuned TEM volume coil;
3) It decreases the required power to achieve a given $^{31}$P $B_1$ field value by 11% in comparison to a double tuned TEM volume coil; and
4) It increases the $^{31}$P signal to noise ratio by a factor of 4 for peripheral brain locations and 20% for central brain locations.

A Fifth Exemplary System

1. Alternative RF Distributions

The application described above by the second exemplary system also demonstrates how alternate coil geometries can provide different spatial distributions of RF. This unique capability is due to the high degree of decoupling afforded by this transceiver design in which the individual RF coils within the deployed array are independent of one another, such that their combined effects can be determined in advance as a simple linear combination of their phase and amplitudes profiles. Via this technique, different spatial RF distributions can be prepared in advance and be obtained on-demand by controlling the phase and amplitude of the RF generated by each coil within the array. This capability provides a novel and unforeseen method and technique which has many useful applications in-vivo.

For instance, in many MRSI applications, it is often useful to suppress signals from skin, bone marrow and tissues outside of the organ of interest. Thus for example, in MRSI studies of the human brain, a suppression of signals from the skin, muscle and bone marrow within the skull removes artifacts associated with these tissues from appearing in brain spectra which originate from the periphery of the brain.

Accordingly, the following describes a generally useful method by which a single transceiver apparatus can be used to suppress these unwanted components using different RF distributions within the same acquisition.

2. The Suppression Method as a Whole

Overall, the method is used for viewing an unsuppressed and adjusted image of at least one targeted anatomic locale within a living subject, said method comprising the steps of:
choosing at least one anatomic site in a living subject as a localized target for imaging;
providing an imaging system which includes a transceiver apparatus capable of transmitting RF pulses and receiving RF signals at specified frequencies for superior in-vivo imaging of at least a part of the anatomic systems, organs and tissues then existing within the body of a living subject, wherein said transceiver apparatus comprises
(i) an erectable on-demand containment chamber able to generate and maintain radiofrequency pulses for spectroscopy, spectroscopic imaging, and resonance imaging, said containment chamber being comprised of
a structured housing formed of at least two pre-shaped housing segments, each of which can be substituted at will to provide alternative dimensions, adjustable exterior and interior surface geometries, and at least one open end, and
a shaped cavity space having modifiable dimensions and configuration, and an open end suitable for insertion and containment of at least that part of a living subject's body intended for examination, and
(ii) at least one identifiable array comprised of not less than six discrete RF coils which are individually aligned in a preselected orientation and collectively positioned in a pre-chosen pattern adjacent the interior surface geometry of at least one pre-shaped housing segment in the erected containment chamber;
causing said at least some of said discrete RF coils in said identifiable array of said transceiver apparatus to transmit a RF pulse at a pre-selected frequency in order to excite nuclei in different anatomic sections of the targeted locale in the living subject;
employing at least some of said discrete RF coils in said identifiable array of said transceiver apparatus to detect and receive RF signals emanating from nuclei at different anatomic sites of the targeted locale in the living subject as a consequence of their excitation;
adjusting the orientation of nuclei at different anatomic sites in the living subject so as to suppress their contributions to the RF signals detected by the transceiver apparatus in accordance with pre-set signal suppression parameters; and utilizing the signals arising from unsuppressed nuclei to generate a viewable image of the targeted anatomic locale within the living subject.

3. Rationale Supporting the Suppression Technique

MRSI of the human head typically requires suppression of signals from extracerebral tissues. Conventionally, this is achieved by selectively exciting or refocusing only those spatial regions which are to be observed or selectively saturating signals and then eliminating their ability to contribute signal from spatial regions from which signal is not desired.

These techniques achieve spatial specificity by the use of frequency selective RF pulses applied in a spatially varying magnetic field gradient, such that different spatial regions have different frequencies. With increasing magnetic field strength (e.g., 7 T) the frequency differences between different chemical species increases linearly with field strength. The frequency differences intrinsic to different chemical species is indistinguishable from the frequency differences arising from different spatial locations due to magnetic field gradients. Thus during the application of a spatially varying magnetic field gradient, different chemical species appear to originate from different spatial locations, causing artifacts in the acquired data. For this reason, the ability to selective excite, refocus or saturate a given spatial region without the use of frequency selective pulses in conjunction with spatially varying magnetic field gradients would eliminate this artifact and therefore be of significant benefit.

In this instance, the application of this method uses the array format and arrangement described above in the first exemplary system (8 surface RF coils in series) and also employs identical system components.

4. Generating a Ring Shaped Spatial Distribution of $B_1$ Field

For suppression of unwanted signals emanating from tissue around the periphery of the targeted object, ideally, the generated $B_1$ field preferably is constrained to form a "ring" about the periphery of the targeted anatomic locale, in this instance the human head. This $B_1$ field constraint has a target region for excitation which is identified as $ROI_{Outer}^{Ring}$ (the region between the two ellipses), as is illustrated by FIG. 31.

Figure 31:
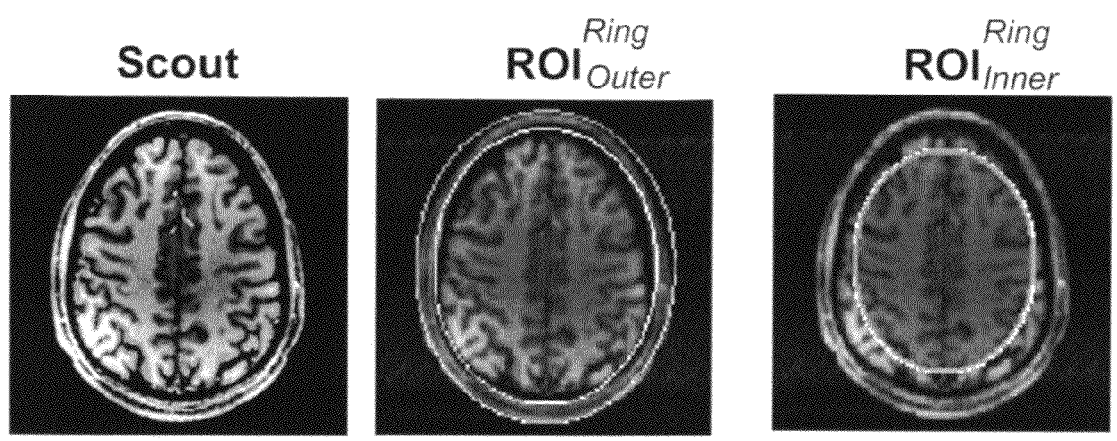
FIG. 31 shows a generated $B_1$ field which is constrained to form a "ring" about the periphery of the targeted human head.

Similarly, a region $ROI_{Inner}^{Ring}$ can be identified where signal should not be perturbed, i.e. where there is no $B_1$ field—i.e., $B_1(ROI_{Inner}^{Ring}) \sim 0$, and is also shown by FIG. 31. Since the $B_1$ field from any individual coil at the center of the brain, $ROI_{Inner}^{Ring}$ be non-zero, the net $B_1$ field from all coils over $ROI_{Inner}^{Ring}$ can only be cancelled if the phases of the applied RF are selected to result in destructive interference.

For example, for locations $r' \in ROI_{Inner}^{Ring}$ where the applied $B_1$ amplitudes generated by two coils k and l are similar, $a_k B_{1k}(r') \sim a_l B_{1l}(r')$, cancellation of the $B_1$ field, $\eta(r') \sim 0$, is obtained for $$(\phi_k(r')+\phi_{0k})-(\phi_l(r')+\phi_{0l})=\Delta\phi_{Ring}, \Delta\phi_{Ring}=\pi \quad \text{[Equation 10]}$$

Since the transceiver arrays use at least six RF coils (n=8 in this application), as long as the individual $B_1$ amplitudes are similar and the phases $\phi_j(ROI_{Inner}^{Ring})+\phi_{0j}$ are distributed over at least $2\pi$ radians, cancellation of the entire $B_1$ field [i.e., $\eta(ROI_{Inner}^{Ring}) \sim 0$, from Equation 8], will also generally occur. Thus, $B_1$ distributions with minimal net excitation (low $\eta$) over central brain regions can be generated when the RF is applied with $$\phi_{0j}=-\phi_j(ROI_{Phase}^{Homog})+(j-1)\Delta\phi_{Ring}, \Delta\phi_{Ring}=2m\pi/n,$$
$$m=1,2,\ldots n-1 \quad \text{[Equation 11]}$$

Note that $\Delta\phi_{Ring}=0$ was used in previous examples to generate a homogeneous $B_1$ field.

At locations immediately adjacent to each RF coil ($r'' \in ROI_{Outer}^{Ring}$), the net $B_1$ field is largely dominated by the closest coil, such that $B_{1closest}(r'')>>B_{1j}(r'')$ j≠closest and $$|B_1(r'')| = \left|\sum_{j=1}^{n} a_j B_{1j}(r'') \cdot \exp(-i(\phi_j(r'')+\Phi_{0j}))\right| \sim a_{closest} B_{1closest}(r'') \quad \text{[Equation 12]}$$

Under this condition, the phase of the applied RF has minimal effect on the $B_1(r'')$. This allows the phases $\phi_{0j}=-\phi_j(ROI_{Phase}^{Homolog})+(j-1)\Delta\phi_{Ring}$, used to generate the null over $ROI_{Inner}^{Ring}$ to be retained unmodified, while the coefficients $a_1$ are used to optimize the $B_1$ over $ROI_{Outer}^{Ring}$. In reality, these are idealized approximations and the coefficients $a_j$ and $\Delta\phi_{Ring}$ do affect $\eta(r)$ and $B_1(r)$ over both $ROI_{Outer}^{Ring}$ and $ROI_{Inner}^{Ring}$.

5. Controlling the Shape and Size of the Ring Distribution

Figure 32:
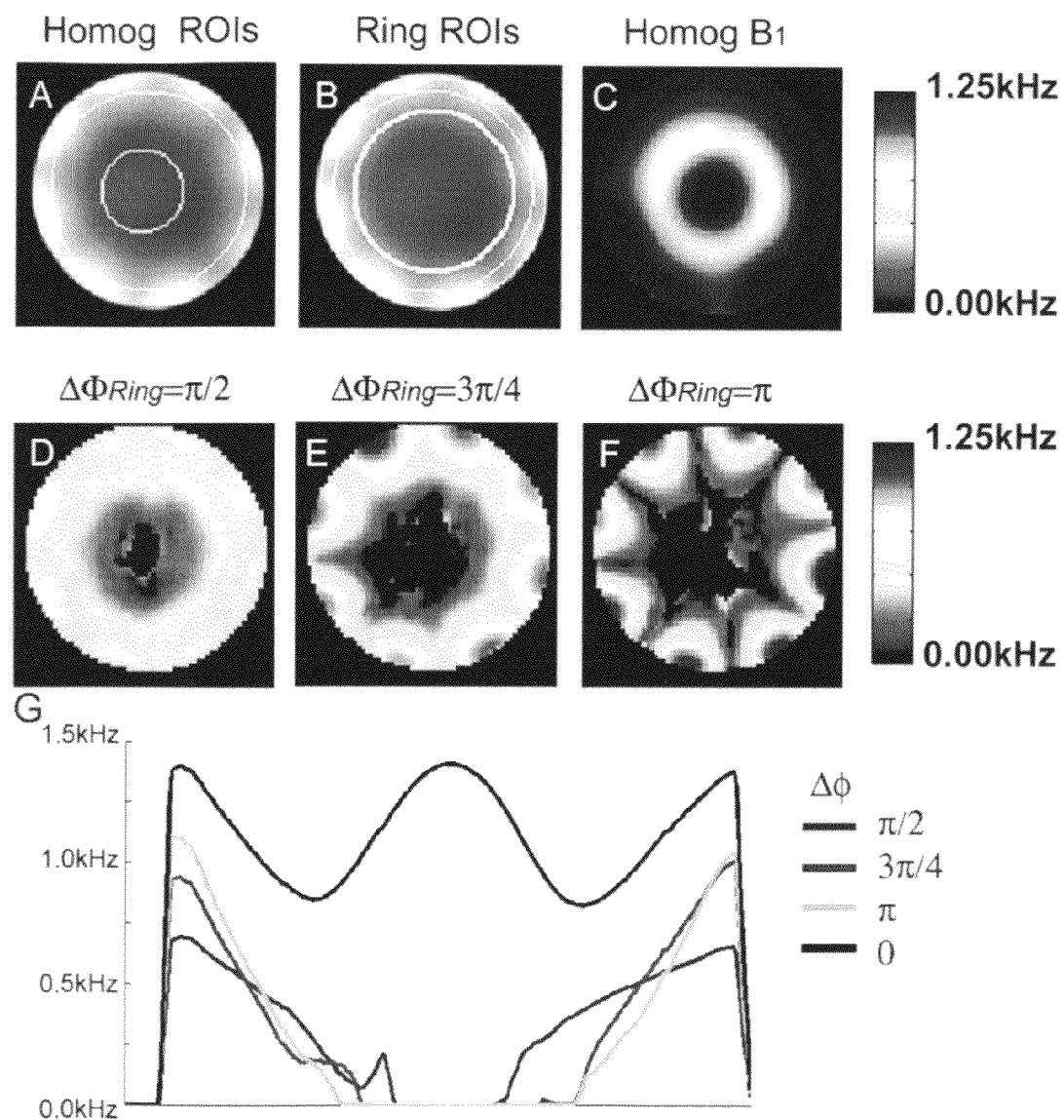
FIGS. 32A-32G show empirical data acquired from a spherical phantom target at 7 T (using fixed phase increments per coil) which demonstrate that a ring distribution is generated.

To assess the extent that the ring distribution could be generated, empirical data was acquired from a spherical phantom target at 7 T using fixed phase increments per coil. The results are shown by FIG. 32.

In this instance, the phases and amplitudes of the applied RF pulses applied to each RF coil in the array were optimized as described for the homogeneous distribution (FIG. 32A) and the ring distribution (FIG. 32B). FIG. 32C displays the result of optimizing the homogeneous distribution over the target.

For FIGS. 32D-32F, the $\Delta\phi_{Ring}$ was set to $\pi/2$, $3\pi/4$, and $\pi$ respectively; and the amplitudes to the eight RF coils were optimized using the target $B_1$s.

Displayed in FIG. 32G are line plots from a column through the center of the phantom. With increasing incremental phase shift $\Delta\phi_{Ring}$, the width of the ring distribution decreasing providing greater selectivity to the periphery of the object. Notably the applied power used to drive the ring distribution with $\Delta\phi_{Ring}=3\pi/4$ at 1 kHz is ~60% lower than that required to drive the homogeneous distribution. This improved efficiency is due to greater constructive interference of the summed RF over the peripheral region of the object (i.e. closer to the RF coils themselves).

Figure 33:
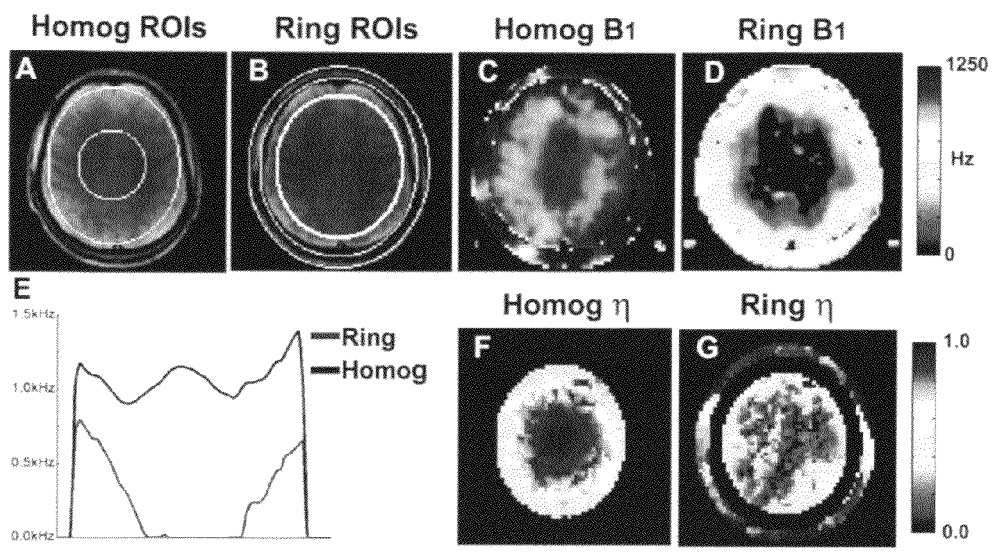
FIGS. 33A-33F show displays the target ROIs, and the acquired $B_1$ maps, and the calculated relative efficiency maps n obtained from an adult female volunteer.

FIG. 33 displays the target ROIs (via FIGS. 33A and 33B), and the acquired $B_1$ maps (FIGS. 33C and 33D), and calculated relative efficiency maps $\eta$ (FIGS. 33F and 33G) from an adult female volunteer. FIG. 33E displays line plots of the $B_1$ from FIGS. 33C and 33D respectively. The ring distribution achieved a mean $B_1$ value of 1 kHz over the target ROI at a power level of 613 W. This remains more than a factor of 3 lower than the homogeneous distribution.

As seen from FIGS. 33F and 33G, the efficiency for the ring distribution is much higher peripherally than the homogeneous distribution.

6. In-Vivo Application of a Ring Distribution to Suppress Unwanted Signals

To demonstrate the performance of this technique, an in-vivo experiment was conducted and empirical data was acquired with and without the use of the ring $B_1$ distribution to eliminate unwanted signals from the periphery of the head (i.e., outside of the brain). Unwanted signals from these regions can be suppressed by using either (i) a spatially selective excitation pulse applied to the target region, followed by gradient dephasing (randomization of the phase of the excited magnetization); or (ii) by spatially selective inversion pulses, followed by appropriate delays.

In the following in-vivo example, the inversion pulse method was utilized. The spatially selective inversion pulse converts the initial magnetization of resonances within $ROI_{Outer}^{Ring}$ from +Iz to −Iz. During the relaxation periods, the magnetization of these signals grows from −Iz towards +Iz according to their individual longitudinal relaxation rate (T1). The delays are chosen such that for a broad range of T1 values, at the conclusion of all pulses and delays the longitudinal magnetization is ~0.

Signals arising from regions outside of $ROI_{Outer}^{Ring}$, I, e, $ROI_{Inner}^{Ring}$, will not have been inverted and their magnetization will remain along +Iz.

The remainder of the procedure then creates observable magnetization (a signal which can be measured), proportional to the longitudinal magnetization (Iz). Thus signals from regions within $ROI_{Outer}^{Ring}$ (Iz~0) will contribute no signal while regions outside of $ROI_{Outer}^{Ring}$, i.e. $ROI_{Inner}^{Ring}$ (Iz=1) will contribute full signal.

Figure 34:
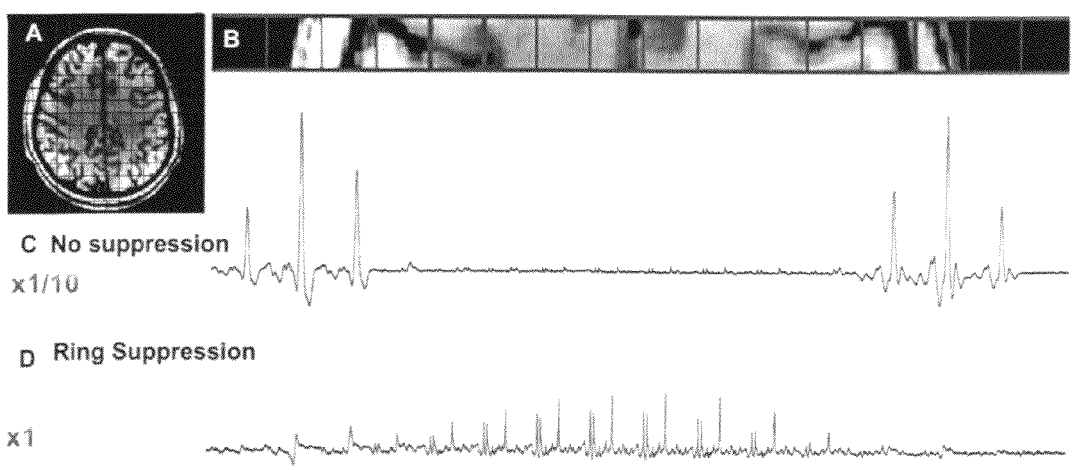
FIGS. 34A-34D show MRSI data acquired with and without the inversions pulses using a ring distribution.

Displayed in FIG. 34 are data acquired with and without the inversions pulses using the ring distribution ($\Delta\phi_{Ring}=3\pi/4$). FIG. 34A displays a scout image of the brain. FIG. 34B displays a row across the brain from which the spectra shown in FIGS. 34C and 34D were acquired. Due to the large concentration of lipid signals from muscle, bone marrow and skin surrounding the brain, the spectra in FIG. 34C which were acquired without any suppression pulses are presented at 1/10th vertical scale. Application of the inversion pulses (FIG. 34D) using the ring distribution preserves the intensity of the signals from the brain and reduces the amplitude of signals from outside of the brain within $ROI_{Outer}^{Ring}$ by 98%.

The present invention is not restricted in form nor limited in scope except by the claims appended hereto.

What we claim is:

1. An improved transceiver apparatus capable of transmitting RF pulses and receiving RF signals at specified frequencies for in-vivo imaging of at least a part of the anatomy, organs and tissues within the body of a living subject, said improved transceiver apparatus comprising:
   a containment chamber able to generate and maintain radiofrequency pulses for spectroscopy, spectroscopic imaging, and anatomical/functional imaging, said containment chamber being comprised of
   a structured housing which is erectable on-demand, can be structurally modified as necessary, and is formed by the juncture of at least two shaped housing segments, said erected structured housing presenting fixed dimensions, preset exterior and interior surface geometries, and at least one discrete open end suitable for the insertion of at least that part of a living subject's body intended for examination, and
   a shaped cavity space within said erected structured housing which presents spatial dimensions, a configuration and a void volume which can be modified as necessary, and an open end suitable for insertion and spatial containment of at least that part of a living subject's body intended for examination,
   wherein
   (i) the overall configuration and void volume of said shaped cavity space can be modified on-demand by a substitution of at least one alternatively shaped housing segment in the erection of said structured housing,
   (ii) the juncture of said shaped housing segments conforms the interior surface geometry of said erected structured housing to be at a limited gap distance from the surface of the contained part of the living subject's body, and
   (iii) the juncture of said shaped housing segments concomitantly controls the void volume of said cavity space surrounding the surface of the contained part of the subject's body in accordance with the ratio $Q_U/Q_L$ such that an effective transmission of RF pulses and reception of RF signals is substantially maintained at specified frequencies;
   and
   at least one RF array comprised of not less than six discrete RF coils which are individually aligned in a preselected orientation and collectively positioned in a pre-chosen pattern adjacent the interior surface geometry of at least one shaped housing segment in said erected structured housing,
   wherein each RF coil in said RF array
   (a) is operative to generate a magnetic field directed towards the surface of that part of the subject's body then lying within the cavity space of the erected structured housing,
   (b) can currently transmit RF pulses and receive RF signals,
   (c) is individually tuned to transmit RF pulses at least at one preset frequency and to receive RF signals at least at one known frequency,
   (d) is individually matched such that the impedance of the RF coil is adjusted and maximizes the efficiency of transmission and reception, and
   (e) is individually reactively decoupled to control the magnetic field interactions between the multiple RF coils of said array.

2. An improved transceiver apparatus capable of transmitting radio frequency pulses and receiving electromagnetic signals at specified frequencies for in-vivo imaging of at least a part of the anatomy, organs and tissues within the body of a living subject, said improved transceiver apparatus comprising:
   a containment chamber able to generate and maintain RF pulses for spectroscopy, spectroscopic imaging, and resonance imaging, said containment chamber being comprised of
   a structured housing which is erectable on-demand, can be structurally modified as necessary, and is formed by the juncture of at least two shaped housing segments, said erected structured housing presenting fixed dimensions, preset exterior and interior surface geometries, and at least one discrete open end suitable for the insertion of at least that part of a living subject's body intended for examination, and
   a shaped cavity space within said erected structured housing which presents spatial dimensions, a configuration and a void volume which can be modified as necessary, and an open end suitable for insertion and spatial containment of at least that part of a living subject's body intended for examination,
   wherein
   (i) the overall configuration and void volume of said shaped cavity space can be modified on-demand by a substitution of at least one alternatively shaped housing segment in the erection of said structured housing,
   (ii) the juncture of said shaped housing segments conforms the interior surface geometry of said erected structured housing to be at a limited gap distance from the surface of the contained part of the living subject's body, and (iii) the juncture of said shaped housing segments concomitantly controls the void volume of said cavity space surrounding the surface of the contained part of the subject's body in accordance with the ratio $Q_U/Q_L$ such that an effective transmission of RF pulses and reception of RF signals is substantially maintained at specified frequencies;

and at least one array comprised of not less than six discrete RF coils which are individually aligned as unit pairs of coils joined in tandem and are positioned as multiple tandem pair units joined together which form a discernible array which lies adjacent to the interior surface geometry of at least one shaped housing segment in said erected structured housing, wherein (a) one of said RF coils in each tandem pair unit of the array is individually operative to generate a magnetic field directed towards the surface of that part of the subject's body then lying within said cavity space of said erected structured housing, (b) one of said RF coils in each tandem pair unit of the array can transmit RF pulses and is tuned to transmit RF pulses at a preset frequency, (c) the other RF coil in each tandem pair unit of the array can transmit RF pulses and is tuned to transmit RF pulses at a preset frequency which may be the same or be different from its paired partner in the tandem unit, (d) one of said RF coils in each tandem pair unit of the array can receive RF signals and is tuned to receive RF signals at a pre-chosen frequency, (e) the other RF coil in each tandem pair unit of the array can receive RF signals and is tuned to receive RF signals at a pre-chosen frequency, which may be the same or be different from its paired partner in the tandem unit (f) both of said RF coils in each tandem pair unit of the array are individually matched such that the impedance of the RF coil is adjusted and maximizes the efficiency of transmission, and (g) both of said RF coils in each tandem pair unit of the array are individually reactively decoupled to control the magnetic field interactions between the paired RF coils.

3. The transceiver apparatus as recited in claim 1 or 2 wherein said erected structured housing is comprised of 3 to 0.8 pre-shaped housing segments.

4. The transceiver apparatus as recited in claim 1 or 2 wherein the interior surface geometry of said erected structured housing is limited in gap distance from the surface of the contained part of the living subject's body such that said Qu/Ql ratio is greater than 3.

5. The transceiver apparatus as recited in claim 1 or 2 wherein said RF array is comprised of 7 to 32 discrete RF coils.

6. The transceiver apparatus as recited in claim 1 or 2 wherein said RF array is comprised of surface RF coils.

7. The transceiver apparatus as recited in claim 1 or 2 wherein said RF array is comprised of at least one RF coil selected from the group consisting of CRC coils, butterfly coils, spiral coils, and hybrid RF coils.

8. The transceiver apparatus as recited in claim 1 or 2 wherein said RF array is comprised of at least one RF coil having a component part selected from the group consisting of multiple strip-lines, micro-strips and TEM elements.

9. The transceiver apparatus as recited in claim 1 or 2 wherein said RF array is positioned in an elliptical arrangement.

10. The transceiver apparatus as recited in claim 1 or 2 wherein said RF array is positioned in an arrangement selected from the group consisting of a hyperbolic, oval, oblong, polygonal, birdcage, dome, U-shaped, spiral, or dog-bone shaped pattern.

11. The transceiver apparatus as recited in claim 1 or 2 wherein two or more RF arrays are positioned adjacent the interior surface geometry of at least one shaped housing segment in the erected structured housing.

12. The transceiver apparatus as recited in claim 11 wherein said two or more RF arrays have equivalent cross sectional areas and are aligned in an even plane orientation.

13. The transceiver apparatus as recited in claim 11 wherein one of said two or more RF arrays is selected from the group consisting of arrays having a different cross sectional area, arrays having a conical shape, and arrays having a tapered shape.

14. An improved system capable of transmitting RF pulses and receiving RF signals at specified frequencies for in-vivo imaging of at least a part of the anatomy, organs and tissues within the body of a living subject, said system comprising:

an improved transceiver apparatus including a containment chamber able to generate and maintain radiofrequency pulses for spectroscopy, spectroscopic imaging, and anatomical/functional imaging, said containment chamber being comprised of a structured housing which is erectable on-demand, can be structurally modified as necessary, and is formed by the juncture of at least two shaped housing segments, said erected structured housing presenting fixed dimensions, preset exterior and interior surface geometries, and at least one discrete open end suitable for the insertion of at least that part of a living subject's body intended for examination, and a shaped cavity space within said erected structured housing which presents spatial dimensions, a configuration and a void volume which can be modified as necessary, and an open end suitable for insertion and spatial containment of at least that part of a living subject's body intended for examination, wherein (i) the overall configuration and void volume of said shaped cavity space can be modified on-demand by a substitution of at least one alternatively shaped housing segment in the erection of said structured housing, (ii) the juncture of said shaped housing segments conforms the interior surface geometry of said erected structured housing to be at a limited gap distance from the surface of the contained part of the living subject's body, and (iii) the juncture of said shaped housing segments concomitantly controls the void volume of said cavity space surrounding the surface of the contained part of the subject's body in accordance with the ratio $Q_U/Q_L$ such that an effective transmission of RF pulses and reception of RF signals is substantially maintained at specified frequencies;

and at least one RF array comprised of not less than six discrete RF coils which are individually aligned in a preselected orientation and collectively positioned in a pre-chosen pattern adjacent the interior surface geometry of at least one shaped housing segment in said erected structured housing, wherein each RF coil in said RF array
(a) is operative to generate a magnetic field directed towards the surface of that part of the subject's body then lying within the cavity space of the erected structured housing,
(b) can currently transmit RF pulses and receive RF signals,
(c) is individually tuned to transmit RF pulses at least at one preset frequency and to receive RF signals at least at one known frequency,
(d) is individually matched such that the impedance of the RF coil is adjusted and maximizes the efficiency of transmission and reception, and
(e) is individually reactively decoupled to control the magnetic field interactions between the multiple RF coils of said array;
a spectrometer;
a magnet able to generate a magnetic field strength ≥3 Tesla;
a magnetic field gradient equipped with a set of $B_0$ shims;
a plurality of fully independent transmit channels, RF amplifiers, and preamplifiers in communication with each of the discrete RF coils in the identifiable array; and
an interface comprised of T/R switches able to provide RF power to each of the discrete RF coils in the identifiable array during transmission and to connect the each of the discrete RF coils to a preamplifier during reception.

15. An improved system capable of transmitting RF pulses and receiving RF signals at specified frequencies for superior in-vivo imaging of at least a part of the anatomic systems, organs and tissues then existing within the body of a living subject, said system comprising:
an improved transceiver apparatus including a containment chamber able to generate and maintain RF pulses for spectroscopy, spectroscopic imaging, and resonance imaging, said containment chamber being comprised of
a structured housing which is erectable on-demand, can be structurally modified as necessary, and is formed by the juncture of at least two shaped housing segments, said erected structured housing presenting fixed dimensions, preset exterior and interior surface geometries, and at least one discrete open end suitable for the insertion of at least that part of a living subject's body intended for examination, and
a shaped cavity space within said erected structured housing which presents spatial dimensions, a configuration and a void volume which can be modified as necessary, and an open end suitable for insertion and spatial containment of at least that part of a living subject's body intended for examination,
wherein
(i) the overall configuration and void volume of said shaped cavity space can be modified on-demand by a substitution of at least one alternatively shaped housing segment in the erection of said structured housing,
(ii) the juncture of said shaped housing segments conforms the interior surface geometry of said erected structured housing to be at a limited gap distance from the surface of the contained part of the living subject's body, and
(iii) the juncture of said shaped housing segments concomitantly controls the void volume of said cavity space surrounding the surface of the contained part of the subject's body in accordance with the ratio $Q_U/Q_L$ such that an effective transmission of RF pulses and reception of RF signals is substantially maintained at specified frequencies;
and
at least one array comprised of not less than six discrete RF coils which are individually aligned as unit pairs of coils joined in tandem and are positioned as multiple tandem pair units joined together which form a discernible array which lies adjacent to the interior surface geometry of at least one shaped housing segment in said erected structured housing,
wherein
(a) one of said RF coils in each tandem pair unit of the array is individually operative to generate a magnetic field directed towards the surface of that part of the subject's body then lying within said cavity space of said erected structured housing,
(b) one of said RF coils in each tandem pair unit of the array can transmit RF pulses and is tuned to transmit RF pulses at a preset frequency,
(c) the other RF coil in each tandem pair unit of the array can transmit RF pulses and is tuned to transmit RF pulses at a preset frequency which may be the same or be different from its paired partner in the tandem unit,
(d) one of said RF coils in each tandem pair unit of the array can receive RF signals and is tuned to receive RF signals at a pre-chosen frequency,
(e) the other RF coil in each tandem pair unit of the array can receive RF signals and is tuned to receive RF signals at a pre-chosen frequency, which may be the same or be different from its paired partner in the tandem unit
(f) both of said RF coils in each tandem pair unit of the array are individually matched such that the impedance of the RF coil is adjusted and maximizes the efficiency of transmission, and
(g) both of said RF coils in each tandem pair unit of the array are individually reactively decoupled to control the magnetic field interactions between the paired RF coils;
a spectrometer;
a magnet able to generate a magnetic field strength ≥3 Tesla;
a magnetic field gradient equipped with a complete set of $B_0$ shims;
a plurality of fully independent transmit channels, RF amplifiers, and preamplifiers in communication with each of the discrete RF coils in the identifiable array; and
an interface able to provide RF power to each of the discrete RF coils in the identifiable array during transmission and to connect the each of the discrete RF coils to a preamplifier during reception.

16. A method for viewing an image of at least one targeted anatomic locale within a living subject, said method comprising the steps of:
choosing at least one anatomic site in a living subject as a localized target for imaging;
providing an imaging system which includes a transceiver apparatus capable of transmitting RF pulses and receiving RF signals at specified frequencies for in-vivo imaging of at least a part of the anatomy, organs and tissues within the body of a living subject, wherein said transceiver apparatus comprises
(i) a containment chamber able to generate and maintain radiofrequency pulses for spectroscopy, spectroscopic imaging, and anatomical/functional imaging, said containment chamber being comprised of
a structured housing which is erectable on-demand, can be structurally modified as necessary, and is formed by the juncture of at least two shaped housing segments, said erected structured housing presenting fixed dimensions, preset exterior and interior surface geometries, and at least one open end suitable for the insertion of at least that part of a living subject's body intended for examination, and a shaped cavity space within said erected structured housing which presents spatial dimensions, a configuration and a void volume which can be modified as necessary, and an open end suitable for insertion and spatial containment of at least that part of a living subject's body intended for examination, and (ii) at least one RF array comprised of not less than six discrete RF coils which are individually aligned in a preselected orientation and collectively positioned in a pre-chosen pattern adjacent the interior surface geometry of at least one shaped housing segment in said erected structured housing, causing said at least one of said discrete RF coils in said RF array of said transceiver apparatus to transmit a RF pulse at a pre-selected frequency in order to excite nuclei in different anatomic sections of the targeted locale in the living subject;

employing at least one of said discrete RF coils in said RF array of said transceiver apparatus to detect and receive RF signals emanating from nuclei at different anatomic sites of the targeted locale in the living subject as a consequence of their excitation;

adjusting the emanating signals of selected nuclei at different anatomic sites in the living subject so as to suppress their contributions to the RF signals detected by the transceiver apparatus in accordance with pre-set signal suppression parameters; and utilizing the signals arising from unsuppressed nuclei to generate a viewable image of the targeted anatomic locale within the living subject.

* * * * *